(12) United States Patent
Said et al.

(10) Patent No.: US 11,387,250 B2
(45) Date of Patent: Jul. 12, 2022

(54) THREE-DIMENSIONAL MEMORY DEVICE CONTAINING METAL-ORGANIC FRAMEWORK INTER-WORD LINE INSULATING LAYERS

(71) Applicant: SANDISK TECHNOLOGIES LLC, Addison, TX (US)

(72) Inventors: Ramy Nashed Bassely Said, San Jose, CA (US); Senaka Kanakamedala, San Jose, CA (US); Fei Zhou, San Jose, CA (US); Raghuveer S. Makala, Campbell, CA (US); Yao-Sheng Lee, Tampa, FL (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 39 days.

(21) Appl. No.: 16/722,745

(22) Filed: Dec. 20, 2019

(65) Prior Publication Data
US 2021/0193674 A1 Jun. 24, 2021

(51) Int. Cl.
*H01L 27/11582* (2017.01)
*H01L 21/02* (2006.01)

(52) U.S. Cl.
CPC .. *H01L 27/11582* (2013.01); *H01L 21/02172* (2013.01)

(58) Field of Classification Search
CPC ......... H01L 27/11524; H01L 27/11582; H01L 27/1157; H01L 27/11575; H01L 27/2481; H01L 21/02172; H01L 21/823487; H01L 21/823885; H01L 21/28282; H01L 29/785; H01L 29/7827; H01L 29/518; H01L 27/2454; H01L 27/11556; H01L 27/11529;
(Continued)

(56) References Cited

U.S. PATENT DOCUMENTS

| | | |
|---|---|---|
| 5,882,548 A | 3/1999 | Liang et al. |
| 5,915,167 A | 6/1999 | Leedy |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Khiem D Nguyen
(74) *Attorney, Agent, or Firm* — The Marbury Law Group PLLC

(57) ABSTRACT

A three-dimensional memory device includes a vertically alternating stack of insulating layers and electrically conductive layers located over a top surface of a substrate and memory stack structures extending through the alternating stack. Each of the memory stack structures contains a respective memory film and a respective vertical semiconductor channel, and each of the insulating layers contains a metal-organic framework (MOF) material portion. The MOF material portion has a low dielectric constant, and reduces RC coupling between the electrically conductive layers. An optional airgap may be located within the MOF material portion to further reduce the effective dielectric constant. Optionally, discrete charge storage regions or floating gates may be formed only at the levels of the electrically conductive layers to reduce program disturb and noise in the device.

4 Claims, 72 Drawing Sheets

(58) Field of Classification Search
CPC ......... H01L 21/02175; H01L 21/02203; H01L 21/02244; H01L 29/40114; H01L 29/40117
USPC ......................................................... 257/314
See application file for complete search history.

(56) References Cited

U.S. PATENT DOCUMENTS

| | | | |
|---|---|---|---|
| 8,123,834 | B2 | 2/2012 | Masel et al. |
| 8,349,681 | B2 * | 1/2013 | Alsmeier ............... H01L 29/495 438/216 |
| 8,603,225 | B2 | 12/2013 | Schubert et al. |
| 9,252,151 | B2 | 2/2016 | Chien et al. |
| 9,346,831 | B1 | 5/2016 | Talin et al. |
| 9,356,031 | B2 | 5/2016 | Lee et al. |
| 9,397,093 | B2 | 7/2016 | Makala et al. |
| 9,419,012 | B1 | 8/2016 | Shimabukuro et al. |
| 9,428,525 | B1 | 8/2016 | Talin et al. |
| 9,515,085 | B2 * | 12/2016 | Rabkin ............... H01L 21/7682 |
| 9,576,975 | B2 | 2/2017 | Zhang et al. |
| 9,691,884 | B2 * | 6/2017 | Makala ............... H01L 27/1157 |
| 9,698,153 | B2 * | 7/2017 | Liu .................... H01L 27/11524 |
| 9,724,668 | B2 | 8/2017 | Zhou et al. |
| 9,875,929 | B1 * | 1/2018 | Shukla ............... H01L 27/11582 |
| 9,941,299 | B1 * | 4/2018 | Chen ................. H01L 27/11595 |
| 9,983,124 | B2 | 5/2018 | Wang et al. |
| 10,094,020 | B2 | 10/2018 | Stassen et al. |
| 10,256,247 | B1 | 4/2019 | Kanakamedala et al. |
| 10,274,421 | B2 | 4/2019 | Chang et al. |
| 10,276,589 | B2 * | 4/2019 | Kim .................... H01L 29/7827 |
| 10,290,648 | B1 * | 5/2019 | Zhou ................. H01L 27/11582 |
| 2010/0064888 | A1 | 3/2010 | Schubert et al. |
| 2010/0132547 | A1 | 6/2010 | Masel et al. |
| 2014/0065789 | A1 * | 3/2014 | Sasago ................ H01L 27/2436 438/382 |
| 2016/0141294 | A1 * | 5/2016 | Peri ................... H01L 21/28568 257/324 |
| 2016/0159822 | A1 | 6/2016 | Tan et al. |
| 2016/0229873 | A1 | 8/2016 | Talin et al. |
| 2016/0231233 | A1 | 8/2016 | Wang et al. |
| 2016/0346759 | A1 | 12/2016 | Zhou et al. |
| 2017/0044428 | A1 | 2/2017 | Li et al. |
| 2017/0198393 | A1 * | 7/2017 | Stassen ............. C23C 16/45523 |
| 2018/0001101 | A1 | 1/2018 | Chang et al. |
| 2018/0033646 | A1 * | 2/2018 | Sharangpani ......... H01L 21/311 |
| 2018/0097009 | A1 * | 4/2018 | Zhang ............... H01L 27/11519 |
| 2019/0024235 | A1 | 1/2019 | Stassen et al. |

OTHER PUBLICATIONS

Stassin, T. et al., "Vapour-Phase Deposition of Oriented Copper Dicarboxylate Metal-Organic Framework Thin Films," *Chemical Communications* 55.68 (2019): 10056-10059.

Krishtab, M. et al., "Vapor-Deposited Zeolitic Imidazolate Frameworks as Gap-Filling Ultra-Low-k Dielectrics," Nature Communications, pp. 1-9, (2019) 10:3729 | https://doi.org/10.1038/s41467-019-11703-x | www.nature.com/naturecommunications.

Perez, E. V. et al., "Origins and Evolution of Inorganic-Based and MOF-Based Mixed-Matrix Membranes for Gas Separations," Processes 2016, vol. 4, No. 32, pp. 1-68; (2016) doi:10.3390/pr4030032, www.mdpi.com/journal/processes.

Ameloot, R. "MOF-CVD Chemical Vapor Deposition of Metal-Organic Frameworks," International MicroNano Conference 2016, Dec. 13-14, Amsterdam, NL, 43 pages, (2016), https://www.micronanoconference.org/app/uploads/sites/57/2016/12/Porous-Crystals-from-the-Vapor-Phase_Rob-Ameloot_KU-Leuven.pdf.

Hendon, C.H., et al. "Engineering the optical response of the titanium-MIL-125 metal—organic framework through ligand functionalization." *Journal of the American Chemical Society* 135. 30 (2013): 10942-10945.

Kramer, M. et al., "Synthesis and properties of the metal-organic framework Mo 3 (BTC) 2 (TUDMOF-1)," *Journal of Materials Chemistry*, vol. 16, No. 23 (2006): pp. 2245-2248.

Park, S.J. et al., "A mechanistic study of SF6/O2 reactive ion etching of molybdenum," Citation: Journal of Vacuum Science & Technology B: Microelectronics Processing and Phenomena, vol. 5, pp. 1372-1373, (1987);doi: 10.1116/1.583618 1372-1373.

U.S. Appl. No. 16/278,426, filed Feb. 18, 2019, SanDisk Technologies LLC.

U.S. Appl. No. 16/278,488, filed Feb. 18, 2019, SanDisk Technologies LLC.

Said, R.N.B. et al., "Three-Dimensional Memory Device Containing Metal-Organic Framework Inter-Word Line Insulating Layers and Methods of Forming The Same," U.S. Appl. No. 16/722,824, filed Dec. 20, 2019.

* cited by examiner

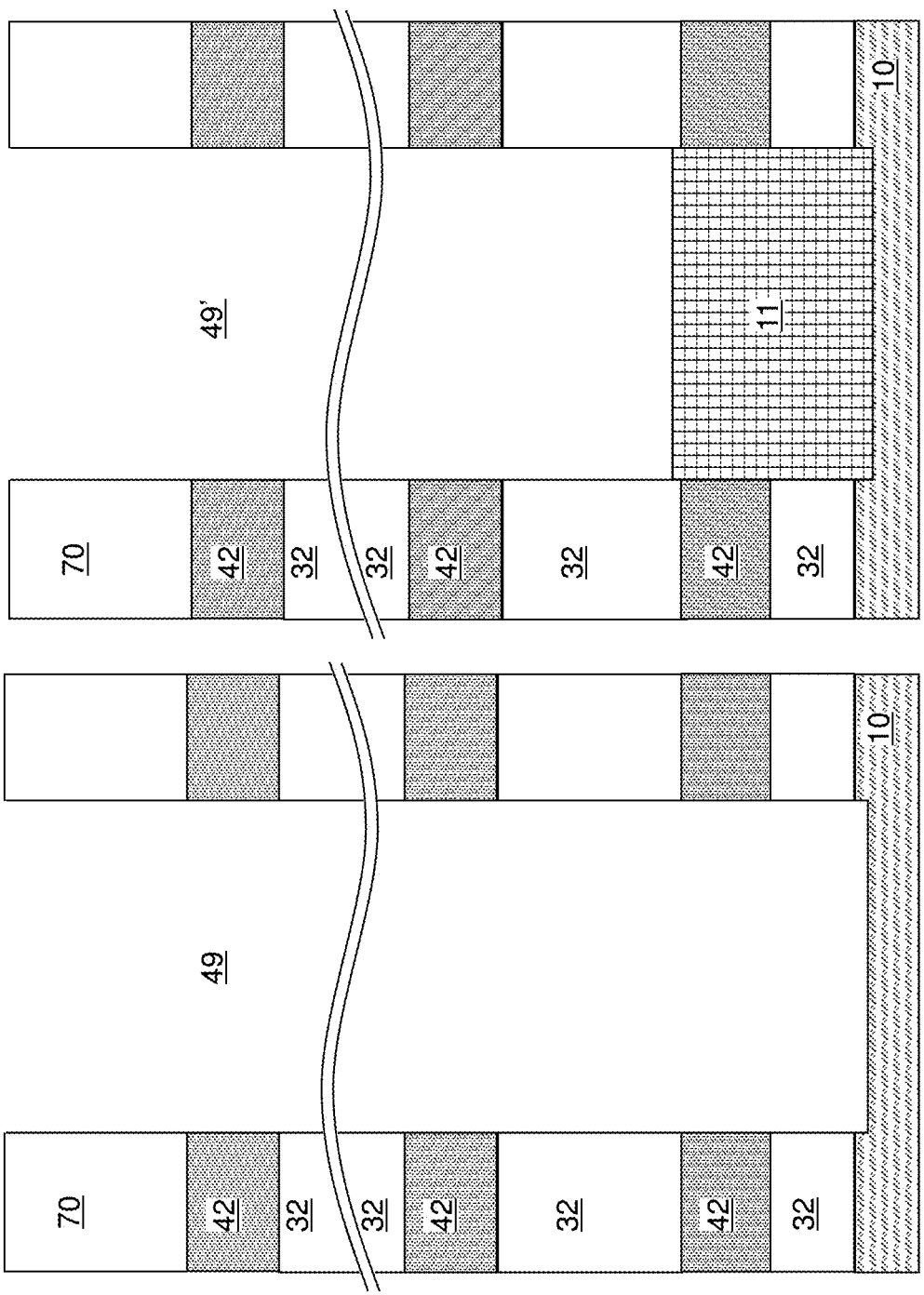

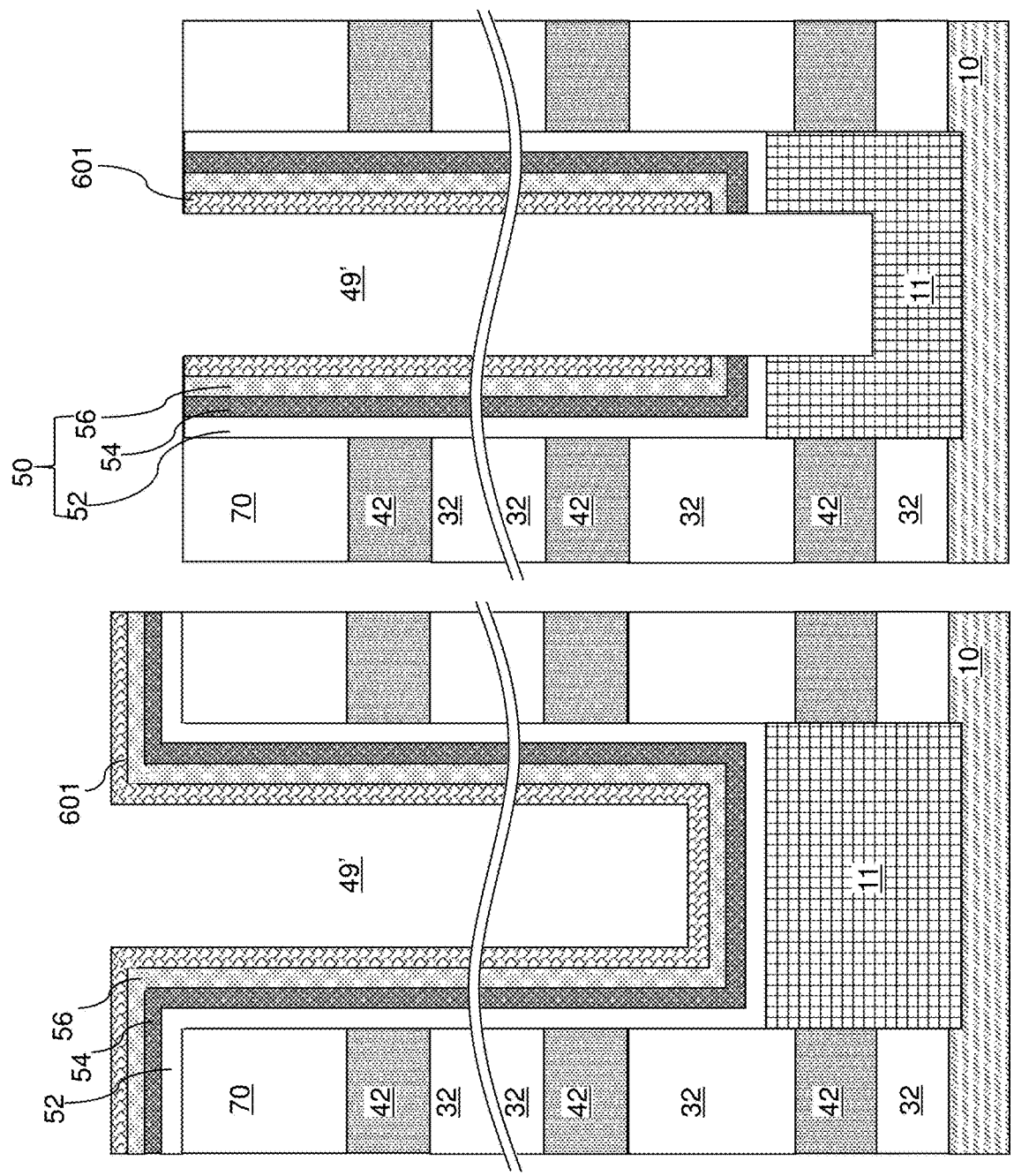

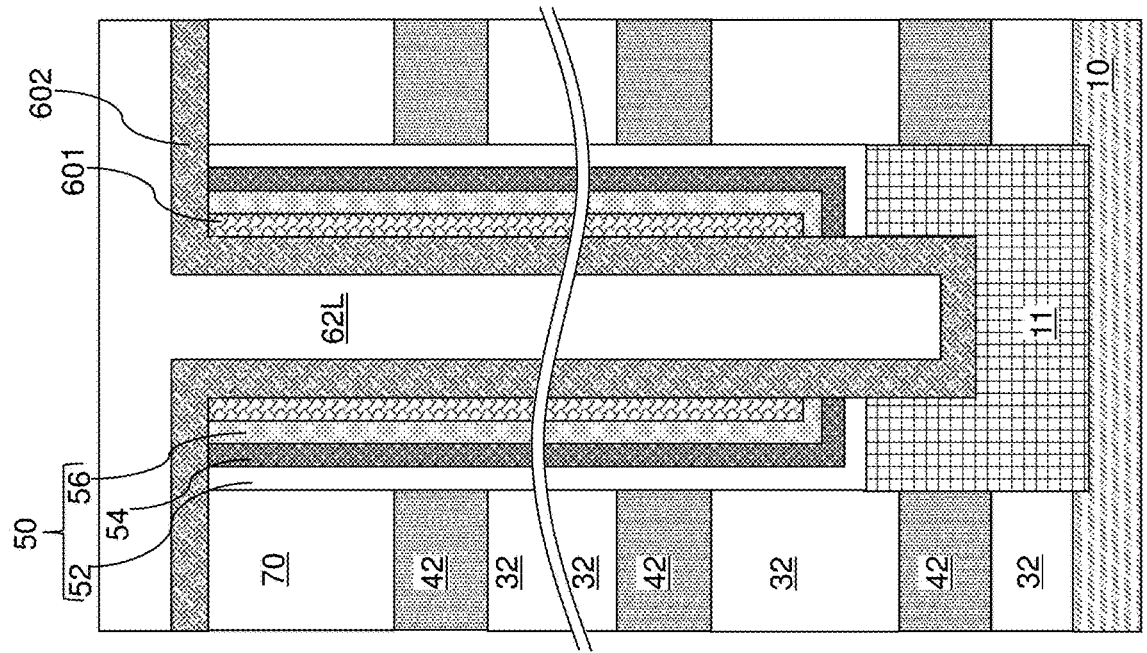
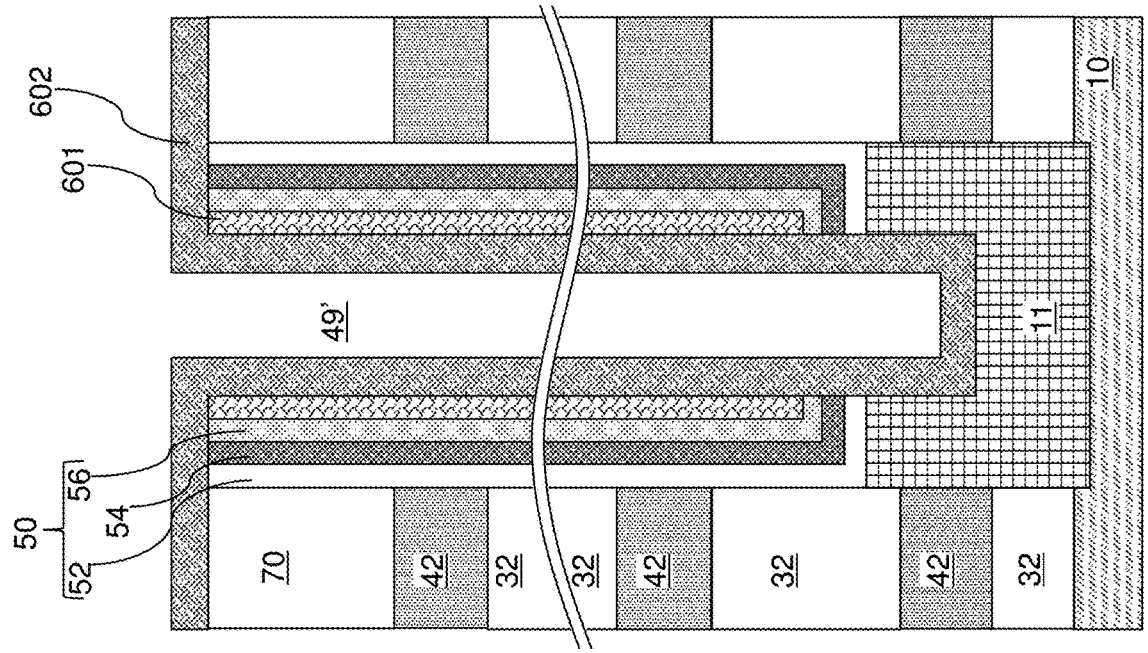

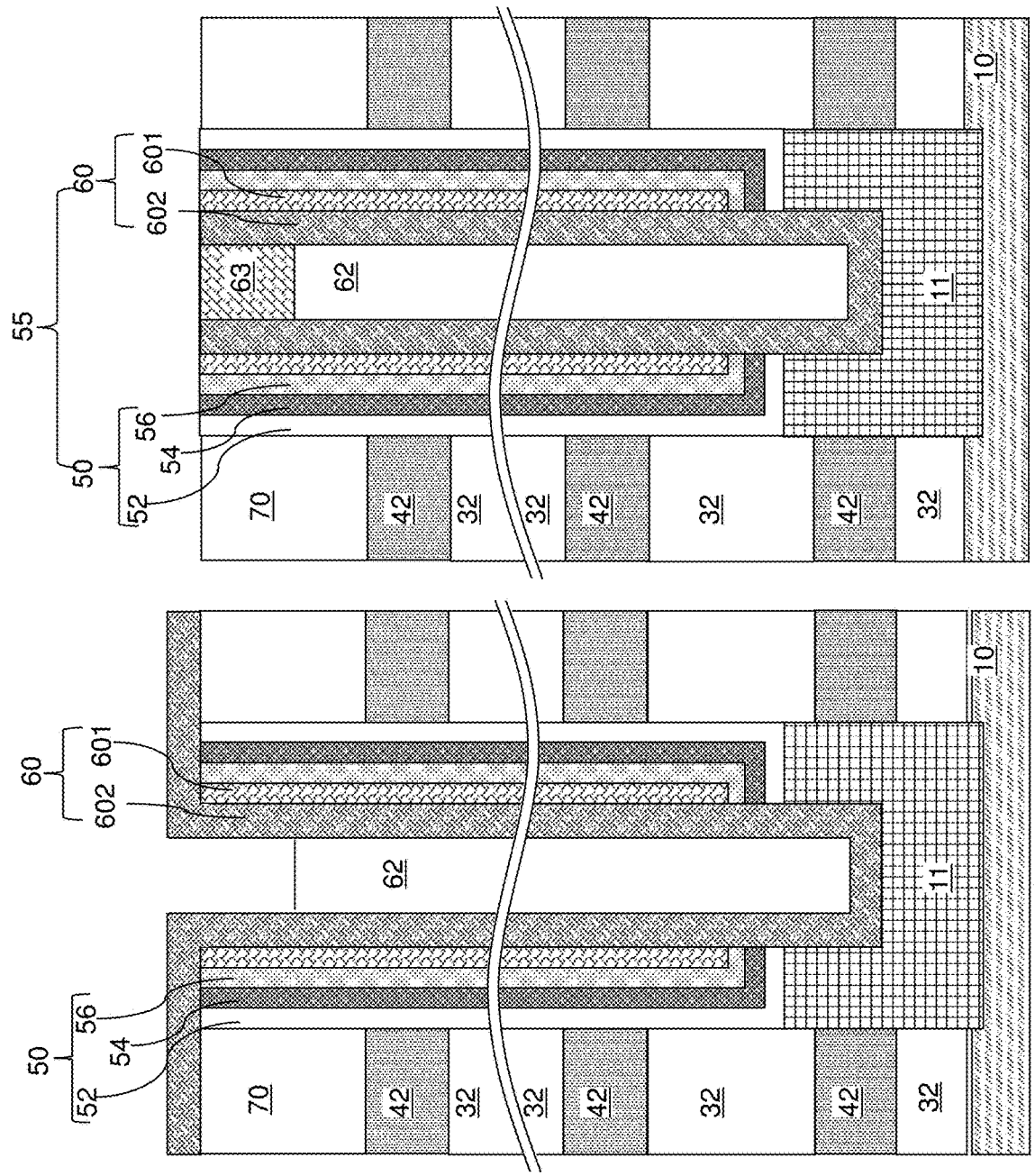

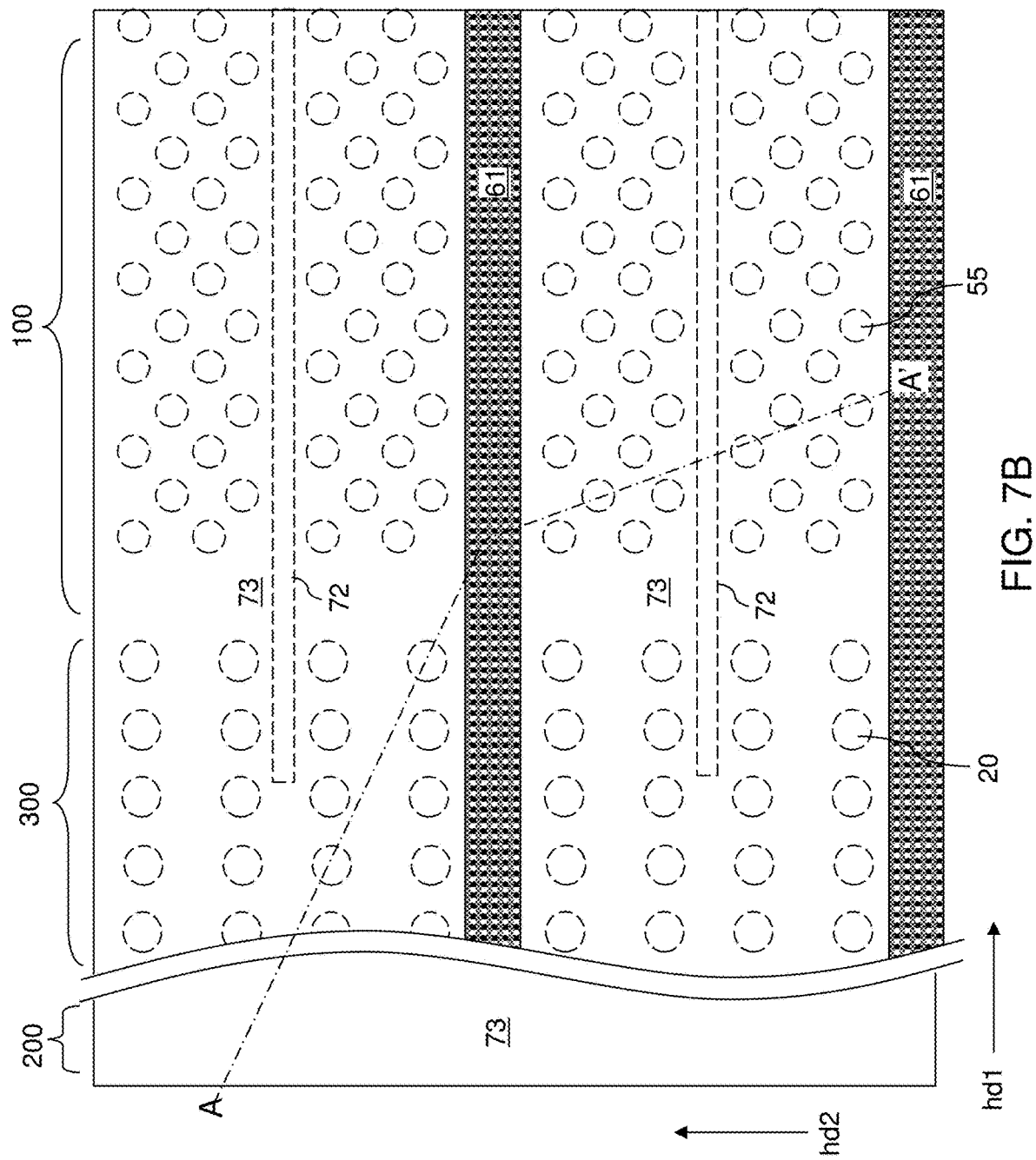

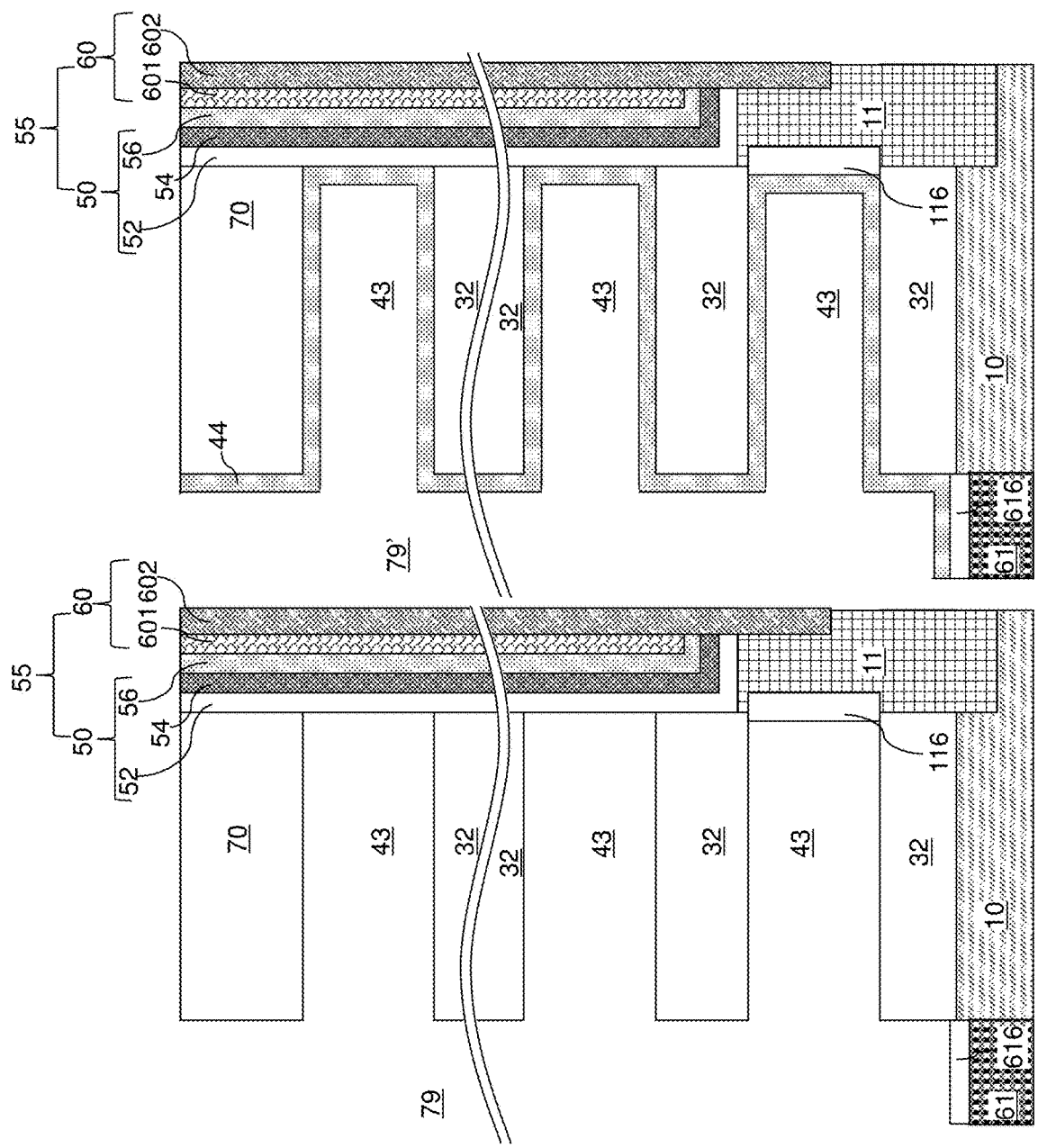

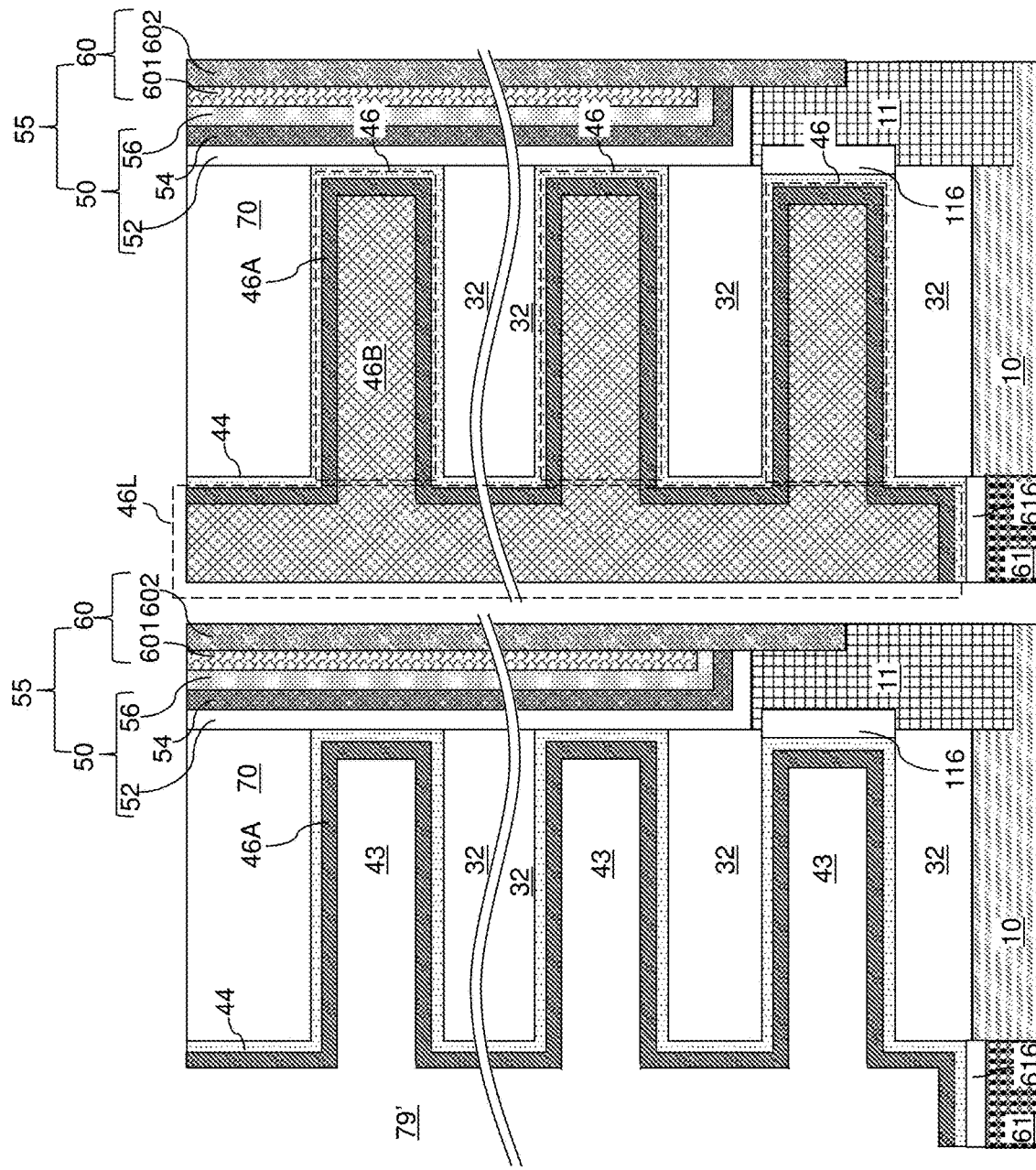

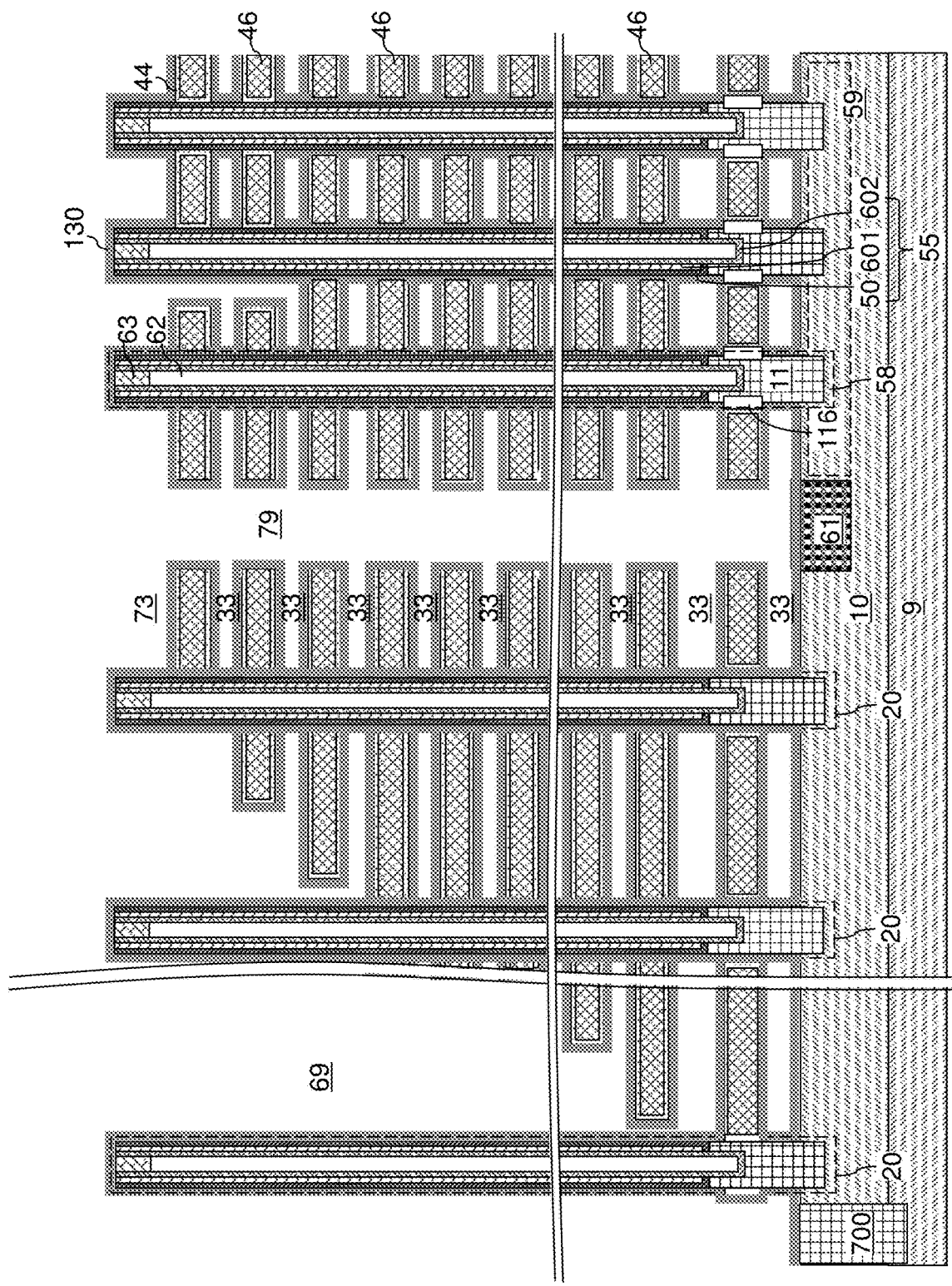

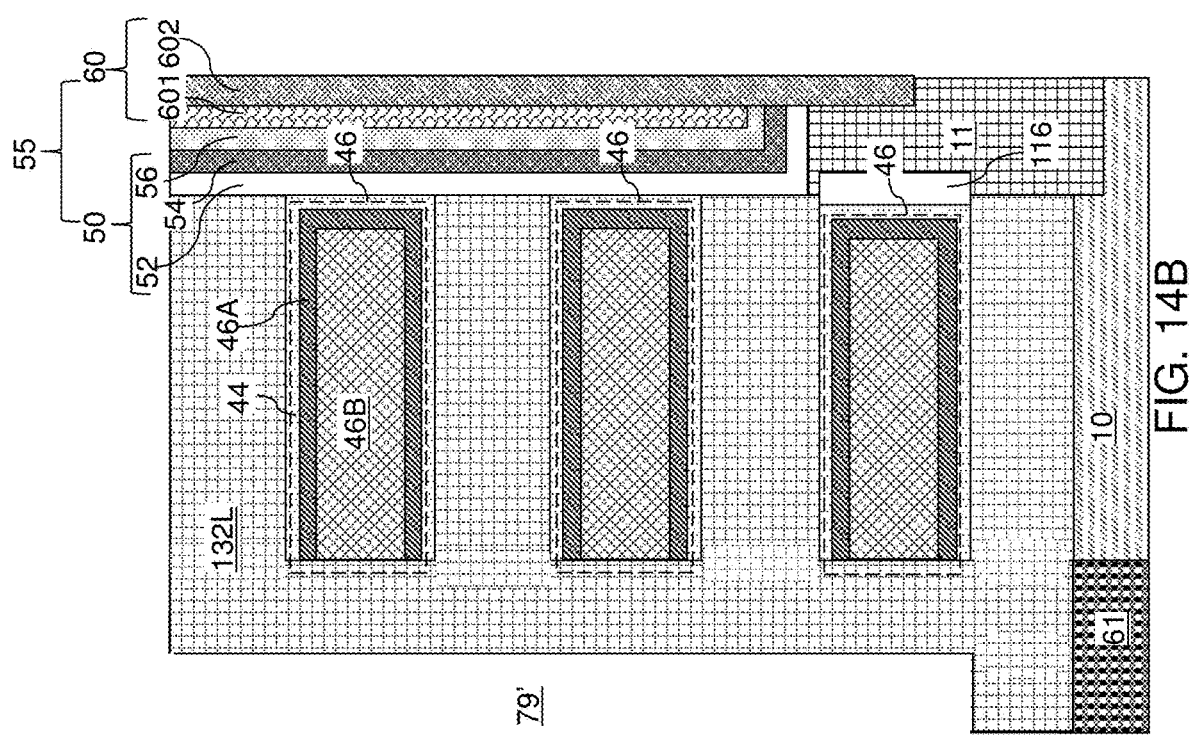

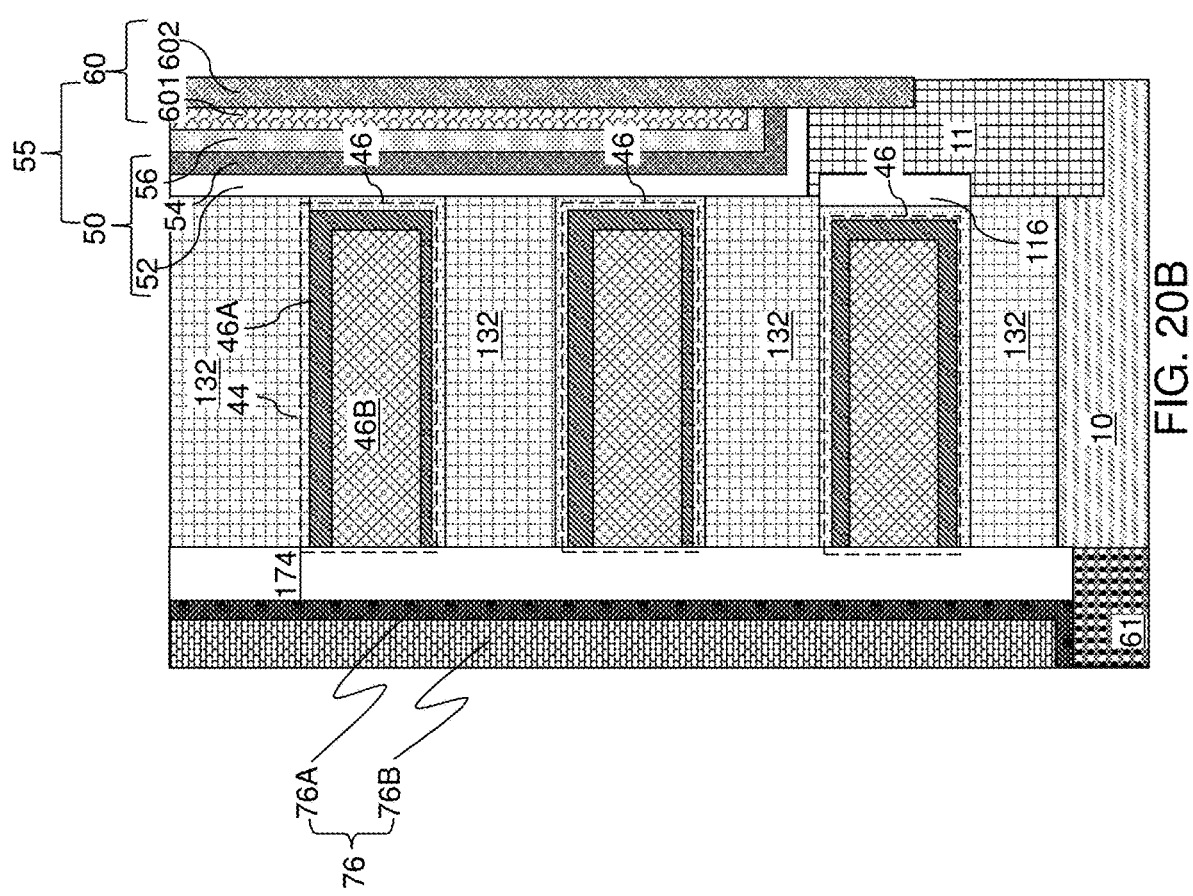

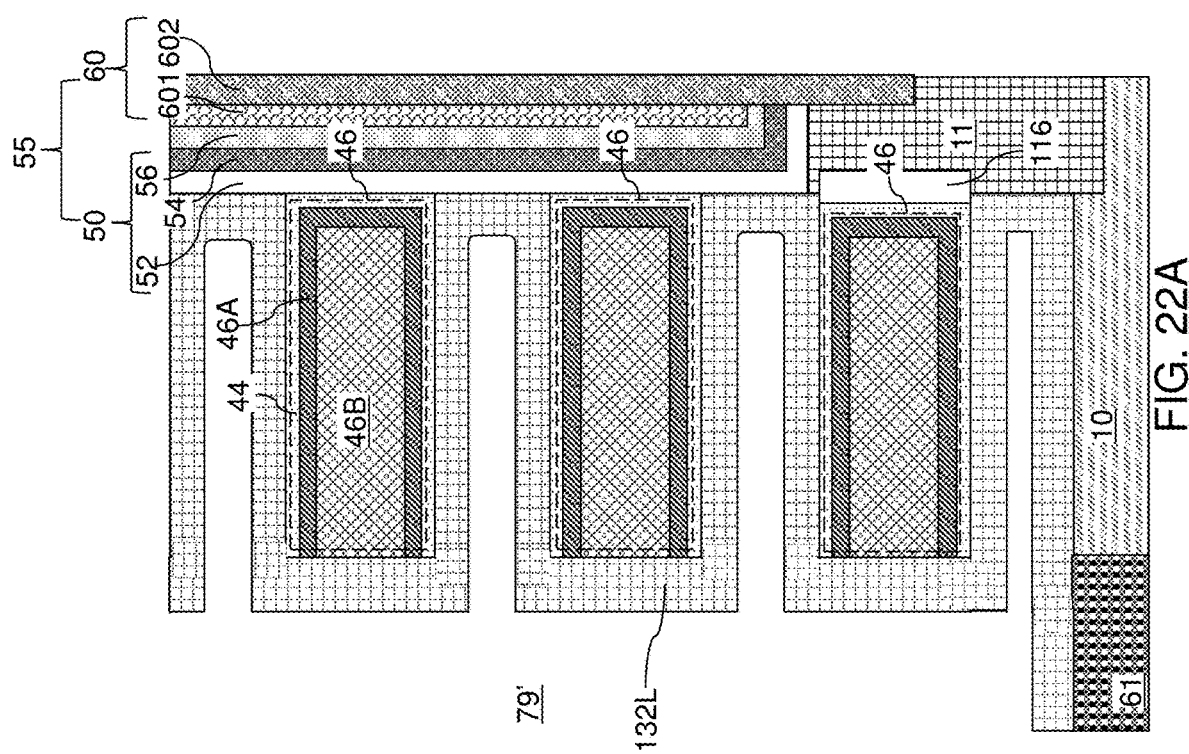

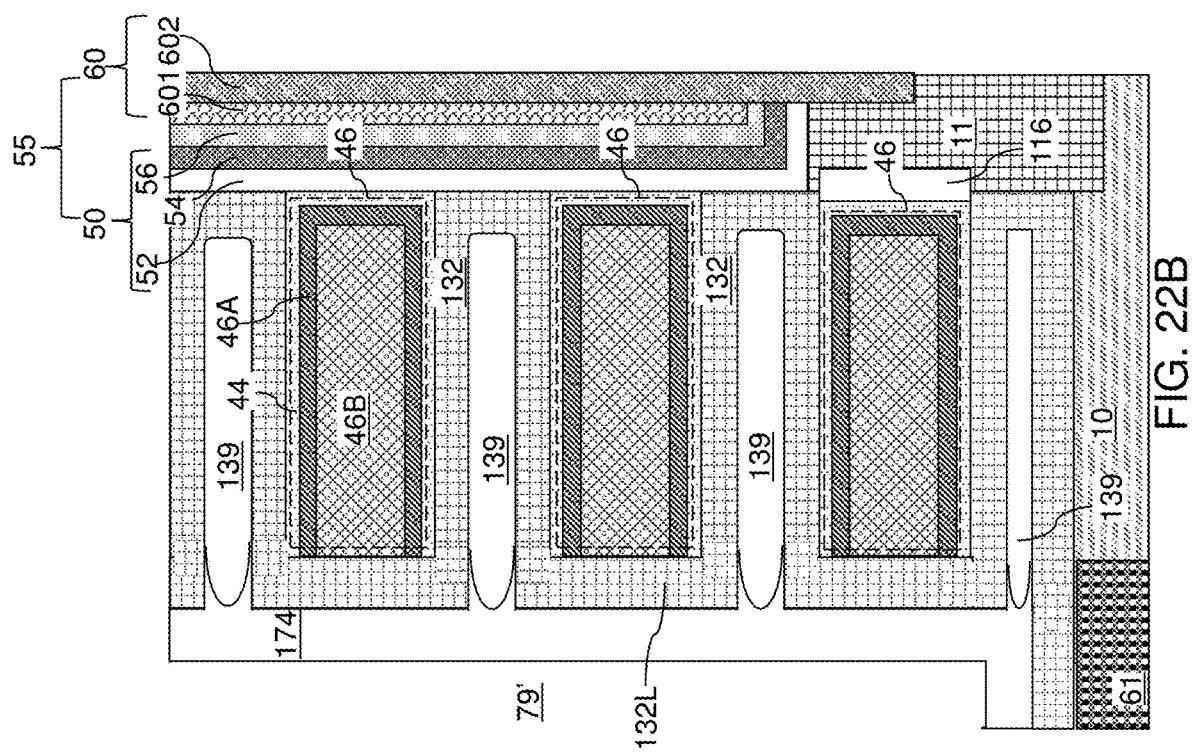

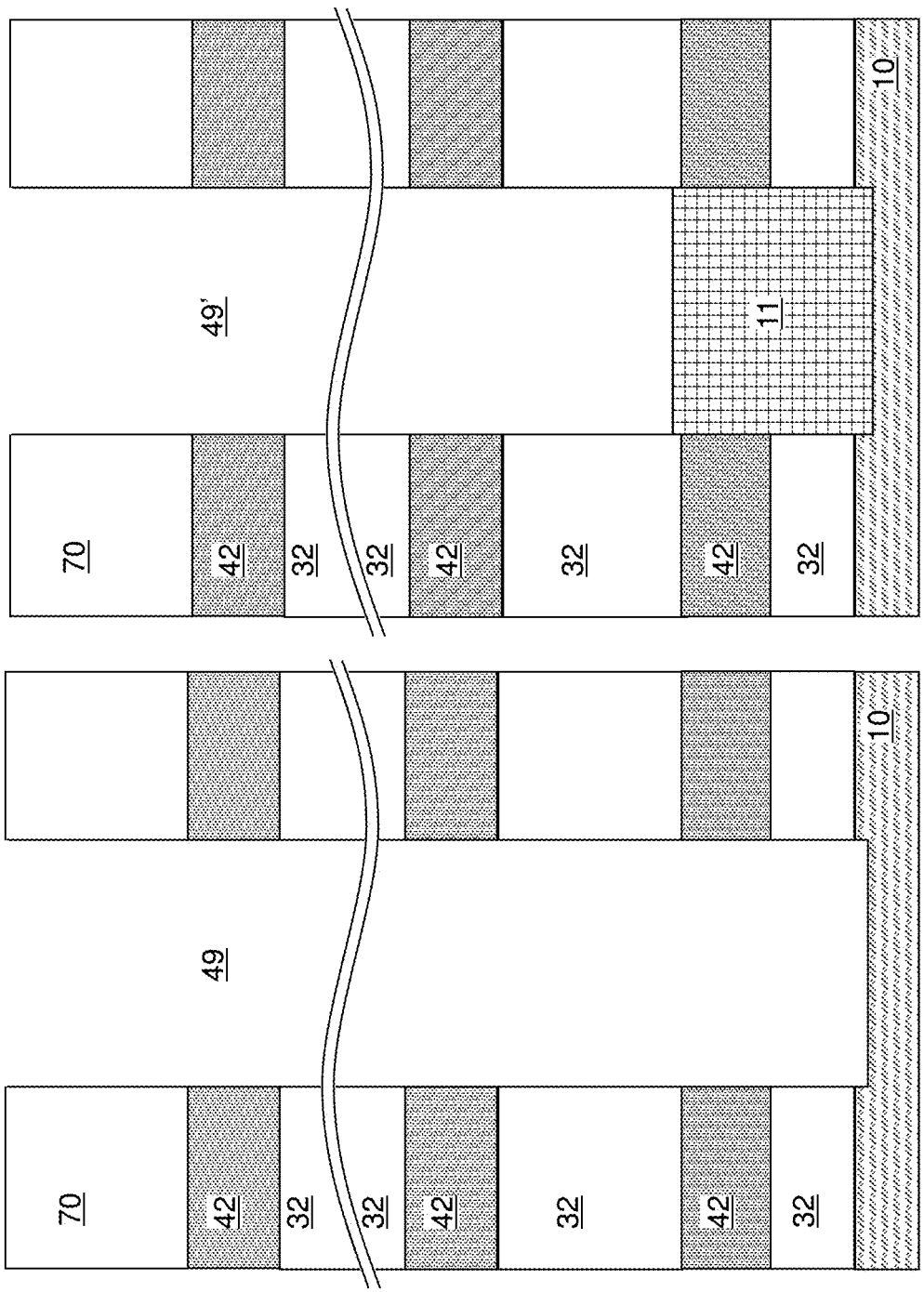

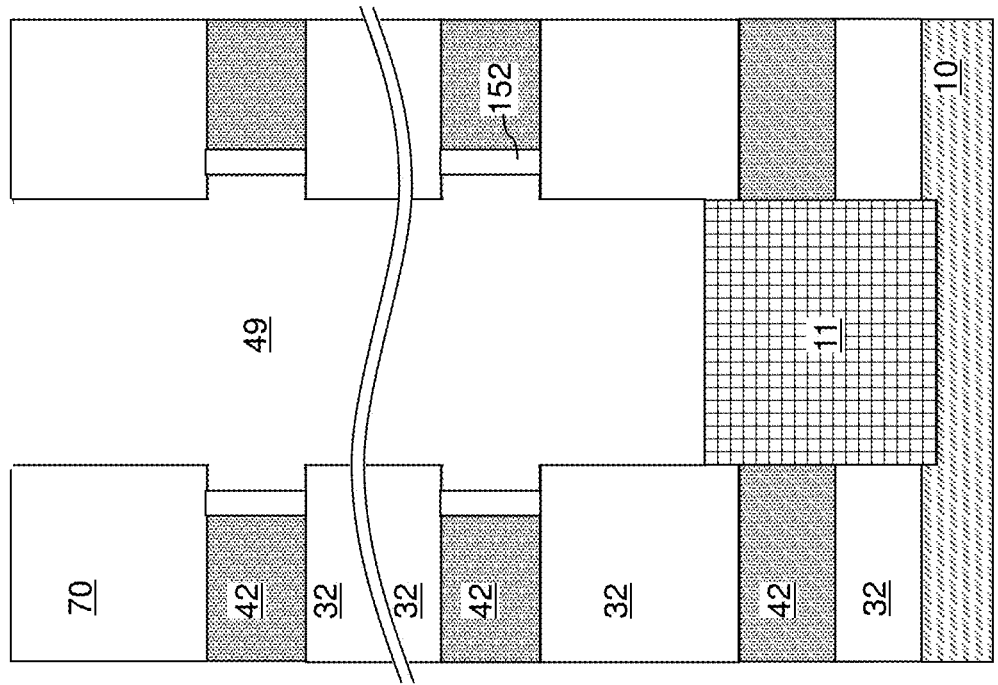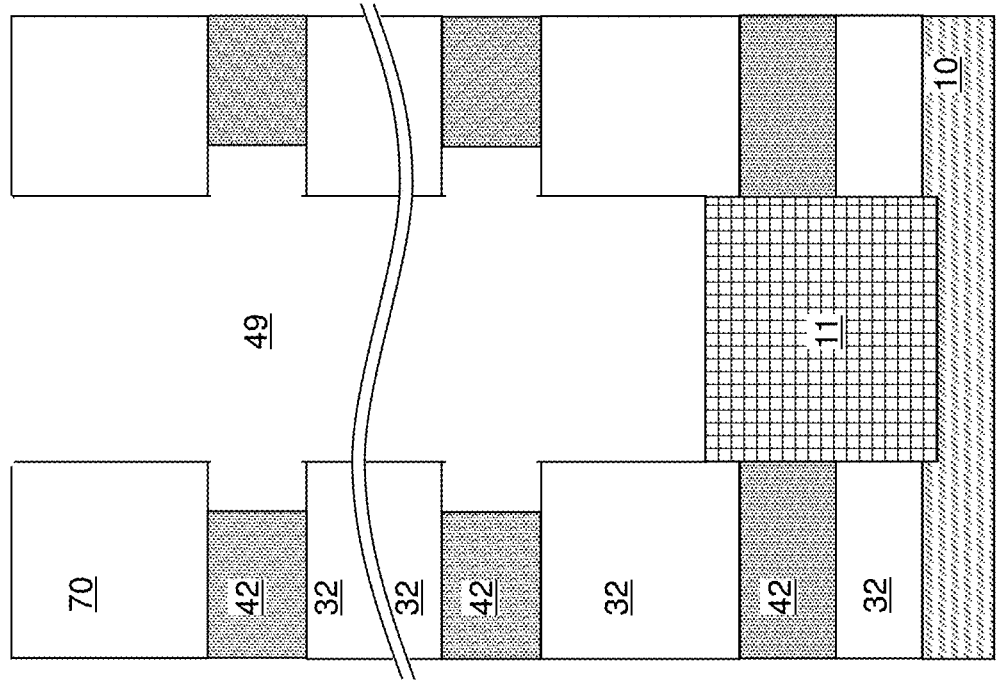

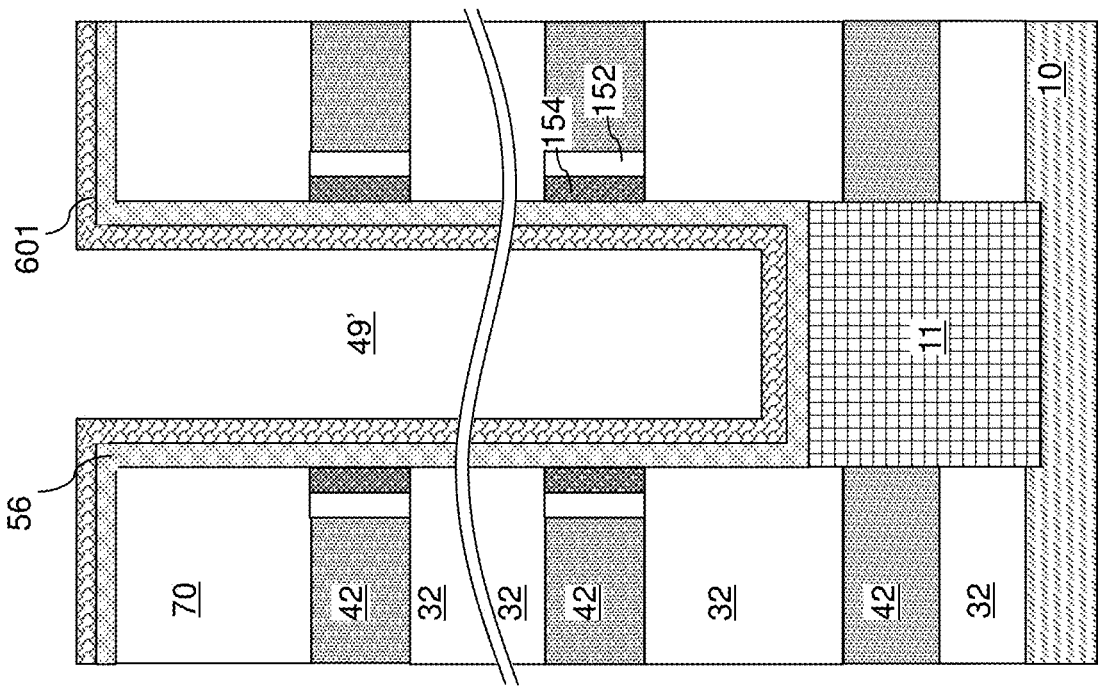
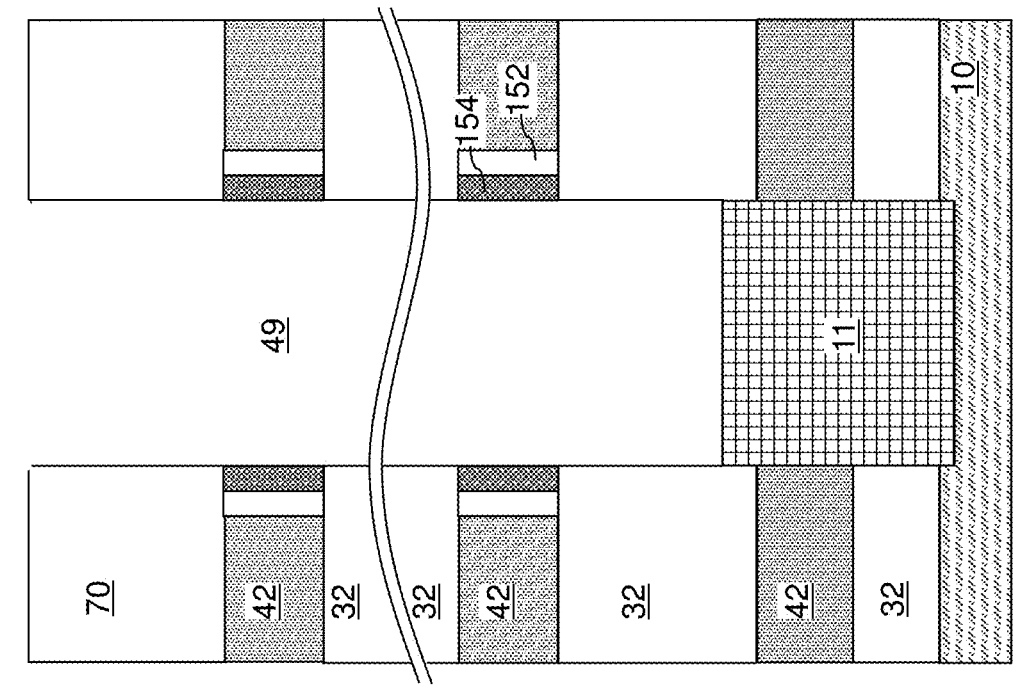

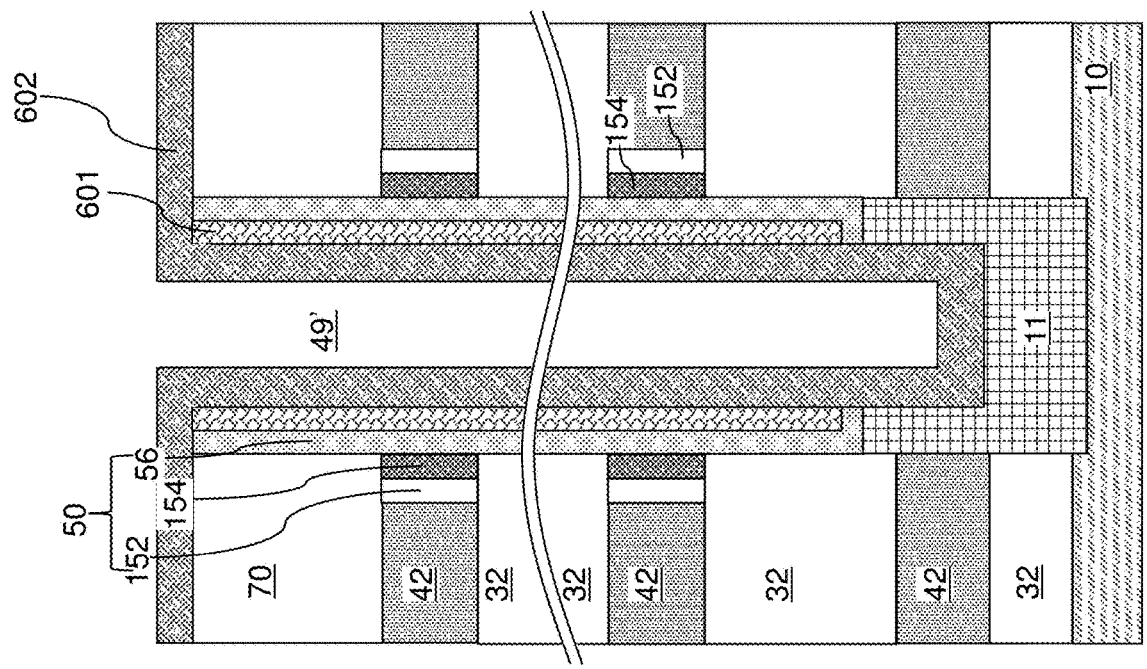
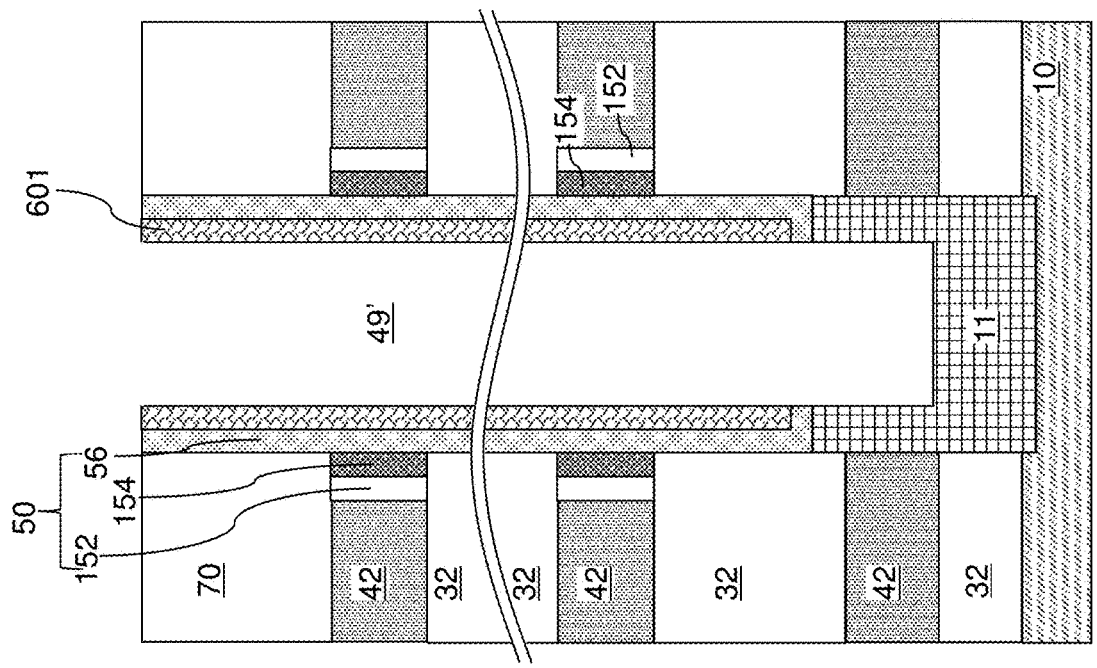
FIG. 23H
FIG. 23G

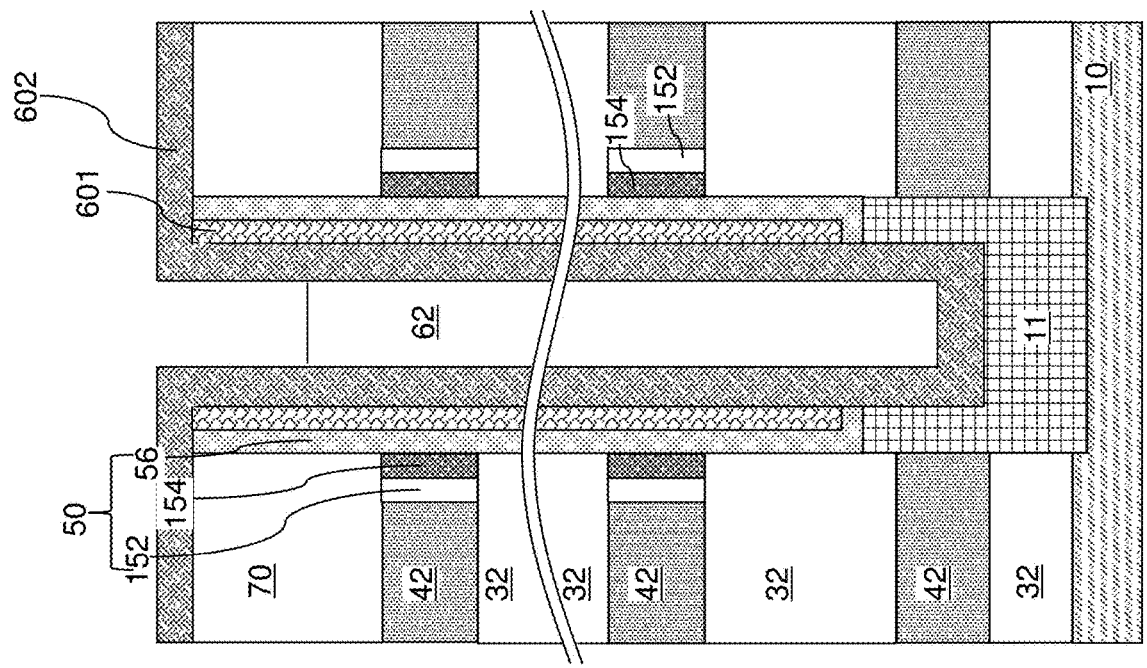
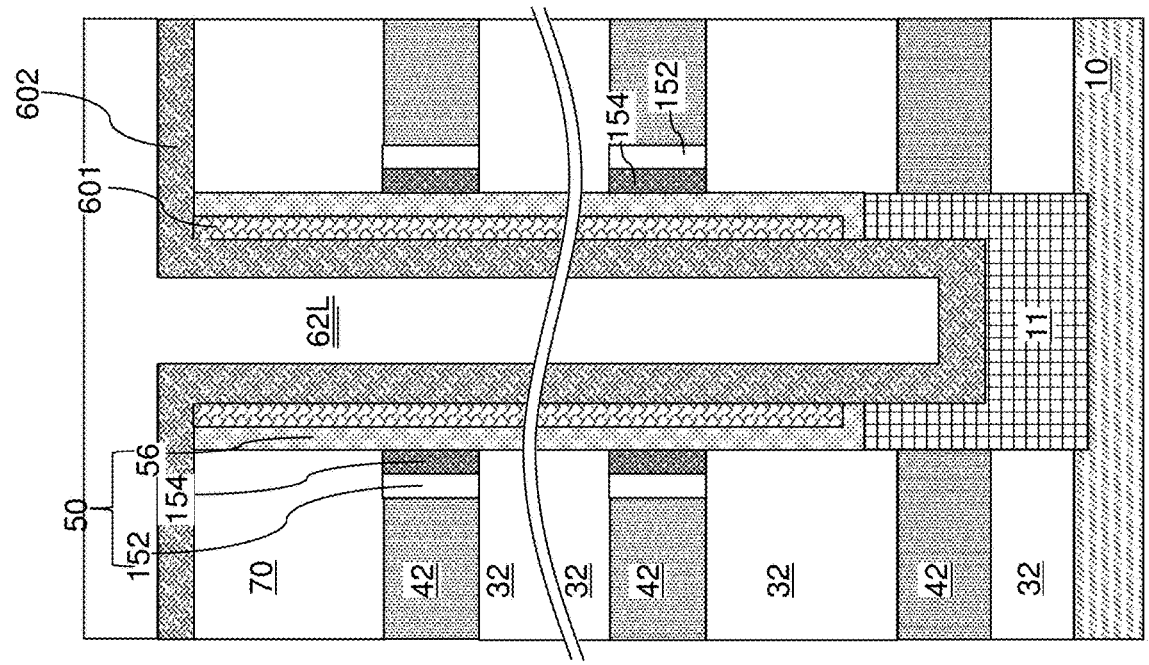

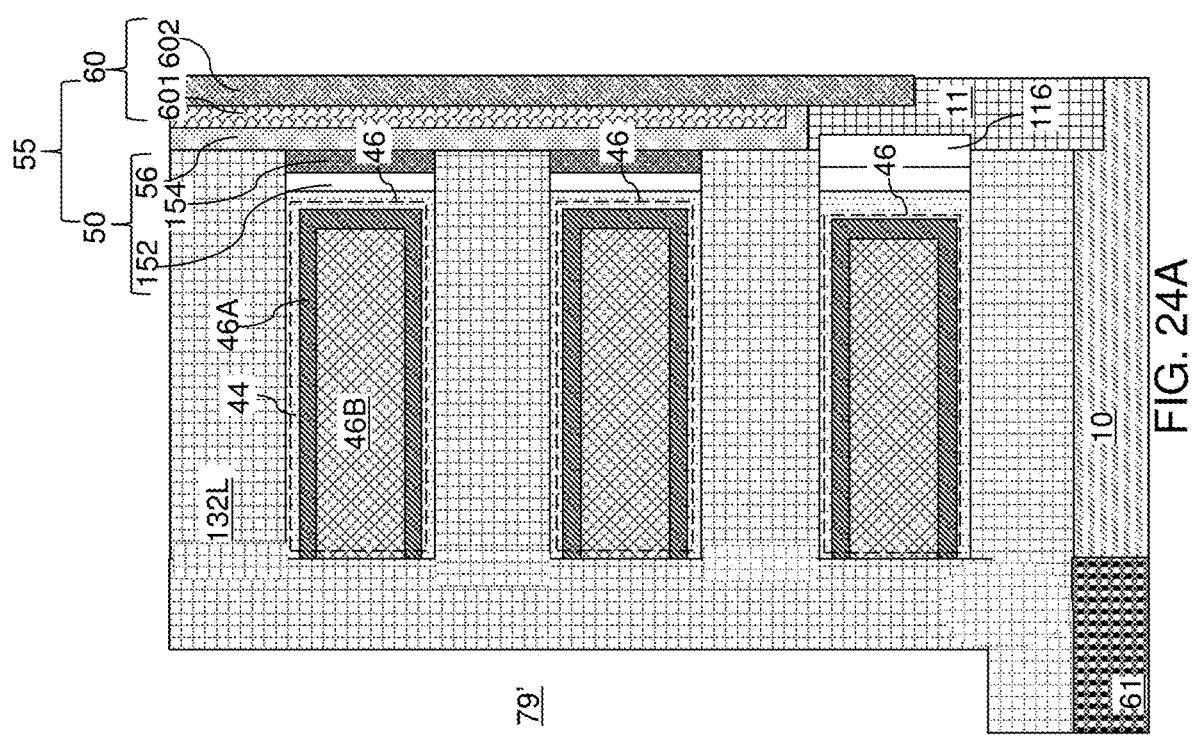

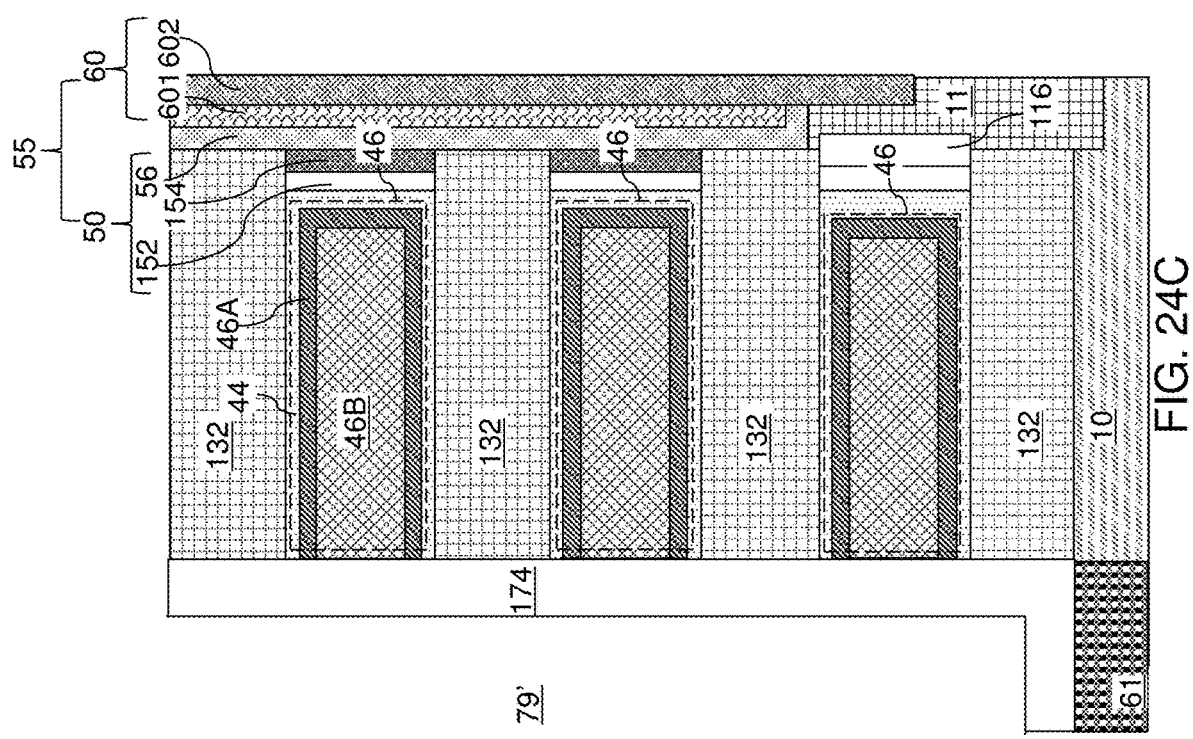

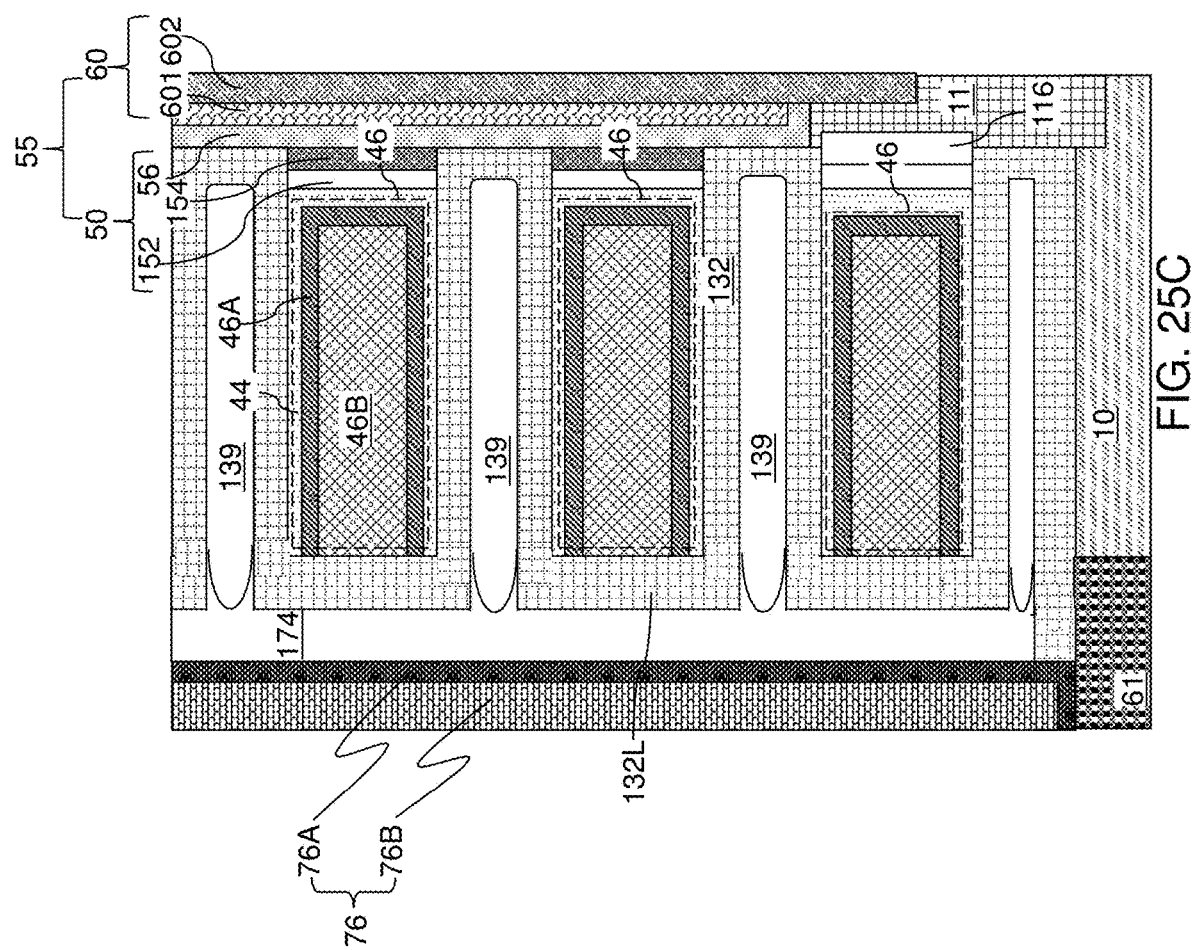

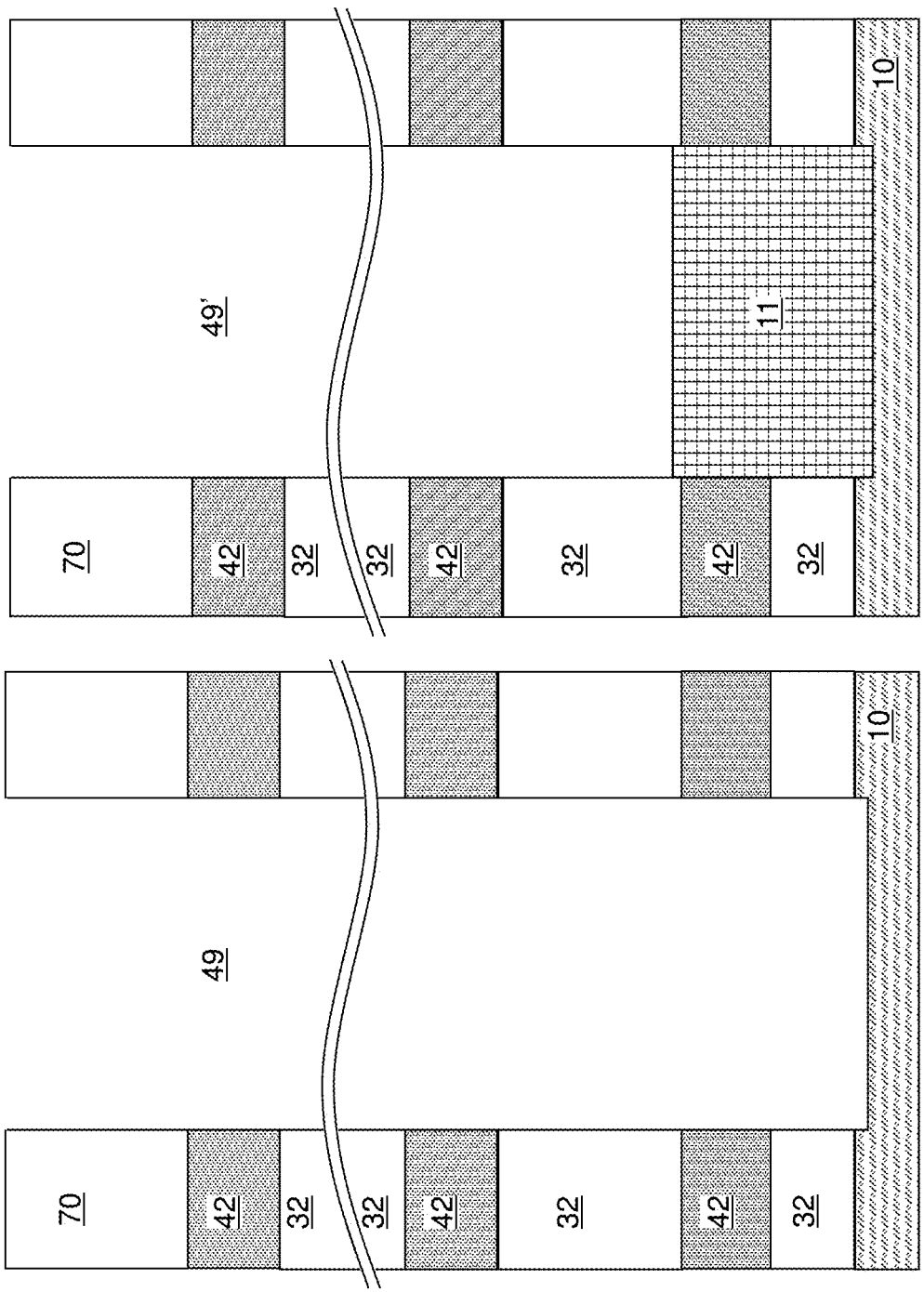

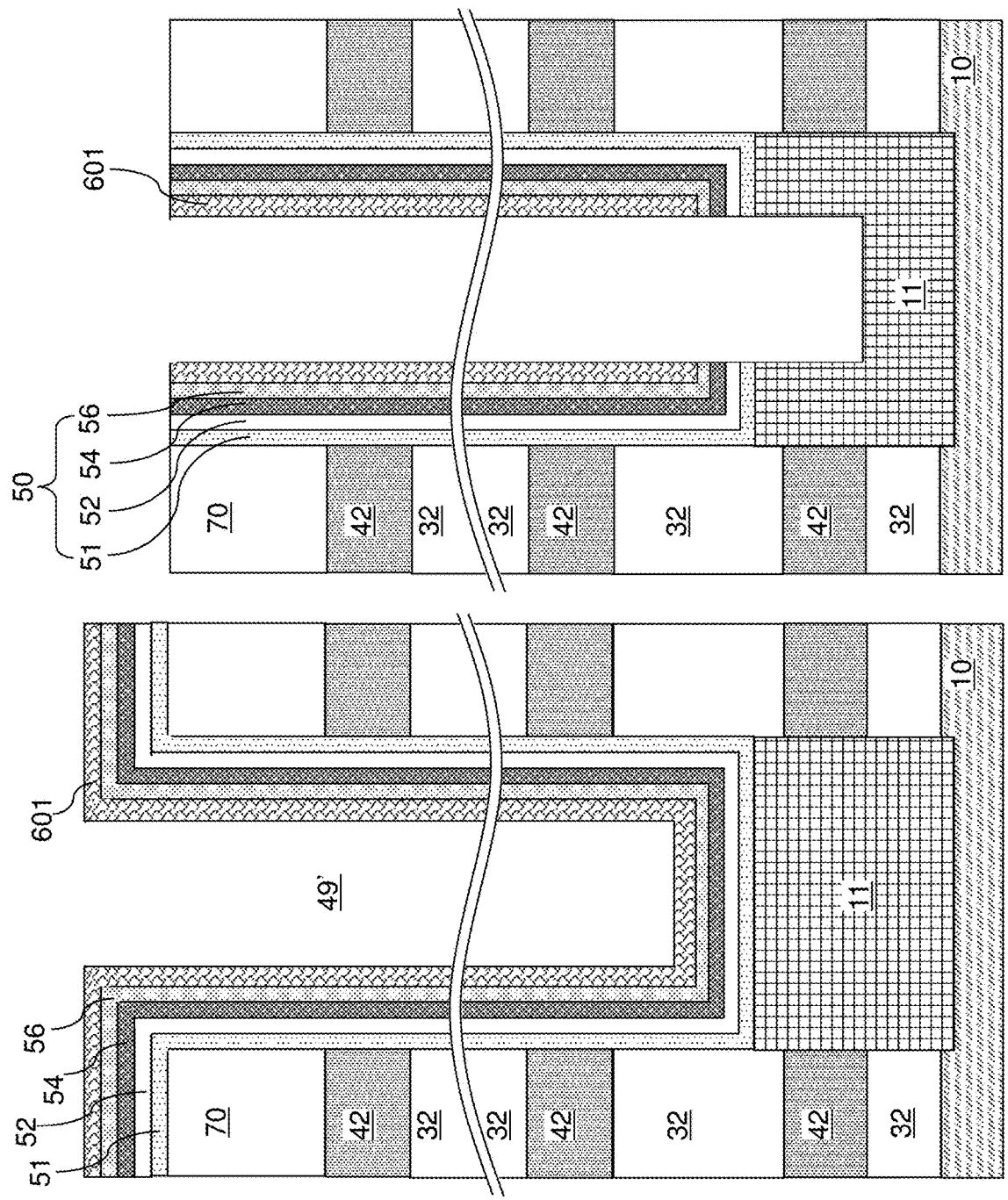

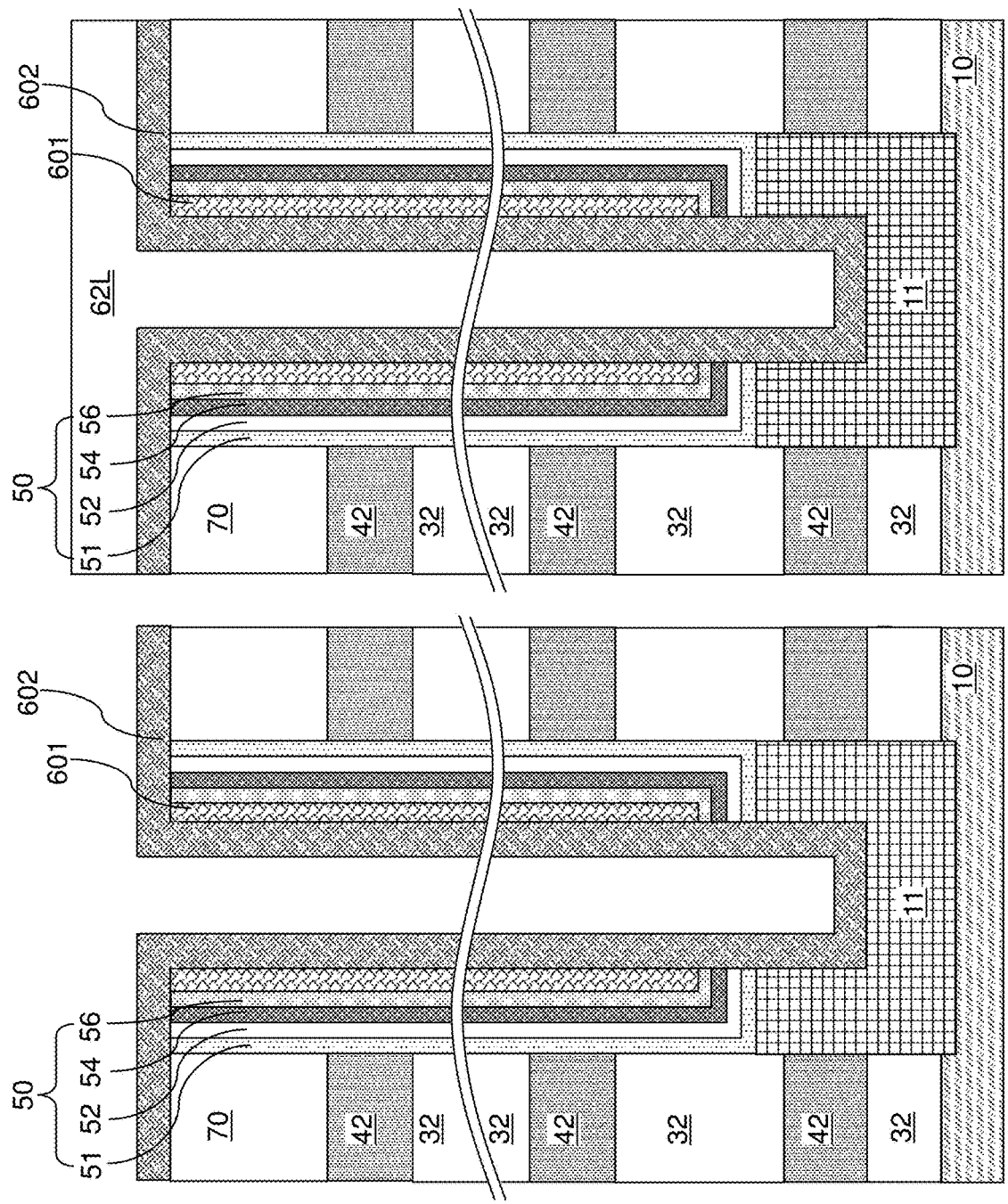

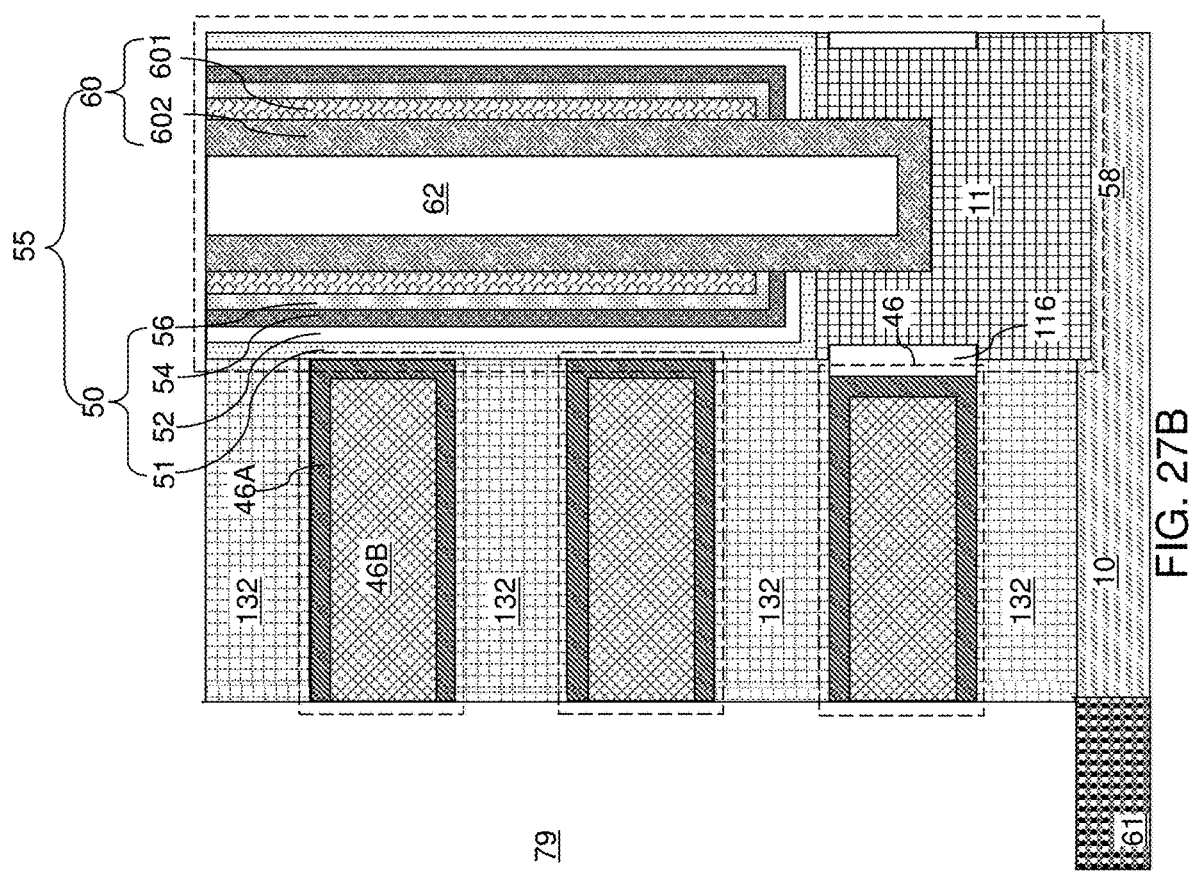

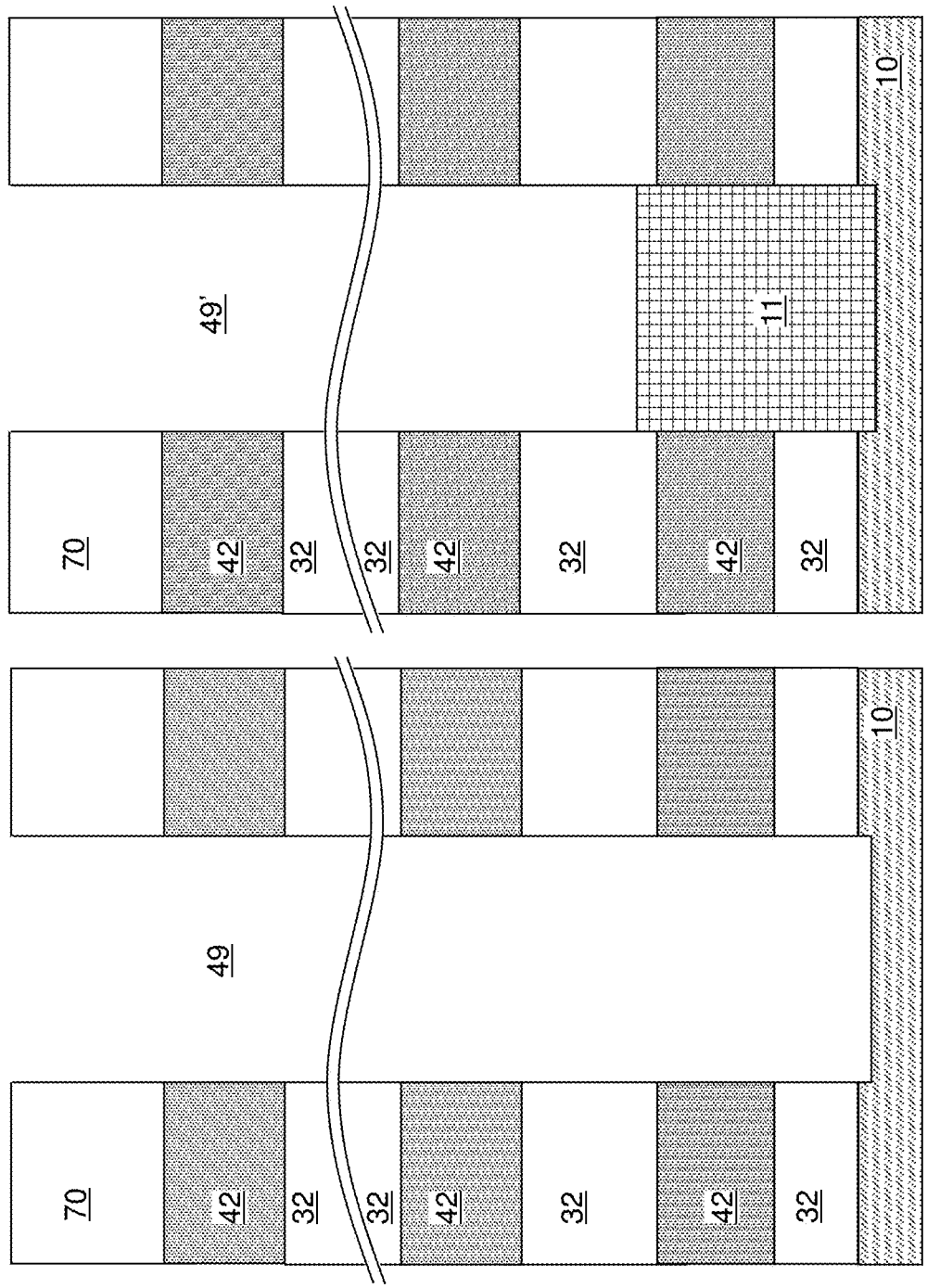

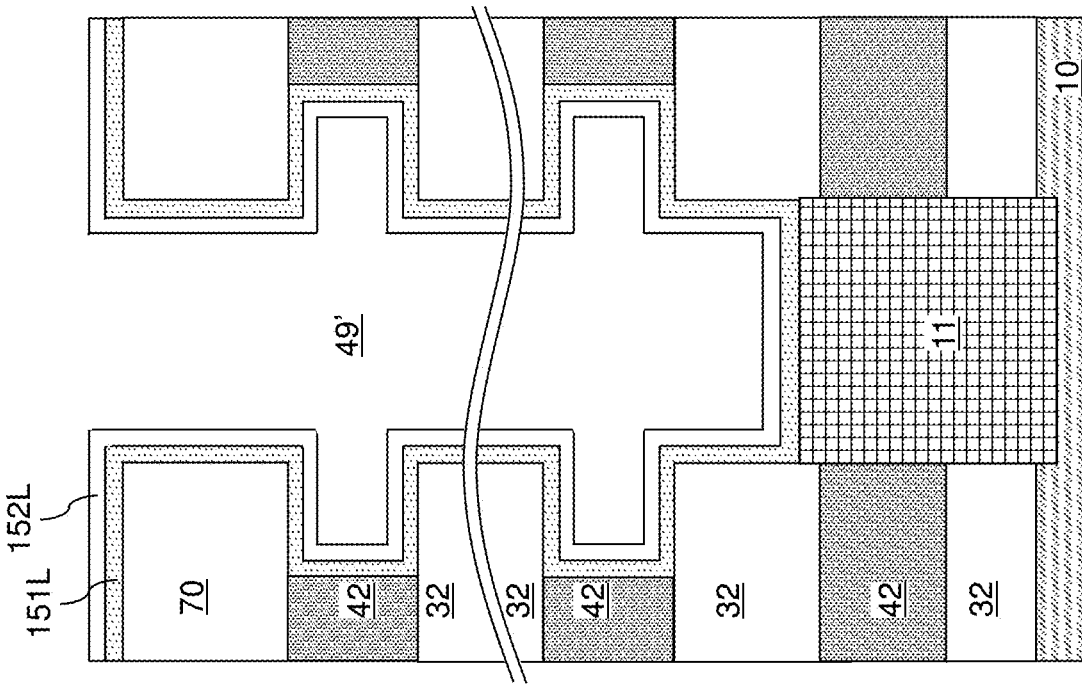
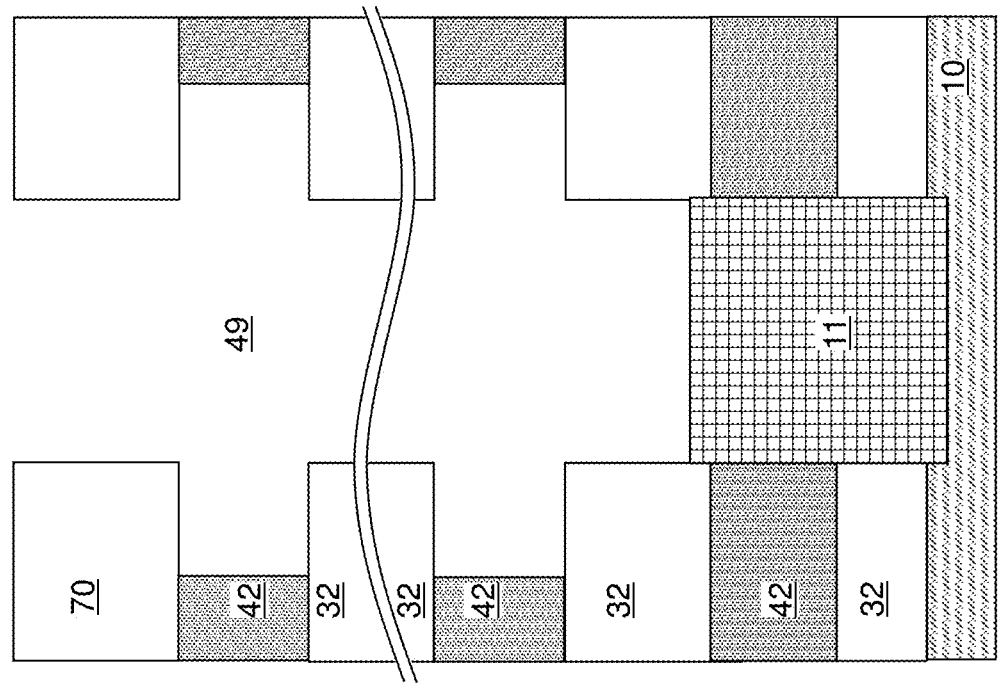
FIG. 29D
FIG. 29C

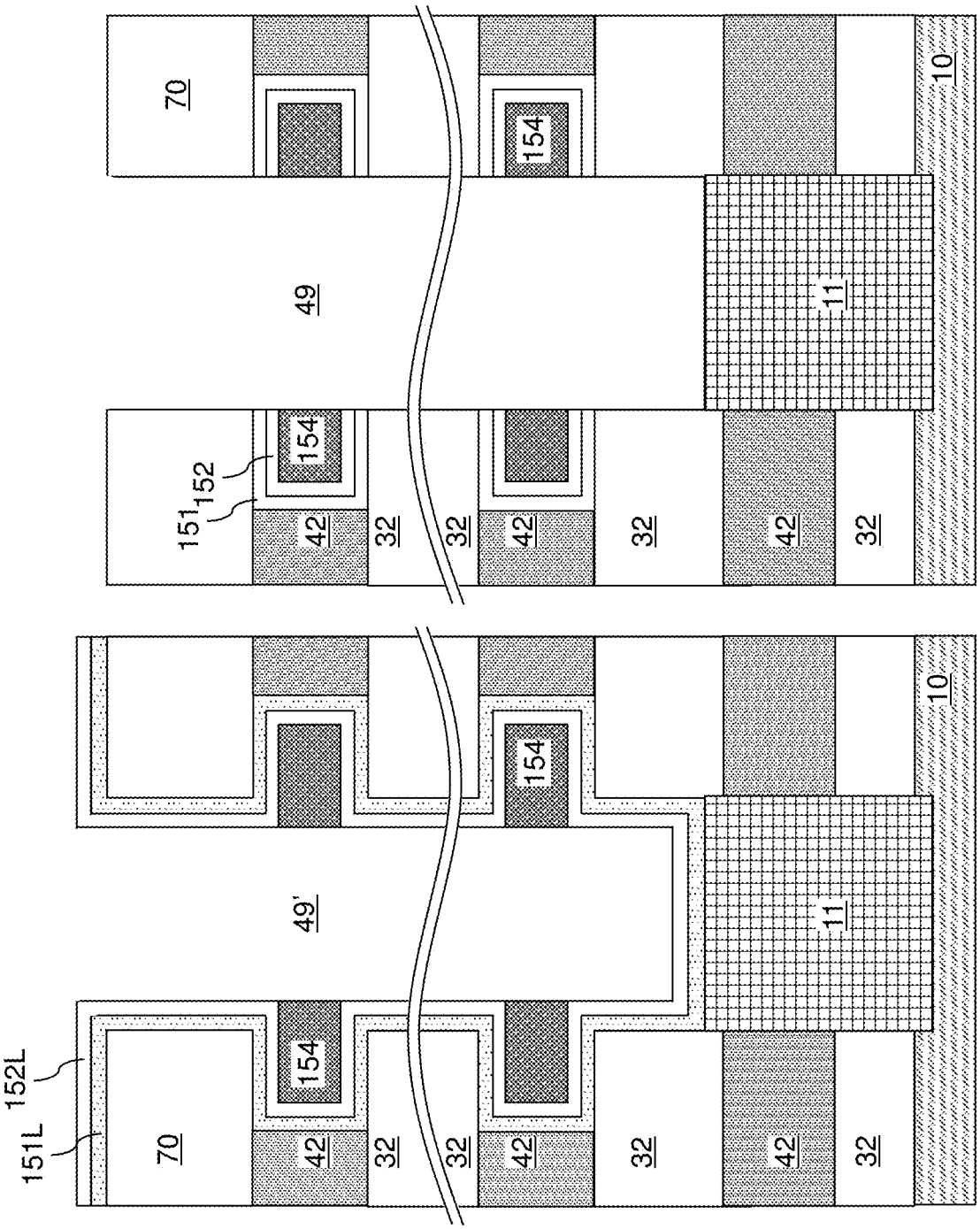

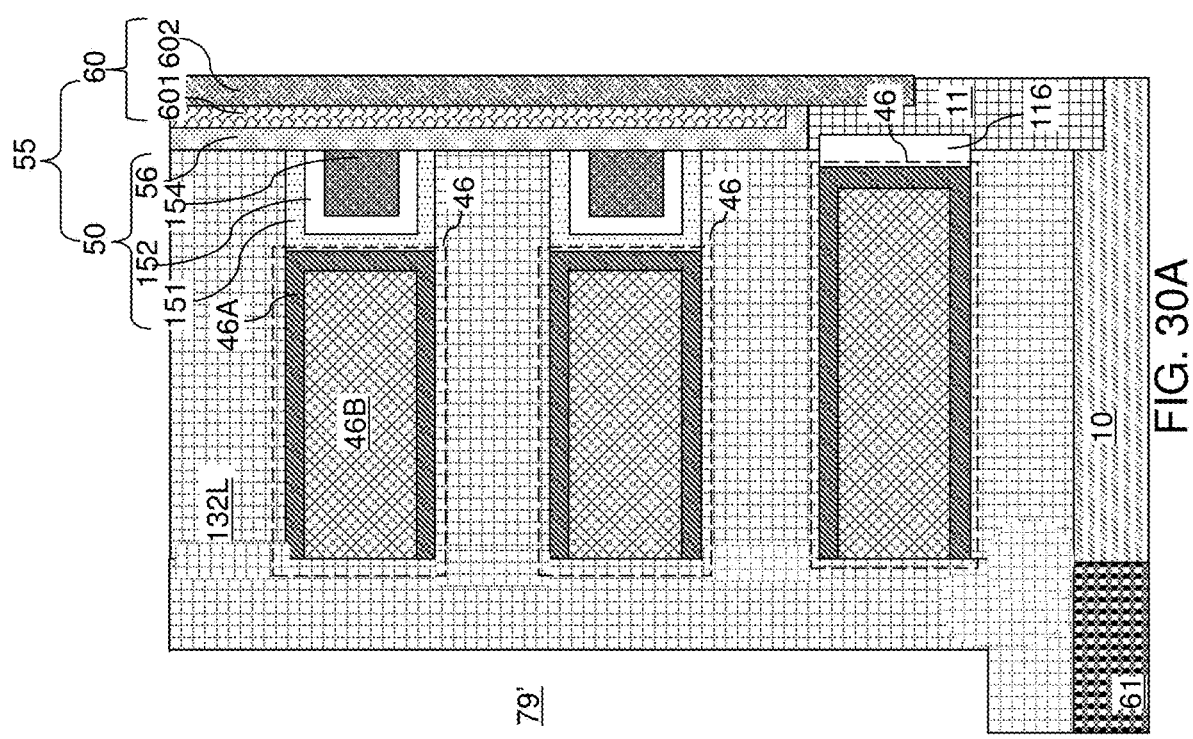

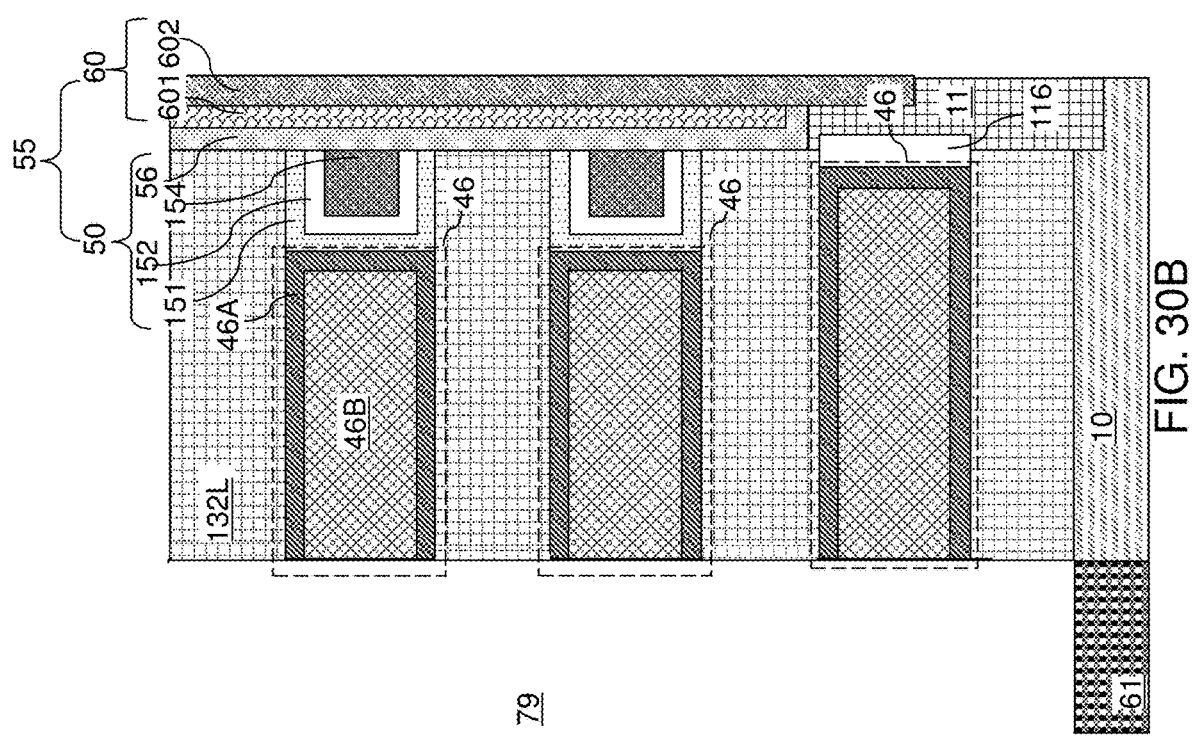

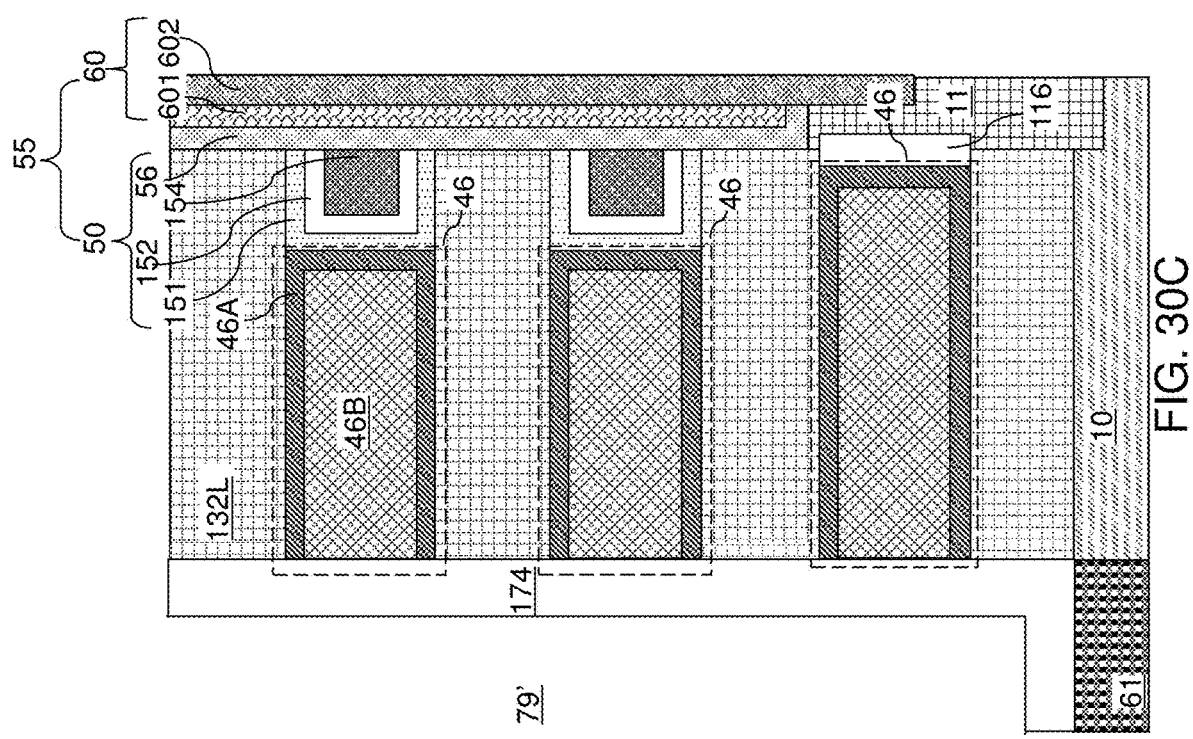

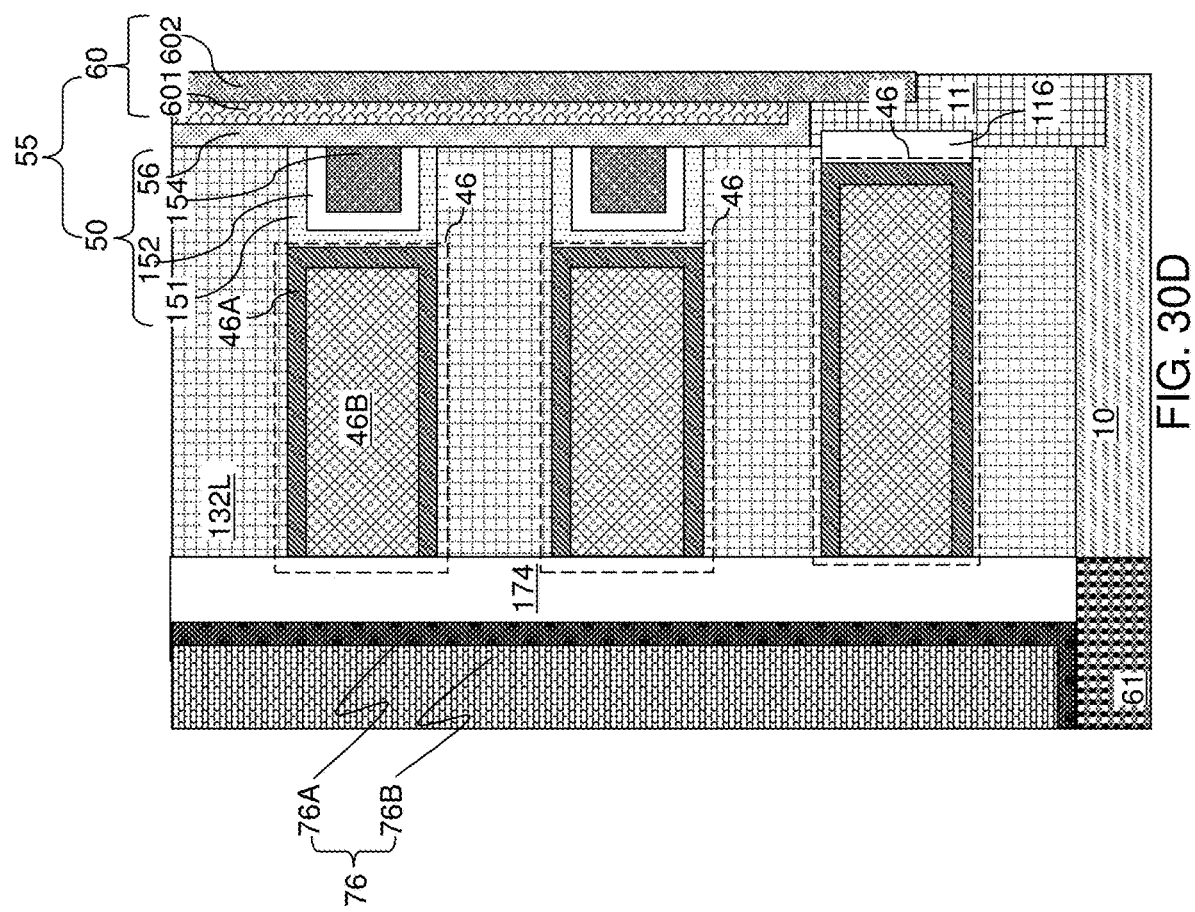

THREE-DIMENSIONAL MEMORY DEVICE CONTAINING METAL-ORGANIC FRAMEWORK INTER-WORD LINE INSULATING LAYERS

FIELD

The present disclosure relates generally to the field of semiconductor devices, and particularly to a three-dimensional memory device containing metal-organic framework inter-word line insulating layers and methods of manufacturing the same.

BACKGROUND

Vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a top surface of a substrate; and memory stack structures extending through the alternating stack. Each of the memory stack structures comprises a respective memory film and a respective vertical semiconductor channel. Each of the insulating layers comprises a metal-organic framework (MOF) material portion. Optionally, airgaps can be formed in the MOF material portions to reduce the effective dielectric constant even further.

According to another aspect of the present disclosure, a method of forming a three-dimensional memory device is provided, which comprises: forming an assembly over a substrate, the assembly including an alternating stack of spacer material layers and electrically conductive layers and memory stack structures that extend through the alternating stack, wherein each of the memory stack structures comprises a respective memory film and a respective vertical semiconductor channel; forming interlayer cavities by removing the spacer material layers selective to the electrically conductive layers and the memory stack structures; forming a metal-containing precursor layer in each of the interlayer cavities; and forming metal-organic framework (MOF) material portions by reacting the metal-containing precursor layer with a vapor of a linking compound, wherein insulating layers including a respective MOF material portion are formed in the interlayer cavities.

BRIEF DESCRIPTION OF THE DRAWINGS

FIGS. 5A-5H are sequential schematic vertical cross-sectional views of a memory opening within the first exemplary structure during formation of a memory stack structure, an optional dielectric core, and a drain region therein according to the first embodiment of the present disclosure.

FIG. 7B is a partial see-through top-down view of the first exemplary structure of FIG. 7A. The vertical plane A-A' is the plane of the schematic vertical cross-sectional view of FIG. 7A.

FIGS. 9A-9D are sequential vertical cross-sectional views of a region of the first exemplary structure during formation of electrically conductive layers according to the first embodiment of the present disclosure.

FIG. 13 is a vertical cross-sectional view of the first exemplary structure after formation of a metal-containing precursor layer according to the first embodiment of the present disclosure.

FIG. 14B is a vertical cross-sectional view of a region of the first exemplary structure of FIG. 14A.

FIG. 20B is a vertical cross-sectional view of a region of the first exemplary structure of FIG. 20A.

FIGS. 22A-22C are sequential vertical cross-sectional view of an alternative embodiment of the first exemplary structure during formation of insulating layers and backside trench fill structures according to the first embodiment of the present disclosure.

FIGS. 23A-23K are sequential schematic vertical cross-sectional views of a memory opening within a second exemplary structure during formation of a memory stack structure, an optional dielectric core, and a drain region therein according to a second embodiment of the present disclosure.

FIGS. 24A-24D are sequential vertical cross-sectional view of the second exemplary structure during formation of insulating layers and backside trench fill structures according to the second embodiment of the present disclosure.

FIGS. 25A-25C are sequential vertical cross-sectional view of an alternative embodiment of the second exemplary structure during formation of insulating layers and backside trench fill structures according to the second embodiment of the present disclosure.

FIGS. 26A-26H are sequential schematic vertical cross-sectional views of a memory opening within a third exemplary structure during formation of a memory stack structure, an optional dielectric core, and a drain region therein according to a third embodiment of the present disclosure.

FIGS. 27A-27C are sequential vertical cross-sectional view of the third exemplary structure during formation of insulating layers and backside trench fill structures according to the third embodiment of the present disclosure.

FIGS. 29A-29L are sequential schematic vertical cross-sectional views of a memory opening within a fourth exemplary structure during formation of a memory stack structure, an optional dielectric core, and a drain region therein according to a fourth embodiment of the present disclosure.

FIGS. 30A-30D are sequential vertical cross-sectional view of the fourth exemplary structure during formation of insulating layers and backside trench fill structures according to the fourth embodiment of the present disclosure.

DETAILED DESCRIPTION

Figure 1:
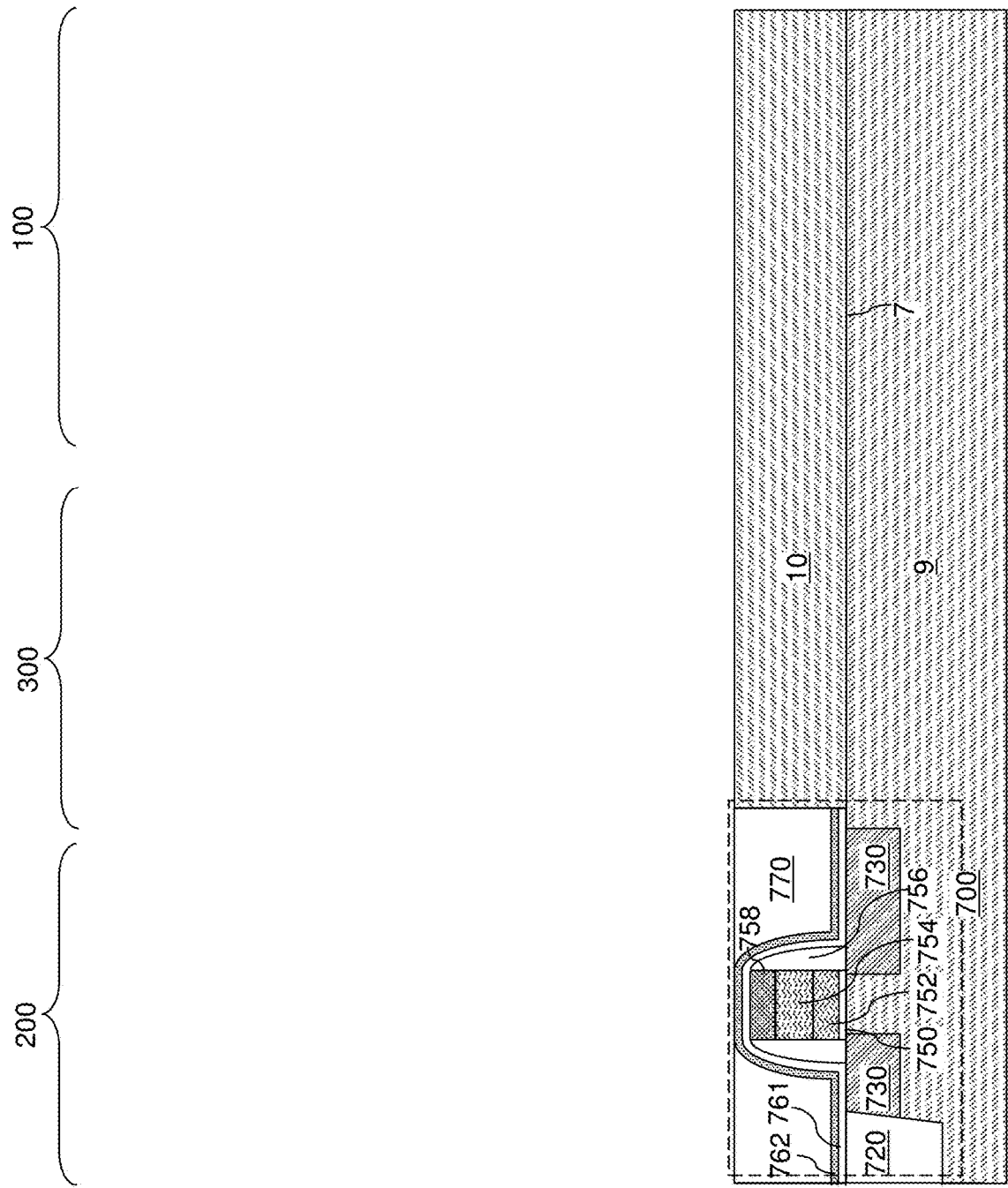
FIG. 1 is a schematic vertical cross-sectional view of a first exemplary structure after formation of at least one peripheral device and a semiconductor material layer according to a first embodiment of the present disclosure.

A three-dimensional memory device includes word lines that are vertically spaced apart by insulating layers, such as silicon oxide layers. However, a higher than desired dielectric constant of the silicon oxide insulating layers increases the RC delay in the word lines. Further, some three-dimensional memory devices employ charge trap layers such as silicon nitride layers, which has a high dielectric constant of 7.9 and is affected by electrical disturb and noise from neighboring memory cells through RC coupling. Embodiments of the present disclosure provide metal-organic framework ("MOF") insulating layers for inter-word line isolation, which have a lower dielectric constant (e.g., about 1.7 to 2.6) than silicon oxide. The MOF insulating layers reduce the word line RC delay to provide faster program, erase, and read operations. Furthermore, the MOF insulating layers may be grown inside a backside recesses between the word lines to provide improved insulating layer gap filling between the word lines.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atom. Silicon dioxide is preferred. In an illustrative example, the first dielectric liner 761 can be a silicon oxide layer, and the second dielectric liner 762 can be a silicon nitride layer. The at least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

In an alternative embodiment, the at least one semiconductor device 700 is formed under the memory array region 100 in a CMOS under array ("CUA") configuration. In this case, the peripheral device region 200 may be omitted or used in combination with the CUA configuration. In another alternative embodiment, the at least one semiconductor device 700 may be formed on a separate substrate and then bonded to substrate (9, 10) containing the memory array region 100.

Figure 2:
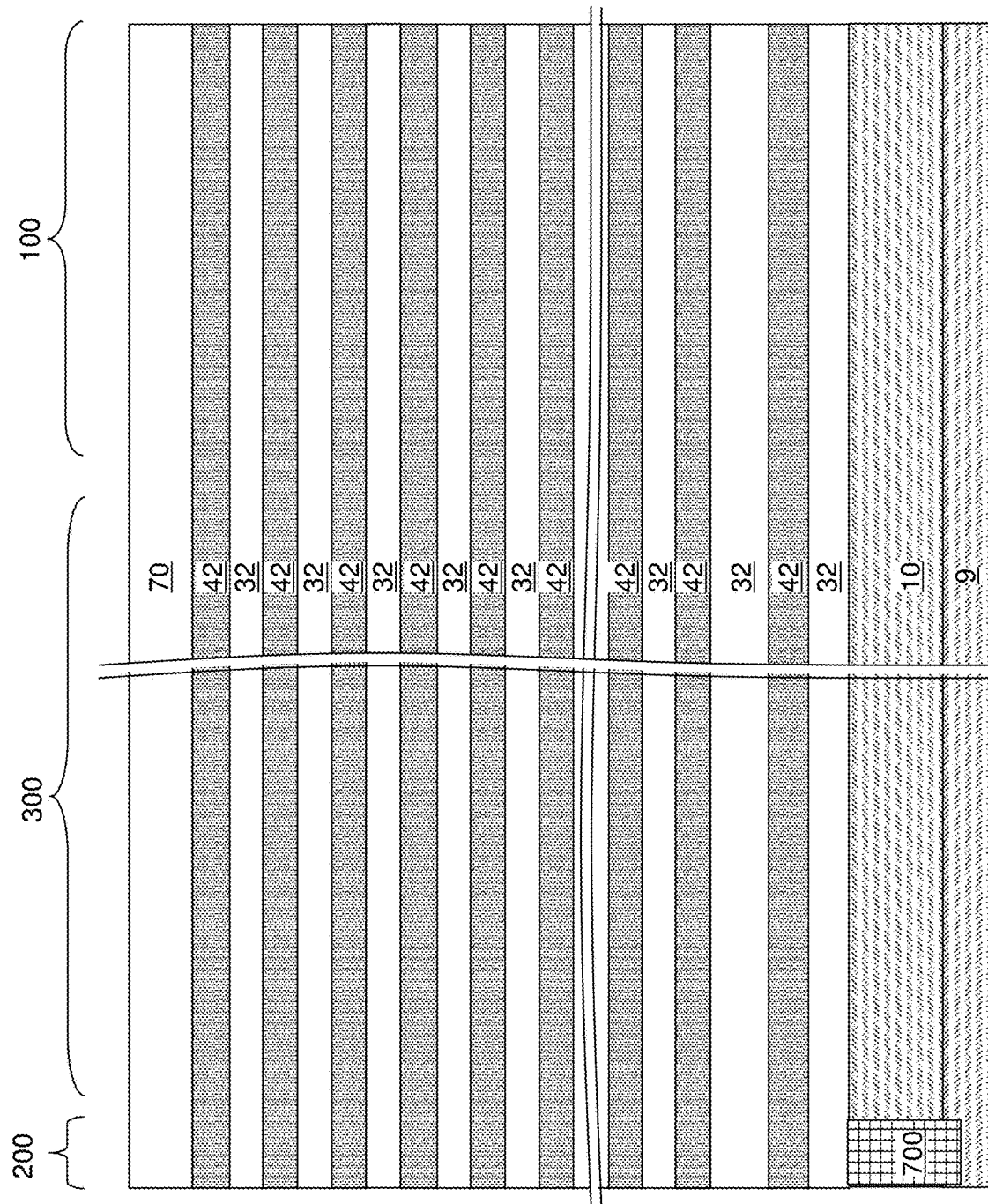
FIG. 2 is a schematic vertical cross-sectional view of the first exemplary structure after formation of an in-process alternating stack of spacer material layers and sacrificial material layers according to the first embodiment of the present disclosure.

Referring to FIG. 2, a stack of an alternating plurality of first material layers (which can be spacer material layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the alternating second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be a spacer material layer 32, and each second material layer can be a sacrificial material layer. In this case, the stack can include an alternating plurality of spacer material layers 32 and sacrificial material layers 42, and constitutes a prototype stack of alternating layers comprising spacer material layers 32 and sacrificial material layers 42, and is herein referred to as an in-process alternating stack (32, 42) of the spacer material layers 32 and the sacrificial material layers 42.

The stack of the alternating plurality is herein referred to as an in-process alternating stack (32, 42). In one embodiment, the in-process alternating stack (32, 42) can include spacer material layers 32 composed of the first material, and sacrificial material layers 42 composed of a second material different from that of spacer material layers 32. The first material of the spacer material layers 32 can be an insulating material, a semiconductor material, or a conductive material. Materials that can be employed for the spacer material layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials, silicon, a silicon-germanium alloy, or a metallic material. In one embodiment, the first material of the spacer material layers 32 can include borosilicate glass or a silicon-germanium alloy including germanium at an atomic concentration in a range from 15% to 50%.

The second material of the sacrificial material layers 42 is a sacrificial material that can be removed selective to the first material of the spacer material layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can comprise silicon nitride or a semiconductor material including at least one of silicon and germanium.

In one embodiment, the spacer material layers 32 can include borosilicate glass, and sacrificial material layers can include silicon nitride or a silicon-germanium alloy. Alternatively, the spacer material layers 32 can include a silicon-germanium alloy, and sacrificial material layers can include silicon nitride or borosilicate glass. The first material of the spacer material layers 32 can be deposited, for example, by chemical vapor deposition (CVD). For example, if silicon oxide is employed for the spacer material layers 32, tetraethyl orthosilicate (TEOS) can be employed as the precursor material for the CVD process. The second material of the sacrificial material layers 42 can be formed, for example, by CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the spacer material layers 32 and the sacrificial material layers 42 can be in a range from 20 nm to 50 nm, although lesser and greater thicknesses can be employed for each spacer material layer 32 and for each sacrificial material layer 42. The number of repetitions of the pairs of a spacer material layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the in-process alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, a cap spacer material layer 70 can be formed over the in-process alternating stack (32, 42). The cap spacer material layer 70 includes a dielectric material that is different from the material of the sacrificial material layers 42. In one embodiment, the cap spacer material layer 70 can include a dielectric material that can be employed for the spacer material layers 32 as described above. The cap spacer material layer 70 can have a greater thickness than each of the spacer material layers 32. The cap spacer material layer 70 can be deposited, for example, by chemical vapor deposition. In one embodiment, the cap spacer material layer 70 can include the same material as the spacer material layers 32.

Figure 3:
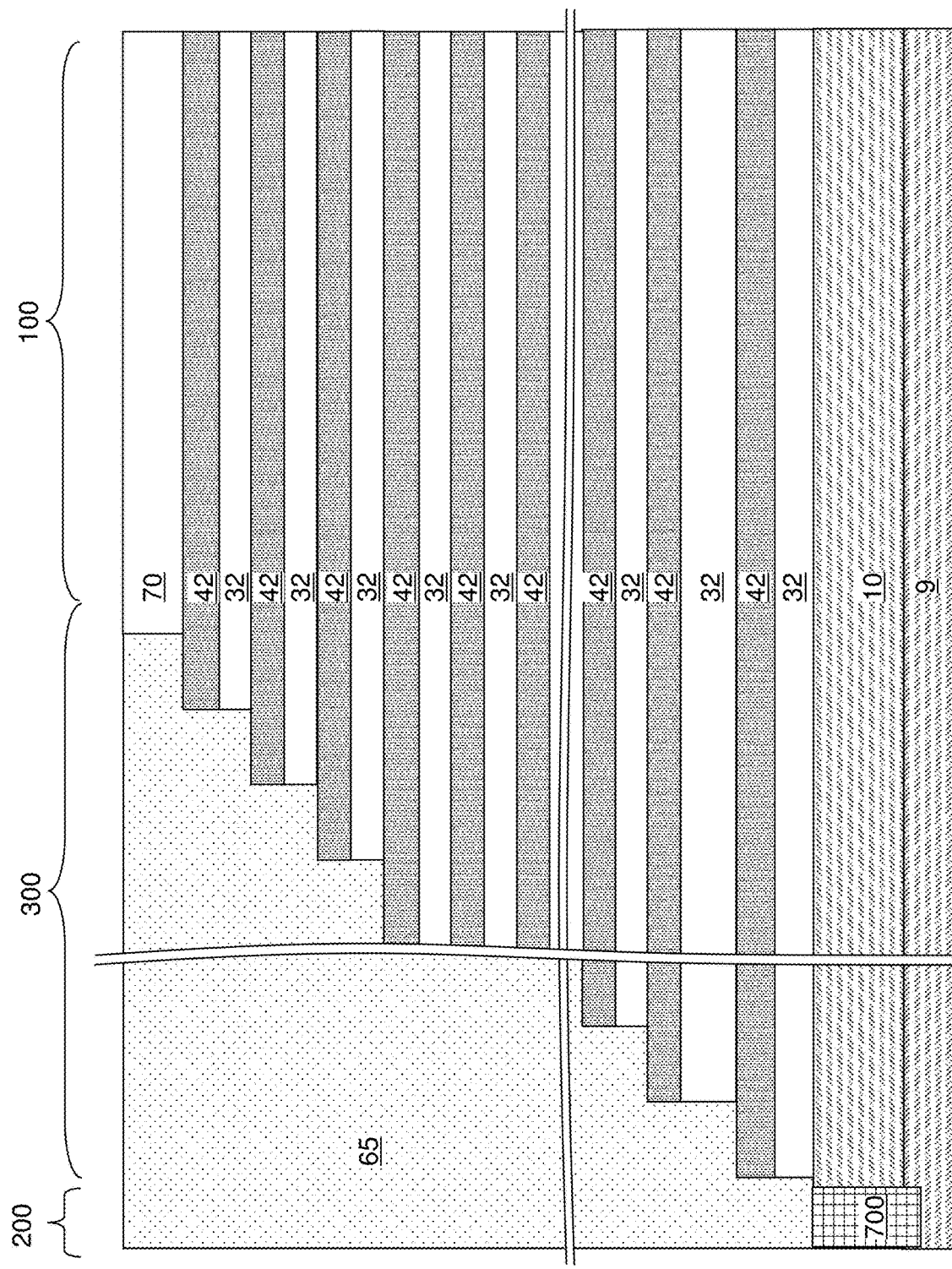
FIG. 3 is a schematic vertical cross-sectional view of the first exemplary structure after formation of stepped terraces and a retro-stepped spacer material portion according to the first embodiment of the present disclosure.

Referring to FIG. 3, stepped surfaces are formed at a peripheral region of the in-process alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the in-process alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the in-process alternating stack (32, 42) laterally extends farther than any overlying sacrificial material layer 42 within the in-process alternating stack (32, 42) in the terrace region. The terrace region includes stepped surfaces of the in-process alternating stack (32, 42) that continuously extend from a bottommost layer within the in-process alternating stack (32, 42) to a topmost layer within the in-process alternating stack (32, 42).

Each vertical step of the stepped surfaces can have the height of one or more pairs of a spacer material layer 32 and a sacrificial material layer 42. In one embodiment, each vertical step can have the height of a single pair of a spacer material layer 32 and a sacrificial material layer 42. In another embodiment, multiple "columns" of staircases can be formed along a first horizontal direction hd1 such that each vertical step has the height of a plurality of pairs of a spacer material layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped spacer material portion 65 can be formed in the stepped cavity by deposition of a material that can be subsequently removed. For example, a material having a same composition as the spacer material layers 32 can be deposited in the stepped cavity. Excess portions of the deposited material can be removed from above the top surface of the cap spacer material layer 70, for example, by chemical mechanical planarization (CMP). The remaining portion of the deposited material filling the stepped cavity constitutes the retro-stepped spacer material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped spacer material portion 65, the silicon oxide of the retro-stepped spacer material portion 65 may, or may not, be doped with dopants such as B, P, and/or F.

Optionally, drain select level separator structures 72 can be formed through the cap spacer material layer 70 and a subset of the sacrificial material layers 42 located at drain select levels. The drain select level separator structures 72 can be formed, for example, by forming drain select level isolation trenches and filling the drain select level isolation trenches with a fill material. Excess portions of the fill material can be removed from above the top surface of the cap spacer material layer 70. In one embodiment, the fill material may be the same as the material of the spacer material layers 32. Alternatively, the fill material may include a dielectric material.

Figure 4A:
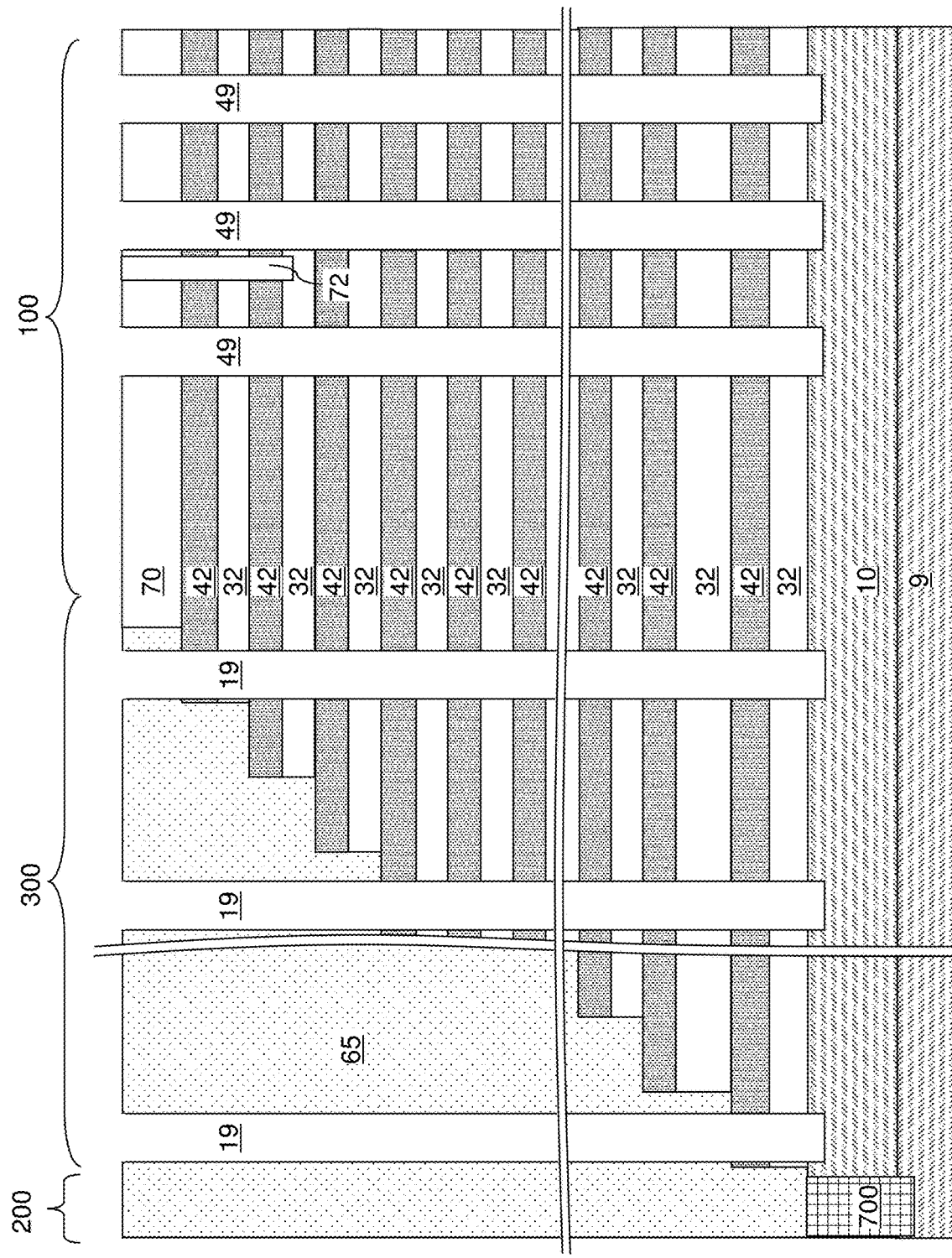
FIG. 4A is a schematic vertical cross-sectional view of the first exemplary structure after formation of memory openings and support openings according to the first embodiment of the present disclosure.
Figure 4B:
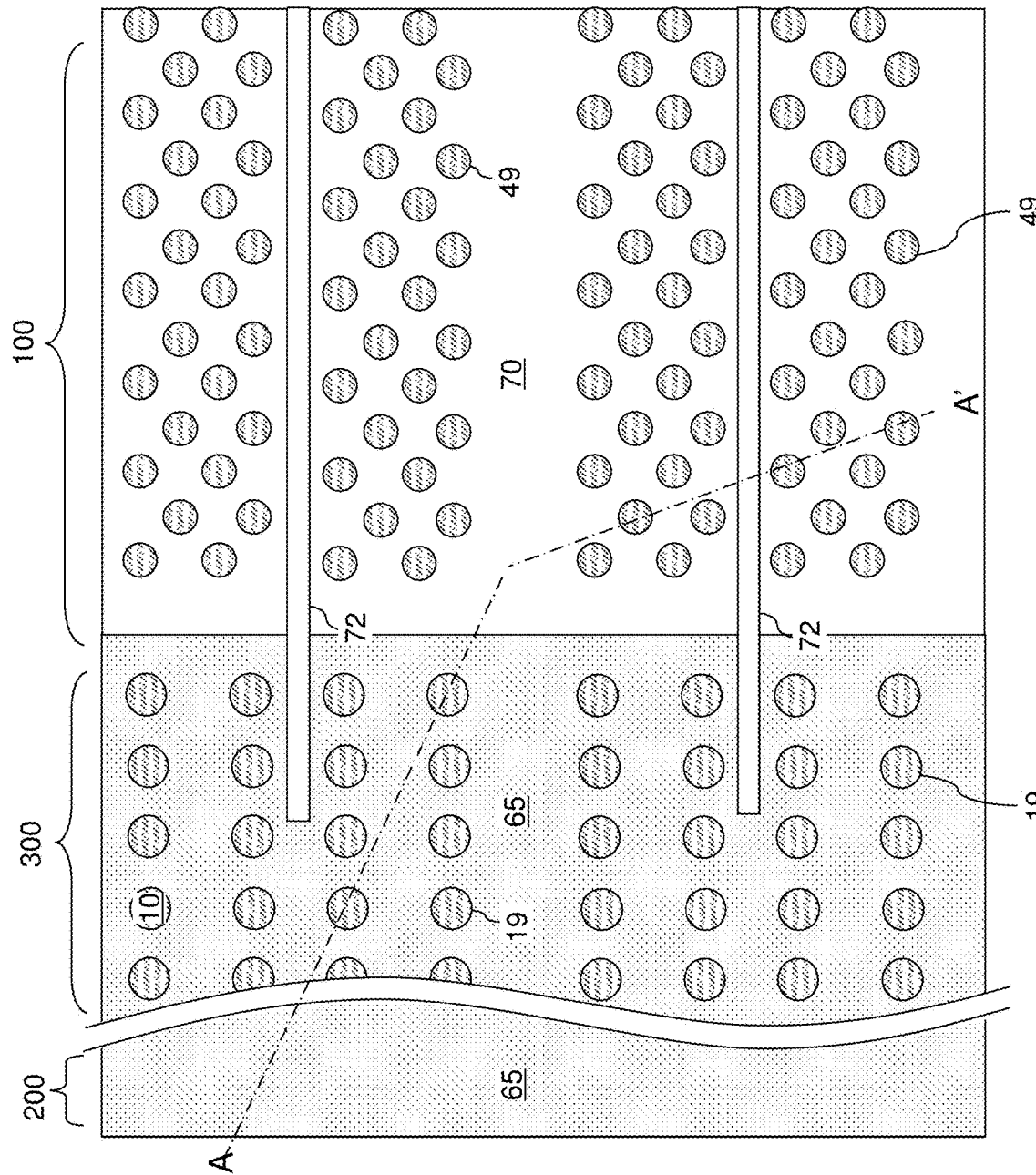
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the cap spacer material layer 70 and the retro-stepped spacer material portion 65, and can be lithographically patterned to form openings therein. The openings include a first set of openings formed over the memory array region 100 and a second set of openings formed over the staircase region 300. The pattern in the lithographic material stack can be transferred through the cap spacer material layer 70 or the retro-stepped spacer material portion 65, and through the in-process alternating stack (32, 42) by at least one anisotropic etch that employs the patterned lithographic material stack as an etch mask. Portions of the in-process alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the cap spacer material layer 70 and the entirety of the in-process alternating stack (32, 42) in the memory array region 100. The support openings 19 are formed through the retro-stepped spacer material portion 65 and the portion of the in-process alternating stack (32, 42) that underlie the stepped surfaces in the staircase region 300.

The memory openings 49 extend through the entirety of the in-process alternating stack (32, 42). The support openings 19 extend through a subset of layers within the in-process alternating stack (32, 42). The chemistry of the anisotropic etch process employed to etch through the materials of the in-process alternating stack (32, 42) can alternate to optimize etching of the first and second materials in the in-process alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the in-process alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extended to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the cap spacer material layer 70, the in-process alternating stack (32, 42), and optionally into an upper portion of the semiconductor material layer 10. At this processing step, each support opening 19 can extend through the retro-stepped spacer material portion 65, a subset of layers in the in-process alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the spacer material layers 32 can have vertically coincident sidewalls, and the charge storage layer 54 can be formed as a single continuous layer.

In another embodiment, the sacrificial material layers 42 can be laterally recessed with respect to the sidewalls of the spacer material layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, and the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the cap spacer material layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the second semiconductor channel layer 602. Further, the material of the dielectric core layer 62L can be vertically recessed selective to the semiconductor material of the second semiconductor channel layer 602 into each memory opening 49 down to a depth between a first horizontal plane including the top surface of the cap spacer material layer 70 and a second horizontal plane including the bottom surface of the cap spacer material layer 70. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Excess portions of the deposited semiconductor material can be removed from above the top surface of the cap spacer material layer 70, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the cap spacer material layer 70 can be concurrently removed by a planarization process. Each remaining portion of the second semiconductor channel layer 602 can be located entirety within a memory opening 49 or entirely within a support opening 19.

Each remaining portion of the doped semiconductor material having a doping of the second conductivity type constitutes a drain region 63. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a tunneling dielectric layer 56, a charge storage layer 54, and a blocking dielectric layer 52 collectively constitute a memory film 50, which includes a vertical stack of memory elements that can store a respective data bit with a macroscopic retention time. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising portions of the charge storage layer 54, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
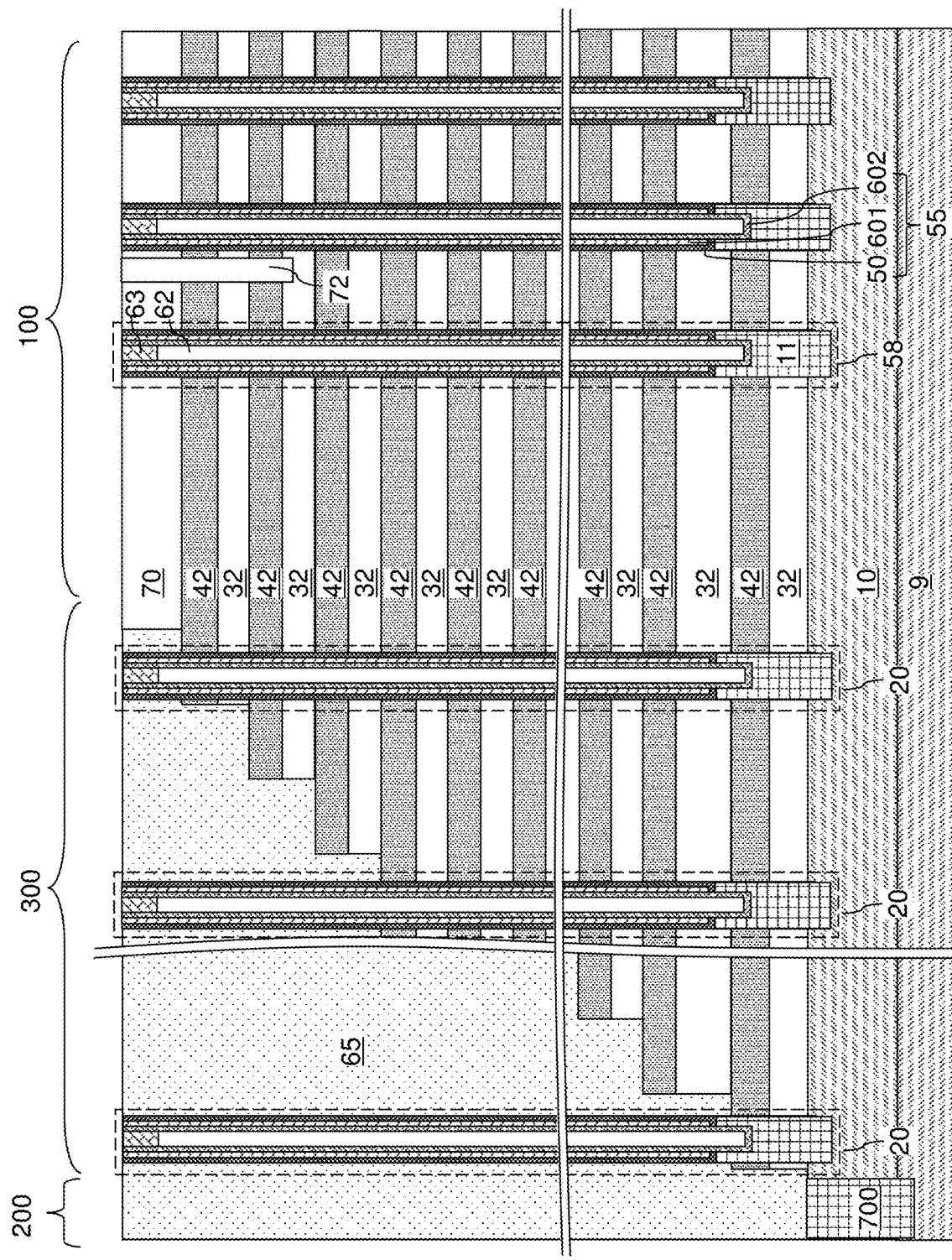
FIG. 6 is a schematic vertical cross-sectional view of the first exemplary structure after formation of memory stack structures and support pillar structures according to the first embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
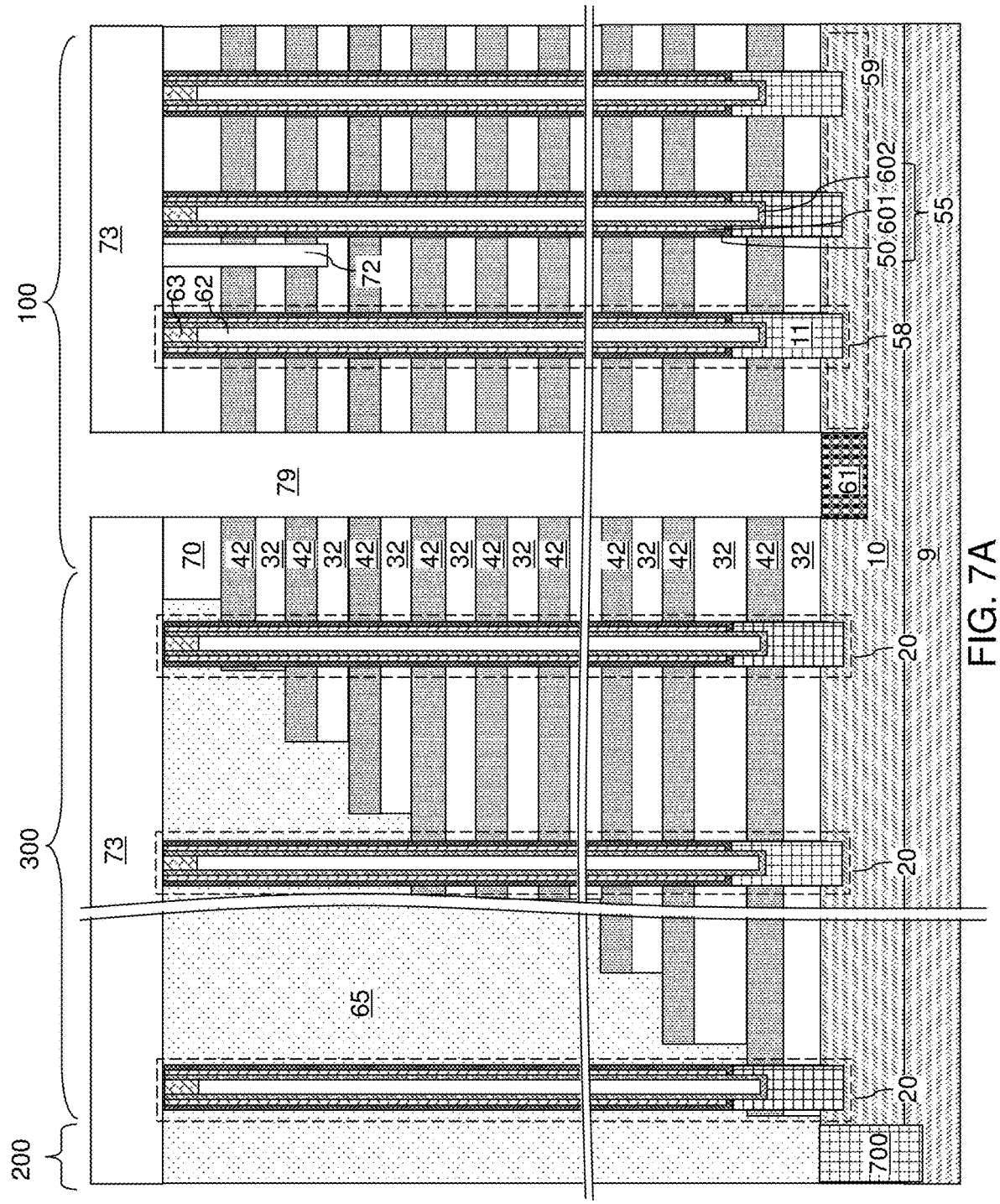
FIG. 7A is a schematic vertical cross-sectional view of the first exemplary structure after formation of backside trenches and source regions according to the first embodiment of the present disclosure.

Referring to FIGS. 7A and 7B, a buffer material layer 73 can be formed over the in-process alternating stack (32, 42) of spacer material layer 32 and sacrificial material layers 42, and over the memory stack structures 55 and the support pillar structures 20. The buffer material layer 73 includes a material that is different from the dielectric material of the sacrificial material layers 42. For example, the buffer material layer 73 can include the same material as the spacer material layers 32. The buffer material layer 73 can have a thickness in a range from 50 nm to 500 nm, although lesser and greater thicknesses can also be employed.

A photoresist layer (not shown) can be applied over the buffer material layer 73, and is lithographically patterned to form openings in areas between clusters of memory stack structures 55. The pattern in the photoresist layer can be transferred through the buffer material layer 73, the in-process alternating stack (32, 42) and/or the retro-stepped spacer material portion 65 employing an anisotropic etch to form backside trenches 79, which vertically extend from the top surface of the buffer material layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level separator structures 72 can laterally extend along the first horizontal direction hd1. Each backside trench 79 can have a uniform width that is invariant along the lengthwise direction (i.e., along the first horizontal direction hd1). Each drain select level separator structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level separator structure 72, or between a neighboring pair of drain select level separator structures 72. In one embodiment, the backside trenches 79 can include a source contact opening in which a source contact via structure can be subsequently formed. The photoresist layer can be removed, for example, by ashing.

Dopants of the second conductivity type can be implanted into portions of the semiconductor material layer 10 that underlie the backside trenches 79 to form source regions 61. The atomic concentration of the dopants of the second conductivity type in the source regions 61 can be in a range from $5.0 \times 10^{19}/cm^3$ to $2.0 \times 10^{21}/cm^3$, although lesser and greater atomic concentrations can also be employed. Surface portions of the semiconductor material layer 10 that extend between each source region 61 and adjacent memory opening fill structures 58 comprise horizontal semiconductor channels 59.

Figure 8:
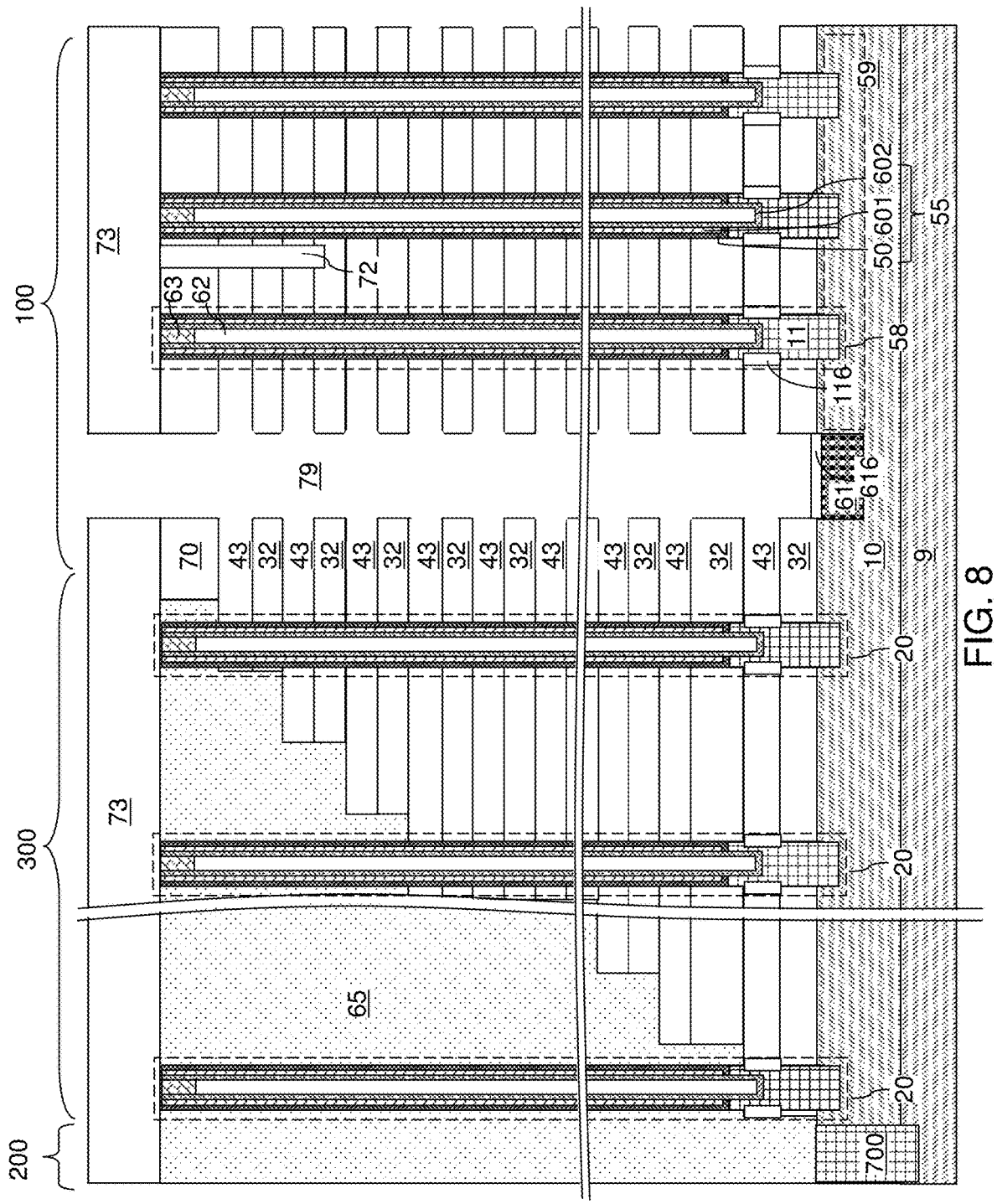
FIG. 8 is a schematic vertical cross-sectional view of the first exemplary structure after formation of backside recesses, tubular dielectric spacers, and planar dielectric portions according to the first embodiment of the present disclosure.

Referring to FIGS. 8 and 9A, an etchant that selectively etches the second material of the sacrificial material layers 42 with respect to the first material of the spacer material layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the spacer material layers 32, the material of the retro-stepped spacer material portion 65, the semiconductor material of the semiconductor material layer 10, and the material of the outermost layer of the memory films 50. In one embodiment, the sacrificial material layers 42 can include silicon nitride, and the materials of the spacer material layers 32 and the retro-stepped spacer material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped spacer material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying spacer material layer 32 and a bottom surface of an overlying spacer material layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10. Dopants in the drain regions 63, the source regions 61, and the semiconductor channels 60 can be activated during the anneal process that forms the planar dielectric portions 616 and the tubular dielectric spacers 116. Alternatively, an additional anneal process may be performed to activate the electrical dopants in the drain regions 63, the source regions 61, and the semiconductor channels 60.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the spacer material layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the spacer material layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
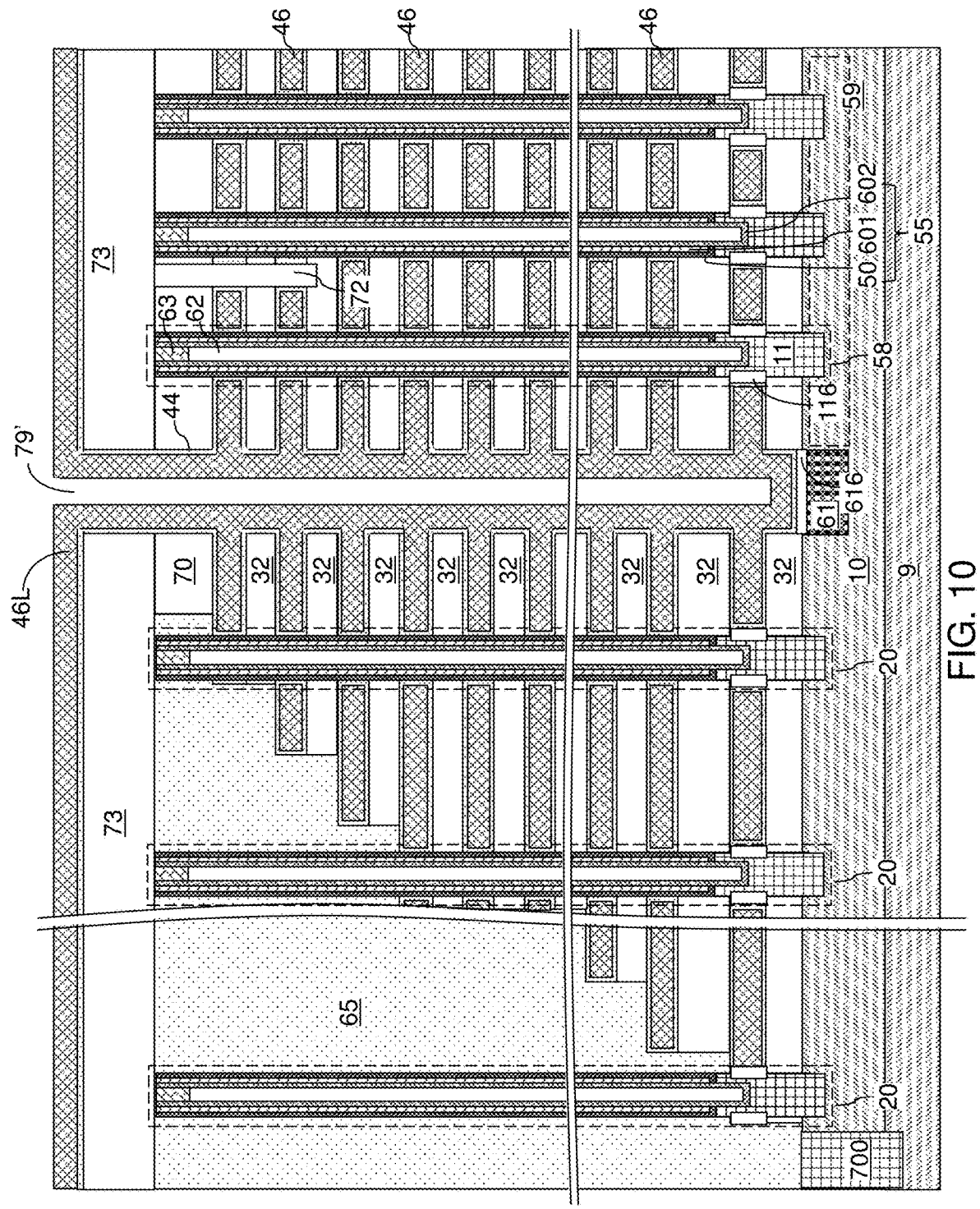
FIG. 10 is a schematic vertical cross-sectional view of the first exemplary structure at the processing step of FIG. 9D.

Referring to FIGS. 9D and 10, a metal fill material is deposited in the plurality of backside recesses 43, on the sidewalls of the at least one the backside trench 79, and over the top surface of the buffer material layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the spacer material layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the buffer material layer 73. Each electrically conductive layer 46 includes a portion of the metallic barrier layer 46A and a portion of the metallic fill material layer 46B that are located between a vertically neighboring pair of dielectric material layers such as a pair of spacer material layers 32. The continuous electrically conductive material layer 46L includes a continuous portion of the metallic barrier layer 46A and a continuous portion of the metallic fill material layer 46B that are located in the backside trenches 79 or above the buffer material layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
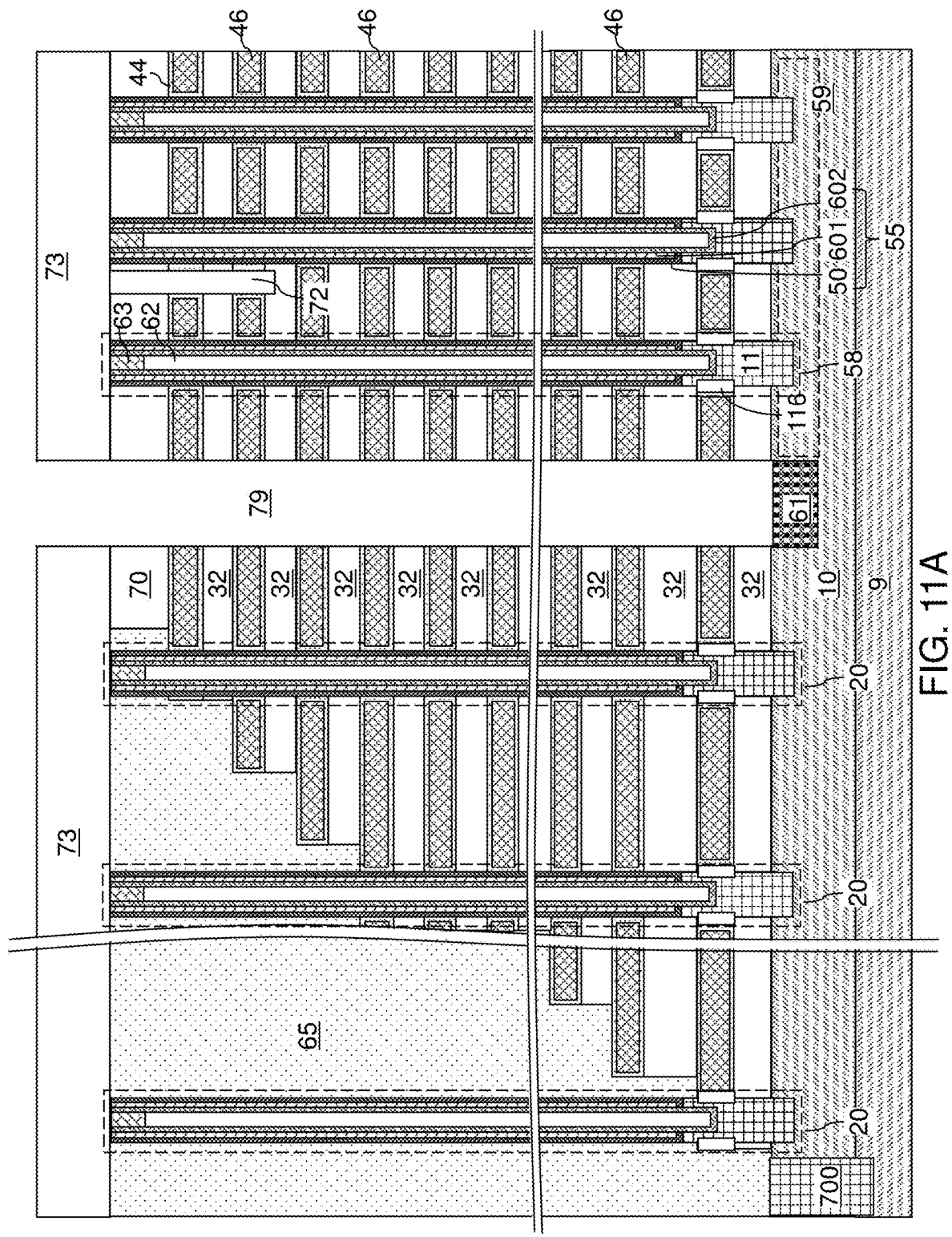
FIG. 11A is a schematic vertical cross-sectional view of the first exemplary structure after removal of a deposited conductive material from within the backside trench according to the first embodiment of the present disclosure.
Figure 11B:
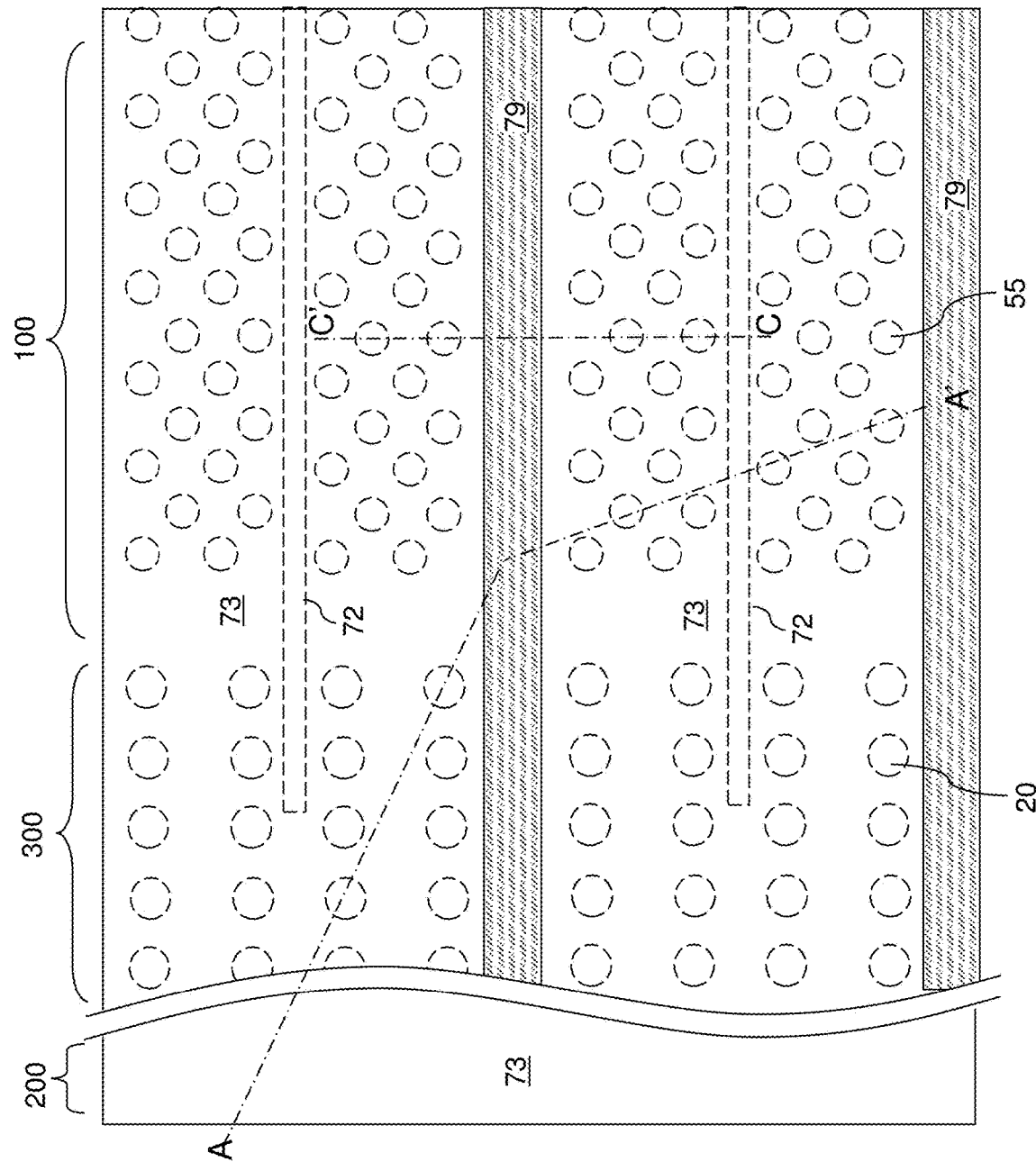
FIG. 11B is a partial see-through top-down view of the first exemplary structure of FIG. 11A. The vertical plane A-A' is the plane of the schematic vertical cross-sectional view of FIG. 11A.
Figure 11C:
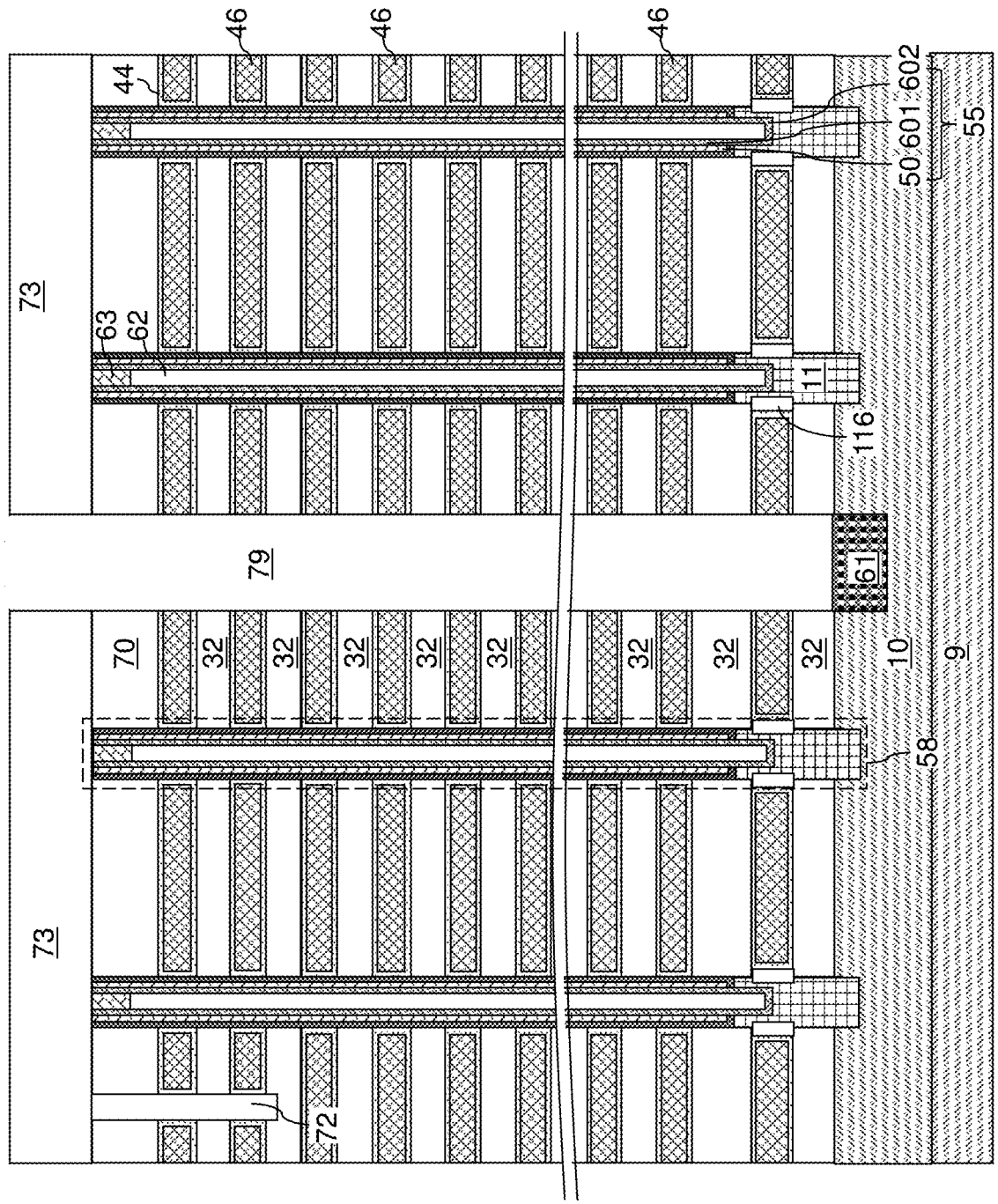
FIG. 11C is a vertical cross-sectional view of the first exemplary structure along the vertical plane C-C' of FIG. 11B.

Referring to FIGS. 11A-11C, the deposited metallic material of the continuous electrically conductive material layer 46L is etched back from the sidewalls of each backside trench 79 and from above the buffer material layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46. In one embodiment, backside blocking dielectric layers 44 are formed at peripheral portions of the backside recesses 43, and the electrically conductive layers 46 are formed on a respective one of the backside blocking dielectric layers 44.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

An assembly is formed, which includes an alternating stack of spacer material layers 32 and electrically conductive layers 46 and memory stack structures 55 that extend through the in-process alternating stack (32, 42). Each of the memory stack structures 55 comprises a respective memory film 50 and a respective vertical semiconductor channel 60. Each of the electrically conductive layers 46 can laterally surround a plurality of memory stack structures 55. As such, each of the electrically conductive layers 46 can comprise cylindrical openings having sidewalls that contact cylindrical outer sidewalls of a respective backside blocking dielectric layer 44, a top surface adjoined to upper peripheries of the cylindrical openings and contacting a bottom surface of an upper horizontally-extending portion of the respective backside blocking dielectric layer 44, and a bottom surface adjoined to lower peripheries of the cylindrical openings and contacting a top surface of a lower horizontally-extending portion of the respective backside blocking dielectric layer 44.

Figure 12:
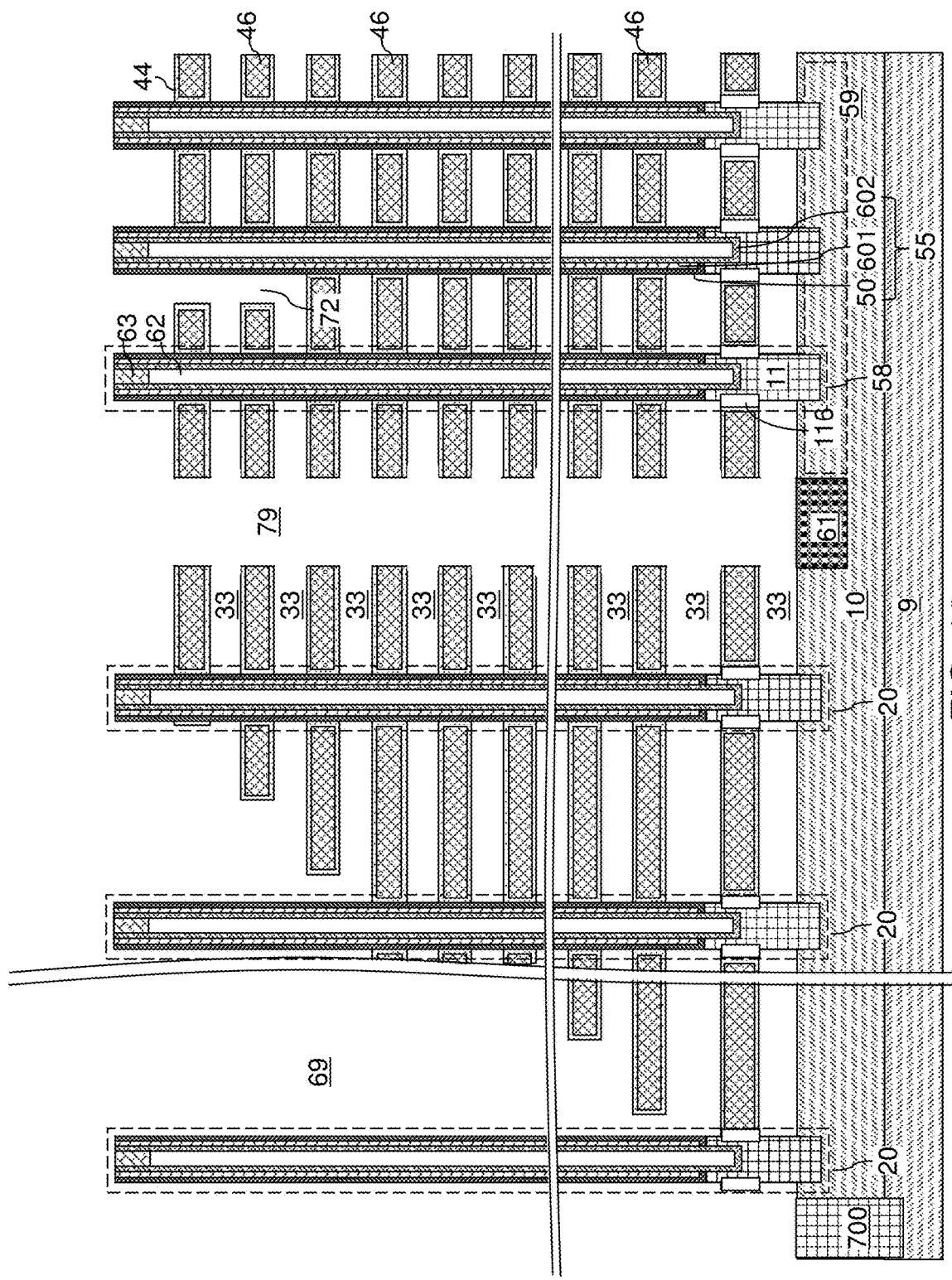
FIG. 12 is a vertical cross-sectional view of the first exemplary structure after removal of the spacer material layers, the cap spacer material layer, and the buffer material layer according to the first embodiment of the present disclosure.

Referring to FIG. 12, the spacer material layers 32, the cap spacer material layer 70, the buffer material layer 73, and optionally the retro-stepped spacer material portion 65 can be removed selective to the materials of the electrically conductive layers 46, the semiconductor material layer 10, the memory opening fill structures 58, and support pillar structures 20. If the retro-stepped spacer material portion 65 comprises a different material than the spacer material layers 32 and/or if an etch stop barrier layer is located between the retro-stepped spacer material portion 65 and the spacer material layers 32, then the retro-stepped spacer material portion 65 may be retained in the final device and not removed. Cavities are formed in volumes from which the spacer material layers 32, the cap spacer material layer 70, the buffer material layer 73, and optionally the retro-stepped spacer material portion 65 are removed. Interlayer cavities 33 can be formed in volumes from which the spacer material layers 32 are removed. Horizontal surfaces of the backside blocking dielectric layers 44 can be physically exposed to the interlayer cavities 33. The combination of the electrically conductive layers 46 and the backside blocking dielectric layers 44 can be structurally supported by the memory opening fill structures 58 and the support pillar structures 20.

In one embodiment, each of the electrically conductive layers 46 comprises: cylindrical openings having sidewalls that contact cylindrical outer sidewalls of a respective backside blocking dielectric layer 44; a top surface adjoined to upper peripheries of the cylindrical openings and contacting a bottom surface of an upper horizontally-extending portion of the respective backside blocking dielectric layer 44; and a bottom surface adjoined to lower peripheries of the cylindrical openings and contacting a top surface of a lower horizontally-extending portion of the respective backside blocking dielectric layer 44.

Referring to FIG. 13, a metal-containing precursor layer 130 can be formed on the physically exposed surfaces of the first exemplary structure. The metal-containing precursor layer 130 includes a metal-containing precursor material that forms a metal-organic framework (MOF) material upon exposure to a vapor of a linking compound (i.e., a linker precursor). The metal-containing precursor layer 130 can be formed by conformal deposition of the metal-containing precursor material in the interlayer cavities 33, in the backside trenches 79, and around the memory opening fill structures 58 and the support pillar structures 20. For example, a chemical vapor deposition process or an atomic layer deposition process can be employed to deposit the metal-containing precursor layer 130. In case the backside blocking dielectric layers 44 are present in the first exemplary structure, the metal-containing precursor layer 130 can be formed on the backside blocking dielectric layers 44.

Metal-organic frameworks (MOF's) are porous crystalline materials that are formed by linking inorganic and organic units with strong bonds in a structure that forms a cavity having dimensions greater than the size of an individual atom. MOF's can be coordination polymers that include metal ions or clusters that are coordinated to organic ligands to form a porous three-dimensional structure. Each metal ion or cluster is connected to at least a bidentate organic ligand (i.e., two or more ligands). The organic ligands form a coordination network containing voids around the metal ions or clusters. Over 20,000 different types of MOFs have been reported. MOFs are dielectric materials and typically have a low dielectric constant, which may be in a range from 1.7 to 2.6.

Methods for forming MOF's have been disclosed in recently published articles such as M. Krishtab et al., *Vapor-deposited zeolitic imidazolate frameworks as gap-filling ultra-low-k dielectrics*, Nature Communications, 10:3729 (2019); T. Stassin, *Vapour-phase deposition of oriented copper dicarboxylate metal-organic framework thin films*, Chem Commun, 2019 Sep. 4; 55(68):10056-10059; and E. Perez, *Origins and Evolution of Inorganic-Based and MOF-Based Mixed-Matrix Membranes for Gas Separations*, Processes 4(3):32, September 2016, the entire contents of which are incorporated herein by reference. In such methods, a metal-containing precursor material is deposited and is subsequently converted into a MOF material upon reaction with a linker precursor vapor.

According to an aspect of the present disclosure, the metal-containing precursor layer 130 is formed by a highly conformal deposition process such as a chemical vapor deposition process or an atomic layer deposition process in the interlayer cavities 33 between the electrically conductive layers 46. Thus, the metal-containing precursor layer 130 is formed within the interlayer cavities 33, which are laterally-extending cavities that laterally surround a plurality of memory opening fill structures 58 containing a respective memory stack structure 55.

For example, the metal-containing precursor layer 130 can include, and/or can consist essentially of, an elemental metal, a metal oxide material, a metal nitride material, or a metal carbide material. In case the metal-containing precursor layer 130 includes an elemental metal, the metal-containing precursor layer 130 can include, and/or can consist essentially of, any metal that can form a MOF, such as titanium, molybdenum, copper, cobalt, zirconium, zinc, manganese, or ruthenium. In case the metal-containing precursor layer 130 includes a metal oxide material, the metal-containing precursor layer 130 can include, and/or can consist essentially of, titanium oxide, molybdenum oxide, copper oxide, cobalt oxide, zirconium oxide, zinc oxide, manganese oxide, or ruthenium oxide. In case the metal-containing precursor layer 130 includes a metal nitride material, the metal-containing precursor layer 130 can include, and/or can consist essentially of, titanium nitride, molybdenum nitride, copper nitride, cobalt nitride, zirconium nitride, zinc nitride, manganese nitride, or ruthenium nitride. In case the metal-containing precursor layer 130 includes a metal carbide material, the metal-containing precursor layer 130 can include, and/or can consist essentially of, titanium carbide, molybdenum carbide, copper carbide, cobalt carbide, zirconium carbide, zinc carbide, manganese carbide, or ruthenium carbide. The thickness of the metal-containing precursor layer 130 can be in a range from 2% to 25%, such as from 4% to 15% of the height of the interlayer cavities 33, such as 0.5 nm to 4 nm, including 1 nm to 2 nm. In one embodiment, the thickness of the metal-containing precursor layer 130 can be selected to subsequently generate enough MOF material that fills the entire volume of each interlayer cavity 33, such as 2 nm to 4 nm. In another embodiment, the thickness of the metal-containing precursor layer 130 can be selected to subsequently generate an amount of a MOF material that is insufficient to fill the entire volume of each interlayer cavity 33, such as 1 nm to 1.5 nm.

Figure 14A:
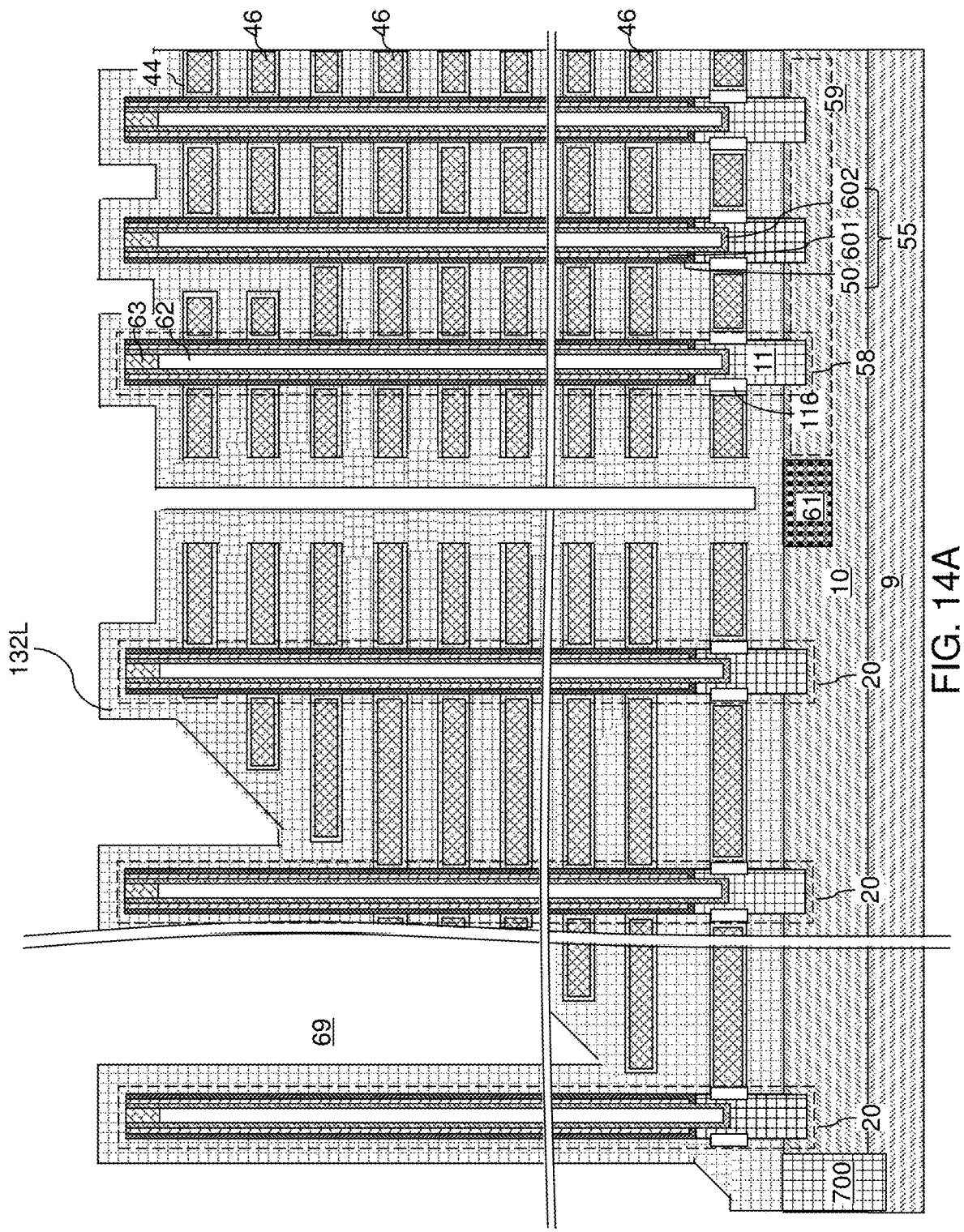
FIG. 14A is a vertical cross-sectional view of the first exemplary structure after formation of a metal-organic framework layer according to the first embodiment of the present disclosure.

Referring to FIGS. 14A and 14B, the exemplary structure is placed in a vacuum-tight reaction chamber. An oxidation process can be performed to convert the material of the metal-containing precursor layer 130 into a metal oxide material in case the metal-containing precursor layer 130 includes an elemental metal, a metal nitride, or a metal carbide. In case the metal-containing precursor layer 130 includes a metal oxide material, an oxidation process may be omitted.

The metal oxide material of the metal-containing precursor layer 130, or the metal oxide material derived from the metal-containing precursor layer 130, is exposed to a vapor of a linking compound (e.g., organic linking compound) that forms a metal-organic framework (MOF) material upon reaction. Any combination of a metallic material for the metal-containing precursor layer 130 and the vapor of the linking compound that is known to form a MOF material may be employed. Generally, the molecular species for the vapor of the linking compound can be selected based on the metallic material in the metal-containing precursor layer 130. For example, if the metal-containing precursor layer 130 includes zinc, a vapor of 1,4-benzodicarboxylate (e.g., 1,4-benzodicarboxylic acid) can be employed as the organic linker to form MOF-5, which includes $ZnO_4$ nodes and 1,4-benzodicarboxylic acid organic linkers that form the framework, that contains large pores between the structure of the framework. For example, if the metal-containing precursor layer 130 includes titanium (e.g., titanium dioxide), a vapor of 1,4-benzodicarboxylate (e.g., 1,4-benzodicarboxylic acid) can be employed as the organic linker to form MOF MIL-125, which includes titanium containing nodes and 1,4-benzodicarboxylic acid organic linkers that form the framework, that contains large pores between the structure of the framework.

A continuous metal-organic framework (MOF) layer 132L is formed by reaction of the metal-containing precursor layer 130 and the vapor of the linking compound. The metal-containing precursor layer 130 can be completely consumed during the optional oxidation process and subsequent conversion into the continuous MOF layer 132L. Various MOF materials can be formed depending on the composition of the metal-containing precursor layer 130. For example, if the metal-containing precursor layer 130 includes titanium, a titanium-based MOF, such as MIL-125 can be formed. If the metal-containing precursor layer 130 includes molybdenum, a molybdenum-based MOF, such as TUDMOF-1 can be formed. The composition of the MOF material portions depends on the composition of the metal-containing precursor layer 130 and the composition of the linking compound.

The continuous MOF layer 132L includes metal-organic framework (MOF) material portions that are formed by reacting the metal-containing precursor layer 130 with the vapor of the linking compound. Insulating layers including a respective MOF material portion is formed in the interlayer cavities 33. The MOF material portions comprise a metal-organic framework material including metal ions or clusters and organic ligands located between neighboring pairs of the metal ions or clusters. In one embodiment, the thickness of the metal-containing precursor layer 130 as formed at the processing steps of FIG. 13 can be selected such that the MOF material portions in the continuous MOF layer 132L fill the entirety of each interlayer cavity 33. In one embodiment, the thickness of the metal-containing precursor layer 130 as formed at the processing steps of FIG. 13 can be selected such that a vertically-extending cavity may be present within each backside trench 79. The MOF layer 132L is thicker than the metal-containing precursor layer 130.

Figure 15A:
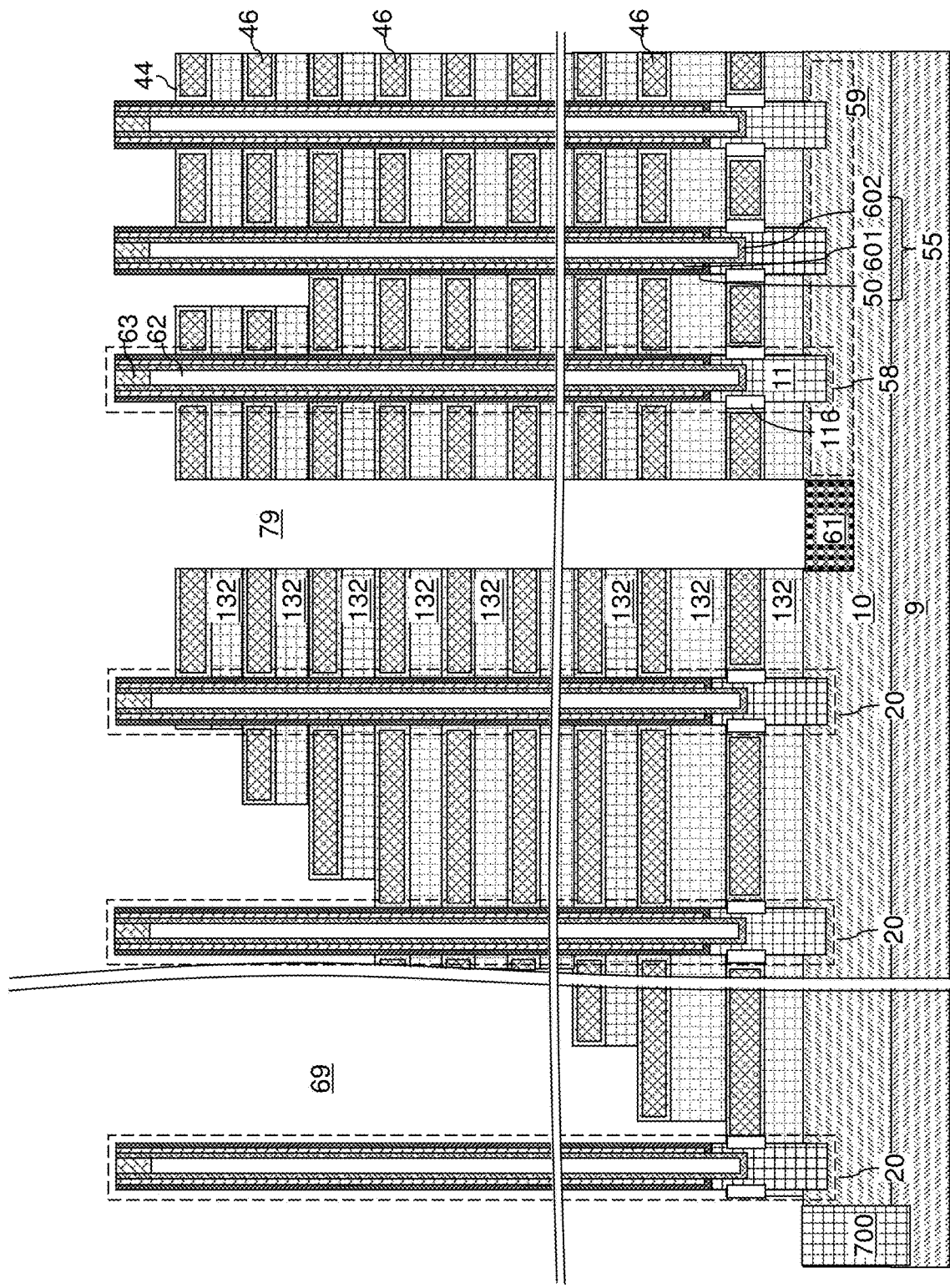
FIG. 15A is a vertical cross-sectional view of the first exemplary structure after formation of insulating layers including metal-organic framework portions by performing an anisotropic etch process according to the first embodiment of the present disclosure.
Figure 15B:
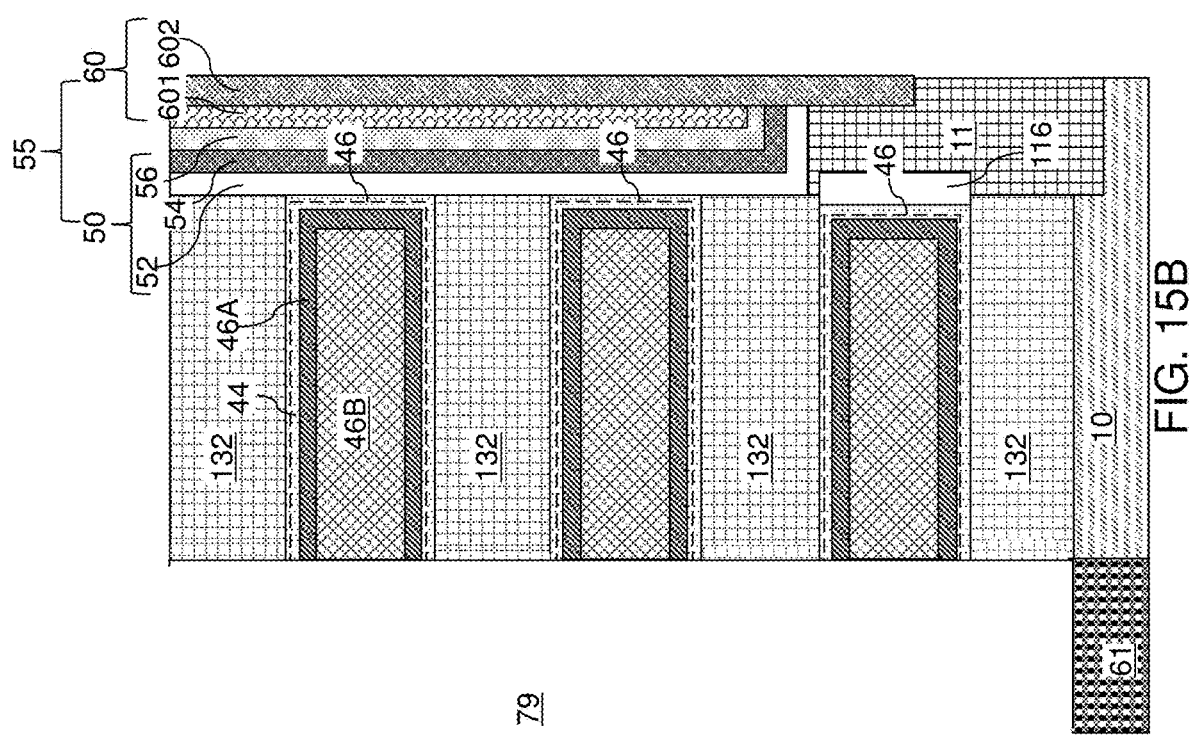
FIG. 15B is a vertical cross-sectional view of a region of the first exemplary structure of FIG. 15A.

Referring to FIGS. 15A and 15B, an anisotropic etch process can be performed to etch portions of the MOF material of the continuous MOF layer 132L that are not masked by an overlying structure. The anisotropic etch process can employ an etch chemistry that is selective for etching the MOF material relative to the materials of the backside blocking dielectric layer 44, the memory opening fill structures 58, the semiconductor material layer 10, and the at least one semiconductor device 700 (or a dielectric material portion that covers any such semiconductor device 700). The MOF material portions can be removed from above topmost surfaces of the backside blocking dielectric layers 44 and from inside the backside trenches 79. The continuous MOF layer 132L is divided into multiple discrete MOF layers 132. Each of the MOF layers 132 is located between a respective vertically neighboring pair of electrically conductive layers 46, or between the bottommost electrically conductive layers 46 and the semiconductor material layer 10. Each MOF layer 132 is an insulating layer.

A vertically alternating stack of insulating layers (comprising the MOF layers 132) and electrically conductive layers 46 is formed over a top surface of a substrate (9, 10). The insulating layers (comprising the MOF layers 132) and the electrically conductive layers 46 alternate along a vertical direction that is perpendicular to the top surface of the substrate (9, 10). Memory stack structures 55 extend through the alternating stack (132, 46). Each of the memory stack structures 55 comprises a respective memory film 50 and a respective vertical semiconductor channel 60. Each of the insulating layers (comprising the MOF layers 132) comprises a metal-organic framework (MOF) material portion. In one embodiment, each of the MOF material portions located between a vertically-neighboring pair of electrically conductive layers 46 can contact a respective set of two backside blocking dielectric layers 44 that are vertically spaced apart from each other.

In one embodiment, each of the memory films 50 comprises a tunneling dielectric layer 56 contacting a respective one of the vertical semiconductor channels 60 and a plurality of charge storage regions (comprising portions of a charge storage layer 54) located at levels of the electrically conductive layers 46. In one embodiment, the charge storage layer 54 is laterally spaced from the MOF material portions by a blocking dielectric layer 52 (which may be a silicon oxide and/or silicon oxynitride blocking dielectric layer) that continuously extends through multiple layers within the alternating stack (132, 46). In one embodiment, the tunneling dielectric layer 56 is laterally spaced from the MOF material portions by a combination of a respective charge storage layer 54 and a respective blocking dielectric layer. In one embodiment, each MOF material portion (comprising a respective MOF layer 132) that is located between a vertically-neighboring pair of electrically conductive layers 46 can be porous but free of any cavity (i.e., airgap) therein larger than the framework pores.

Figure 16:
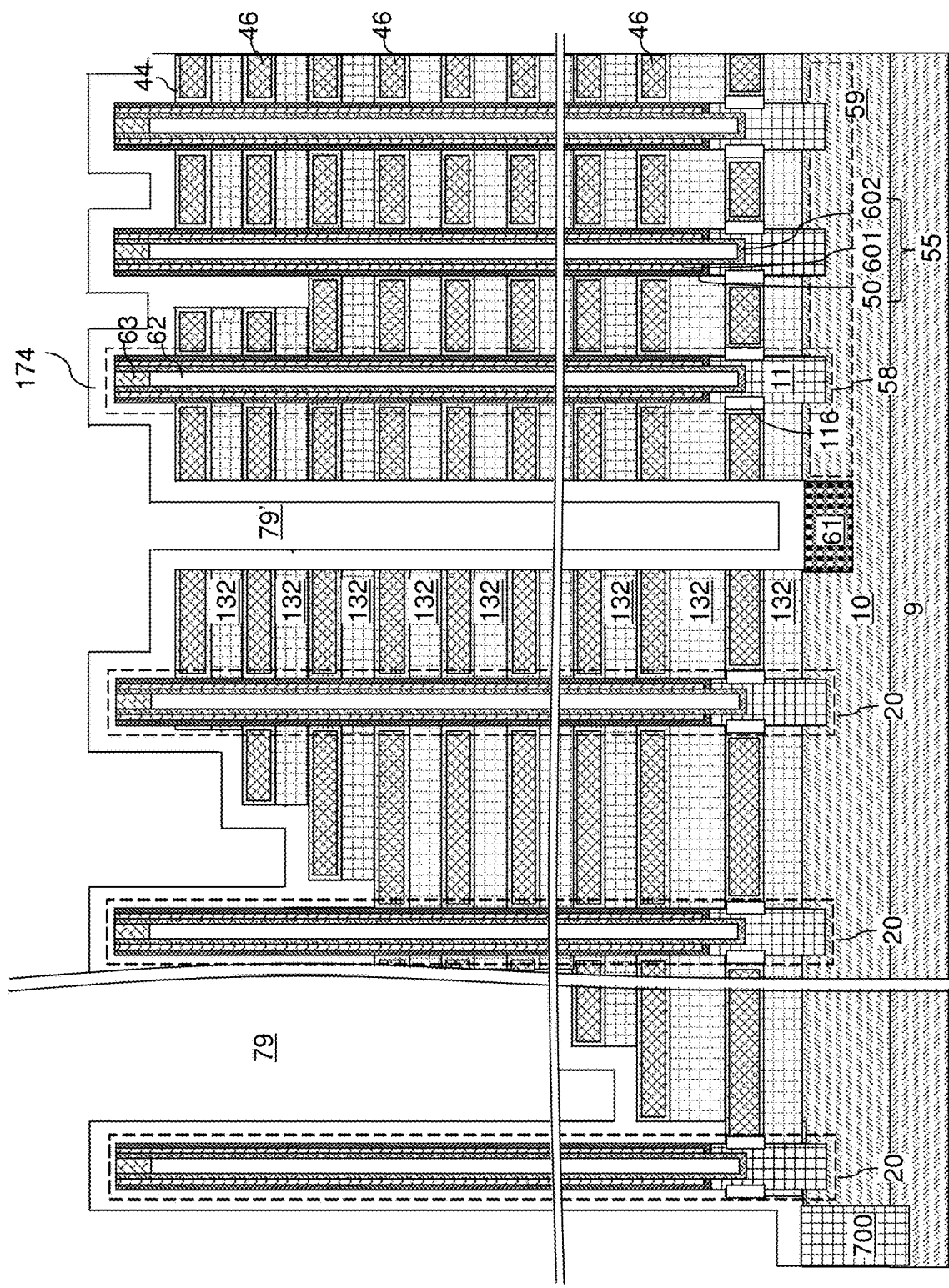
FIG. 16 is a vertical cross-sectional view of the first exemplary structure after formation of a continuous dielectric material layer according to the first embodiment of the present disclosure.

Referring to FIG. 16, an optional step is illustrated in which a continuous dielectric material layer 174 is deposited over the physically exposed surfaces of the first exemplary structure by a conformal deposition process or by a non-conformal deposition process. The continuous dielectric material layer 174 can include a non-porous dielectric material such as undoped silicate glass, a doped silicate glass, or organosilicate glass, or may include a porous material such as porous organosilicate glass. In one embodiment, the continuous dielectric material layer 174 can include a non-porous dielectric material such as undoped silicate glass or a doped silicate glass. The continuous dielectric material layer 174 may be deposited by a low pressure chemical vapor deposition (LPCVD) process or by a plasma-enhanced chemical vapor deposition process. The maximum thickness of the continuous dielectric material layer 174 can be less than one half of the width of each backside trench 79. Thus, a vertically-extending cavity may be present within each backside trench 79. For example, the maximum thickness of the continuous dielectric material layer 174 can be in a range from 30 nm to 300 nm, although lesser and greater thicknesses can also be employed.

Figure 17:
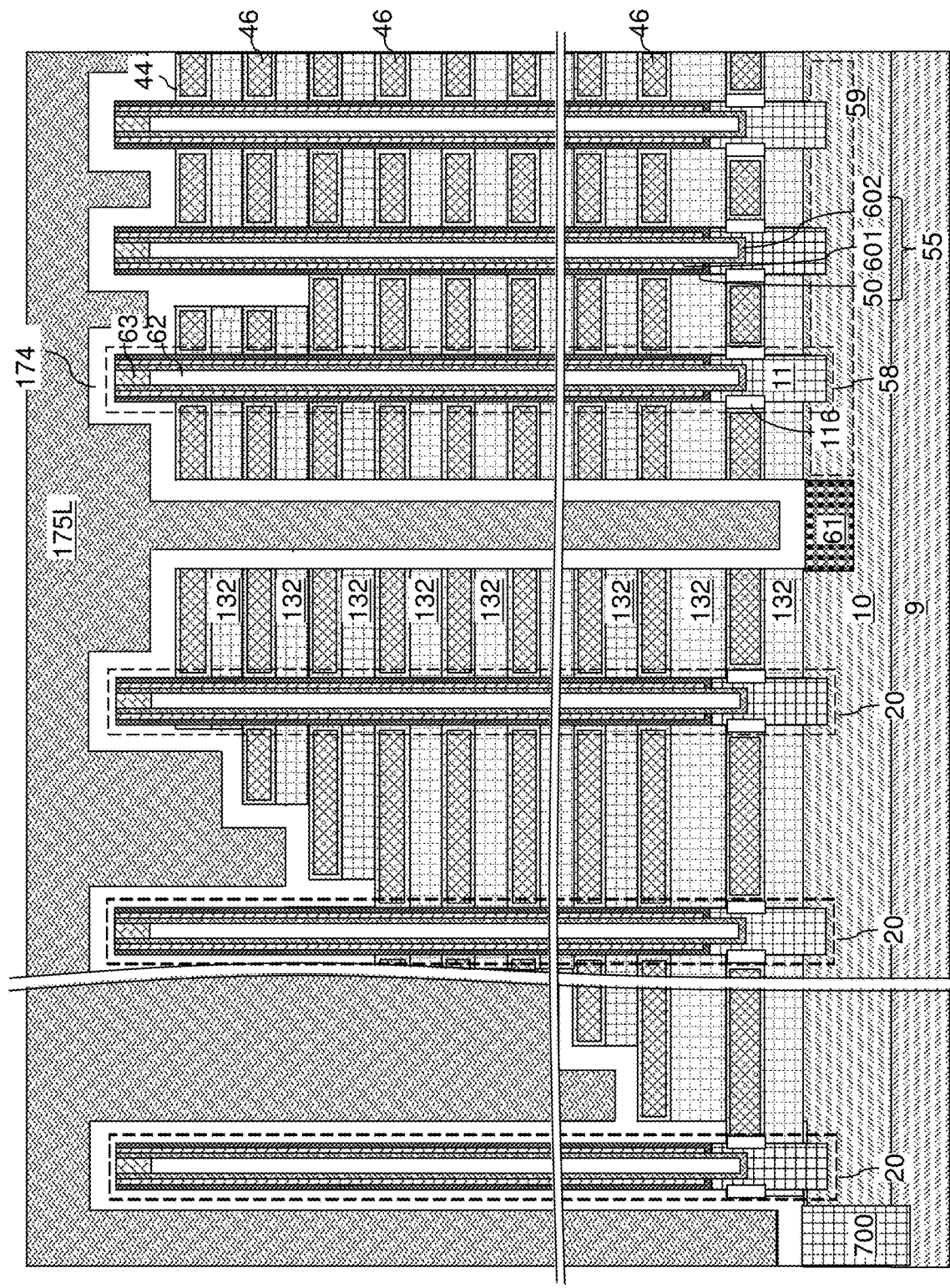
FIG. 17 is a vertical cross-sectional view of the first exemplary structure after formation of a sacrificial fill material layer according to the first embodiment of the present disclosure.

Referring to FIG. 17, an optional sacrificial fill material can be deposited in each vertically-extending cavity in the backside trenches 79, over the stepped surfaces of the continuous dielectric material layer 174 in the staircase region 300, and over the memory opening fill structures 58 and the support pillar structures 20 and the topmost electrically conductive layers 46. The sacrificial fill material includes a sacrificial material that can be subsequently removed selective to the material of the continuous dielectric material layer 174. For example, the sacrificial fill material can include a semiconductor material such as amorphous silicon or polysilicon. The sacrificial fill material can be planarized to provide a top surface that is vertically spaced from the topmost surfaces of the continuous dielectric material layer 174. For example, a chemical mechanical planarization (CMP) process or a recess etch process can be employed to planarize the sacrificial fill material. The planarized remaining portion of the optional sacrificial fill material is herein referred to as an optional sacrificial fill material layer 175L. The sacrificial fill material layer 175L may have a planar horizontal surface, or may have a top surface with topographical features.

Figure 18:
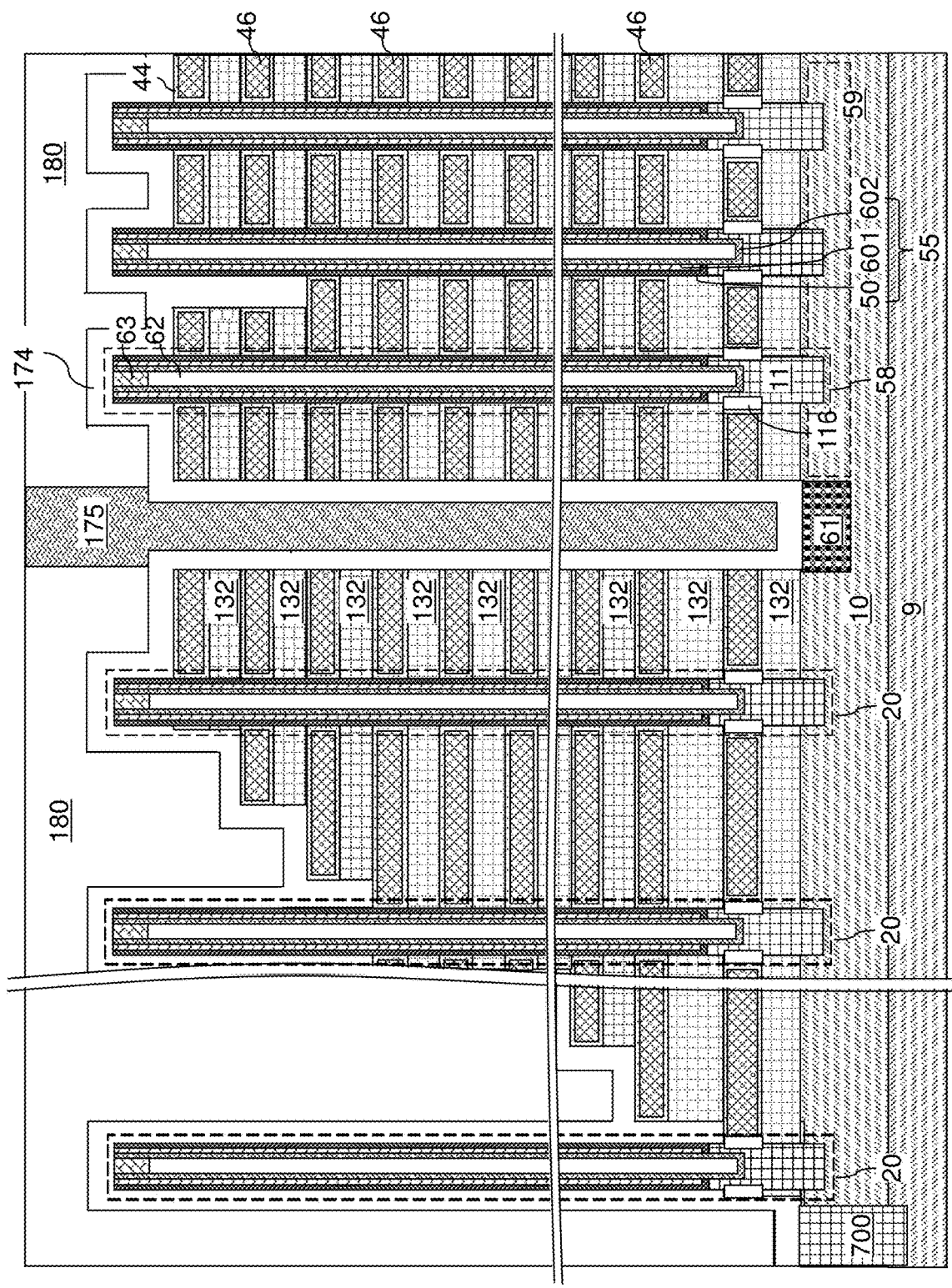
FIG. 18 is a vertical cross-sectional view of the first exemplary structure after formation of a planarization dielectric layer and a sacrificial trench fill structure according to the first embodiment of the present disclosure.

Referring to FIG. 18, a photoresist layer (not shown) can be applied over the sacrificial fill material layer 175L, and can be lithographically patterned to cover areas of the backside trenches 79. Unmasked portions of the sacrificial fill material layer 175L can be removed from outside the areas of the backside trenches 79 by an etch process, which may employ an isotropic etch process and/or an anisotropic etch process. The chemistry of the etch process can be selective to the material of the continuous dielectric material layer 174. For example, if the sacrificial fill material layer 175L includes a semiconductor material and if the continuous dielectric material layer 174 includes a silicon oxide material, the etch process can employ an etch chemistry that etches the semiconductor material selective to the silicon oxide material. The photoresist layer can be subsequently removed, for example, by ashing. Each remaining portion of the sacrificial fill material layer 175L is herein referred to as a sacrificial fill material portion 175. Each sacrificial fill material portion 175 can vertically extend into a respective backside trench 79, and can laterally extend along the lengthwise direction of the backside trenches 79.

A planarizable dielectric material can be deposited around, and above, the sacrificial fill material portions 175. The planarizable dielectric material may include a self-planarizing dielectric material such as flowable oxide (FOX), or may include undoped silicate glass or a doped silicate glass. The planarizable dielectric material can be planarized, for example, by chemical mechanical planarization (CMP) to remove portions located above the horizontal plane including the top surfaces of the sacrificial fill material portions 175. The remaining portion of the planarizable dielectric material comprises a planarization dielectric layer 180. The planarization dielectric layer 180 can have a horizontal top surface that extends across the entirety of the memory array region 100, the staircase region 300, and the peripheral device region 200. Top surfaces of the sacrificial fill material portions 175 can be coplanar with the horizontal top surface of the planarization dielectric layer 180.

Figure 19:
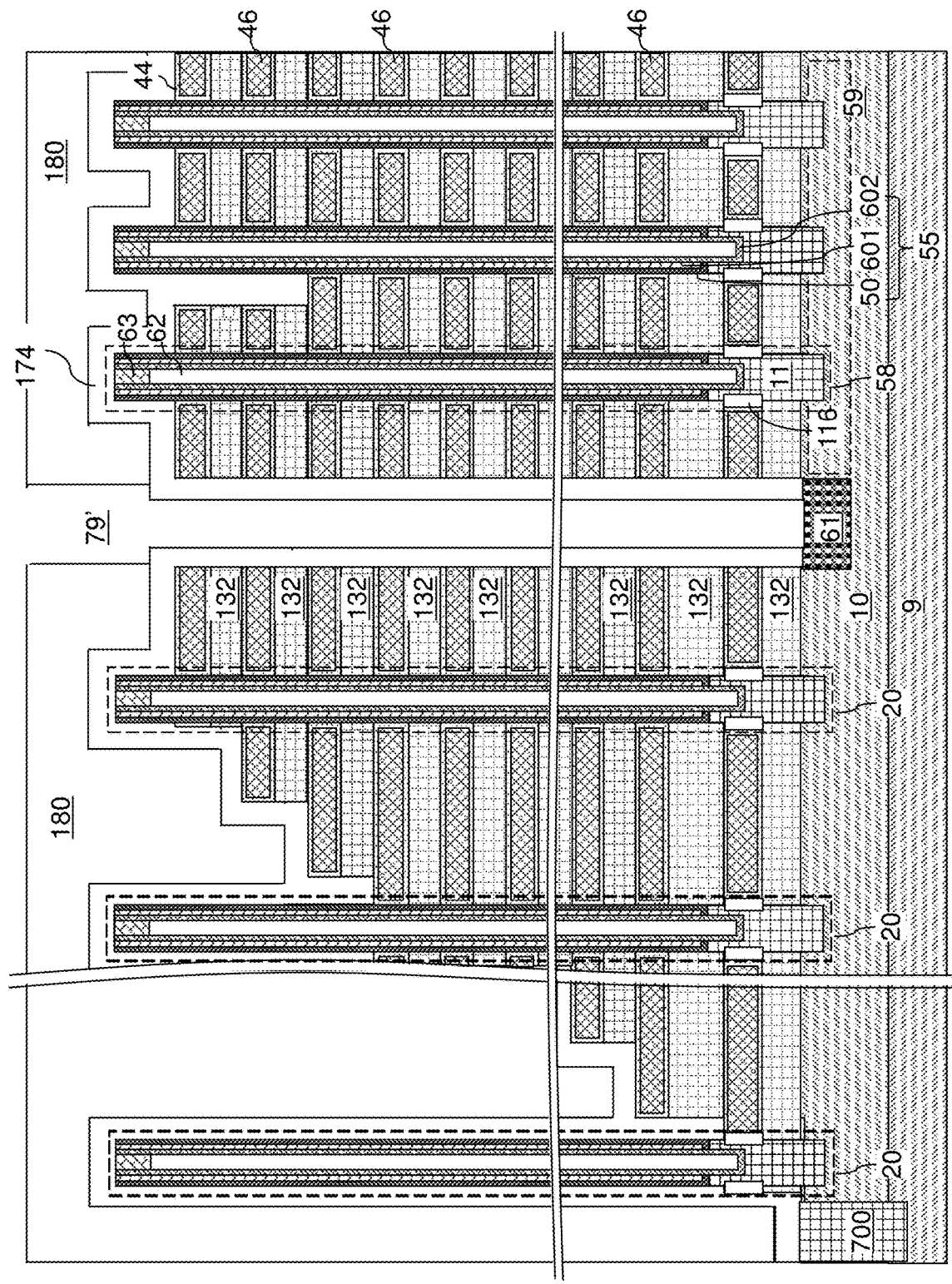
FIG. 19 is a vertical cross-sectional view of the first exemplary structure after formation of backside cavities according to the first embodiment of the present disclosure.

Referring to FIG. 19, the sacrificial fill material portions 175 can be removed selective to the material of the planarization dielectric layer 180 and the continuous dielectric material layer 174. If the sacrificial fill material portions 175 include a semiconductor material such as amorphous silicon, a wet etch process employing hot trimethyl-2 hydroxyethyl ammonium hydroxide ("hot TMY") or tetramethyl ammonium hydroxide (TMAH) may be performed to remove the sacrificial fill material portions 175 selective to the materials of the planarization dielectric layer 180 and the continuous dielectric material layer 174. Subsequently, an anisotropic etch process can be performed to remove the bottommost portions of the continuous dielectric material layer 174 that overlie the source regions 61. A backside cavity can be formed within each backside trench 79.

Figure 20A:
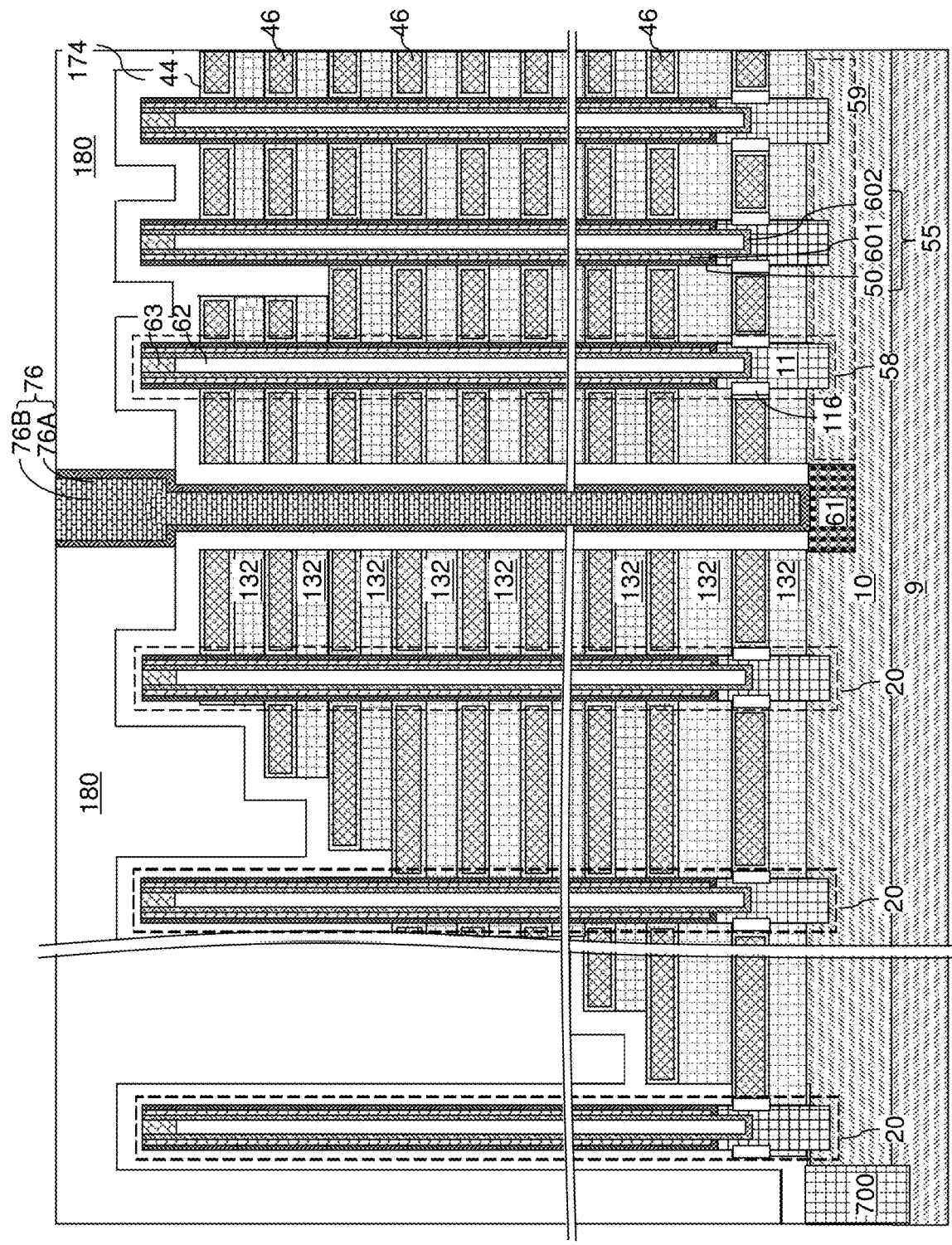
FIG. 20A is a vertical cross-sectional view of the first exemplary structure after formation of a backside contact via structures according to the first embodiment of the present disclosure.

Referring to FIGS. 20A and 20B, a backside contact via structure 76 can be formed within each backside cavity. Each contact via structure 76 can fill a respective backside cavity. The contact via structures 76 can be formed by depositing at least one conductive material in the unfilled volume (i.e., the backside cavity) of the backside trenches 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof. The at least one conductive material can be planarized employing the planarization dielectric layer 180 overlying the alternating stack (132, 46) as a stopping layer. If chemical mechanical planarization (CMP) process is employed, the planarization dielectric layer 180 can be employed as a CMP stopping layer. Each remaining continuous portion of the at least one conductive material in the backside trenches 79 constitutes a backside contact via structure 76. The backside contact via structures 76 extends through the alternating stacks (132, 46), and contacts a top surface of a respective source region 61.

In an alternative embodiment, the retro-stepped spacer material portion 65 is not removed during the etching step shown in FIG. 12. In this alternative embodiment, the steps shown in FIGS. 16 to 18 are omitted, and the continuous dielectric material layer 174 is formed in the backside trenches 79 and over the retro-stepped spacer material portion 65, followed by etching the continuous dielectric material layer 174 as shown in FIG. 19, followed by forming the backside contact via structures 76 in the backside trenches 79 over the continuous dielectric material layer 174 as shown in FIGS. 20A and 20B.

Figure 21A:
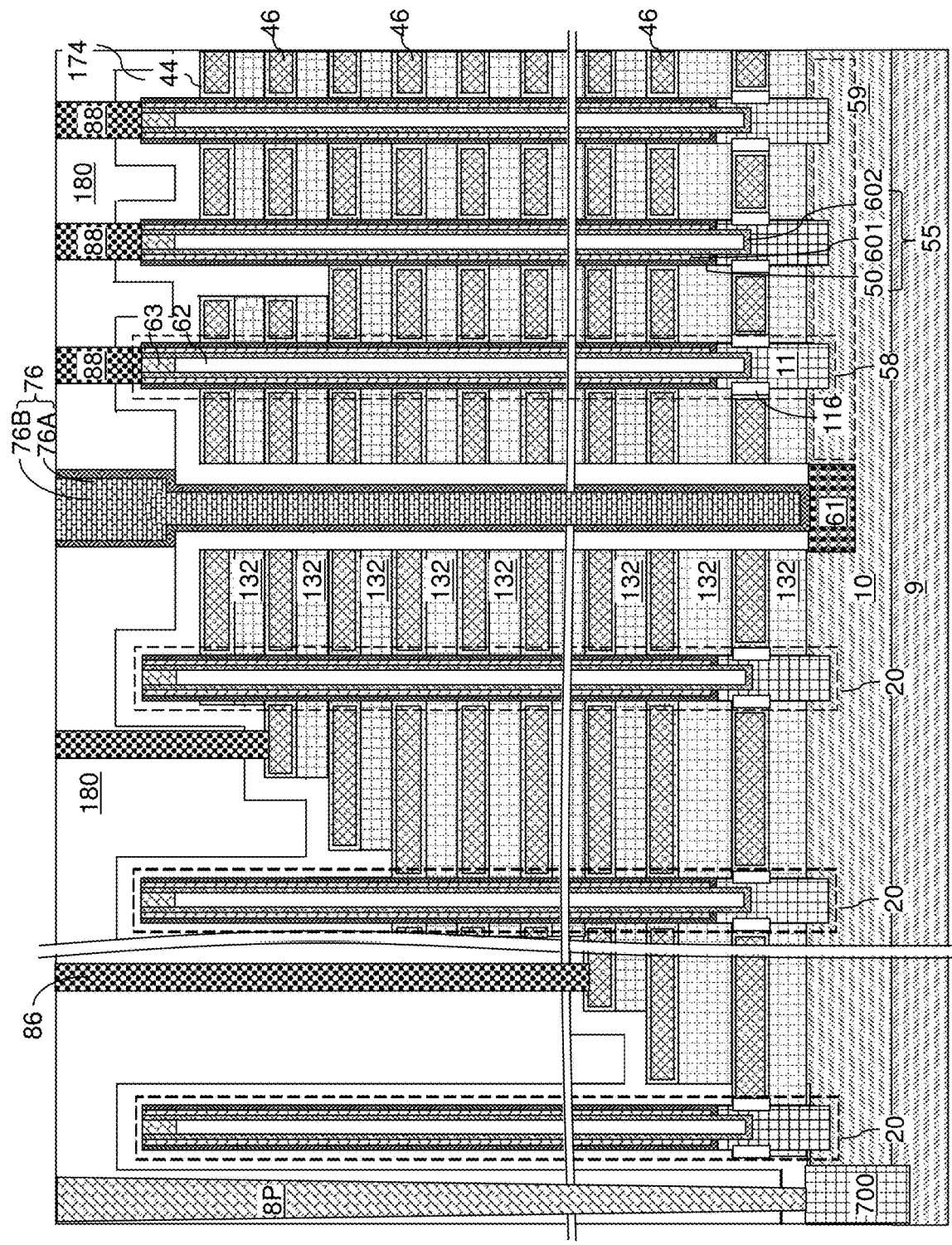
FIG. 21A is a schematic vertical cross-sectional view of the first exemplary structure after formation of additional contact via structures according to an embodiment of the present disclosure.
Figure 21B:
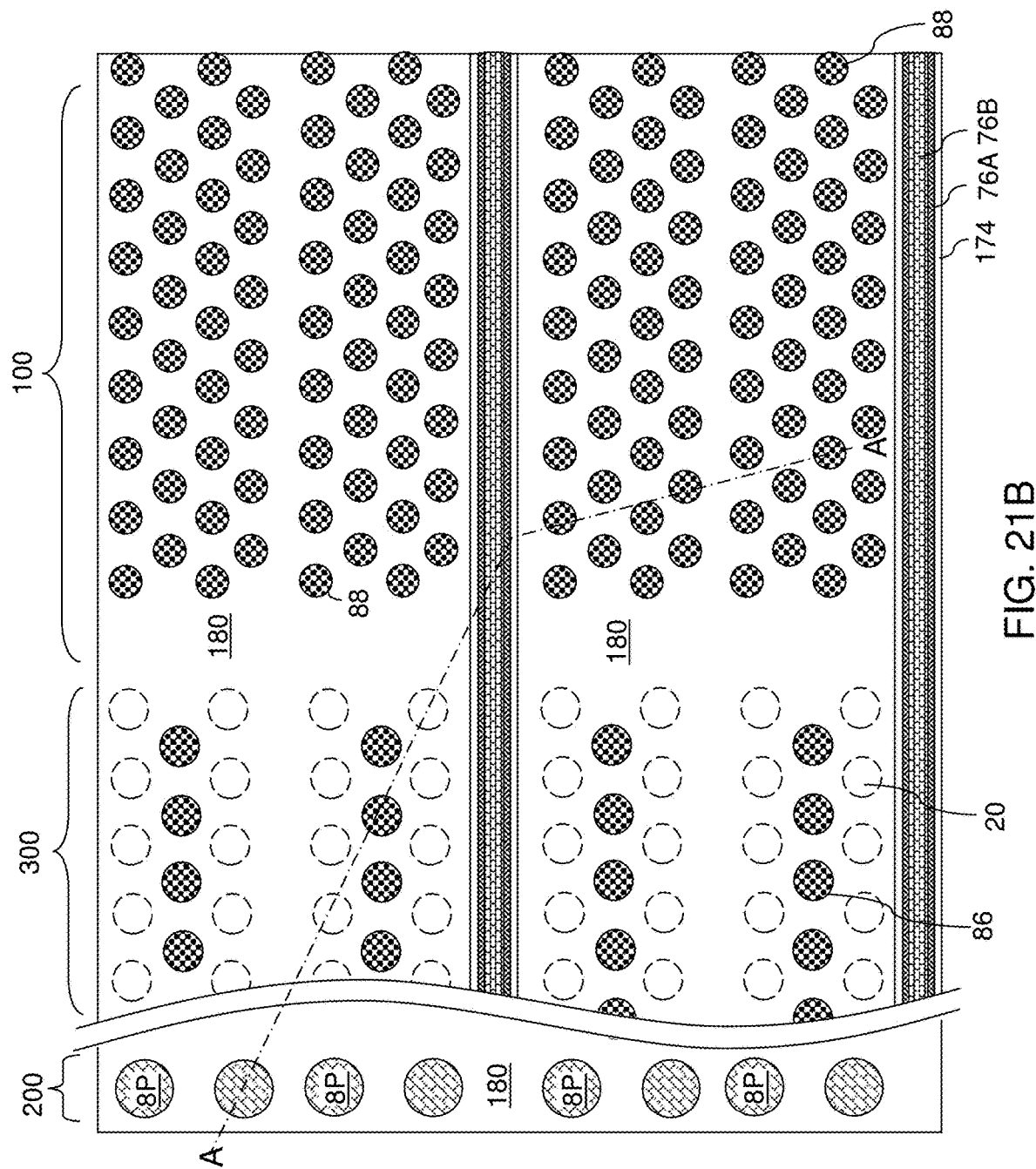
FIG. 21B is a top-down view of the first exemplary structure of FIG. 21A. The vertical plane A-A' is the plane of the schematic vertical cross-sectional view of FIG. 21A.

Referring to FIGS. 21A and 21B, additional contact via structures (88, 86, 8P) can be formed through the planarization dielectric layer 180 and the continuous dielectric material layer 174. For example, drain contact via structures 88 can be formed on each drain region 63. Word line contact via structures 86 can be formed on the electrically conductive layers 46. Peripheral device contact via structures 8P can be formed directly on respective nodes of the peripheral devices, which can be semiconductor devices 700 located in the peripheral device region 200.

Referring to FIG. 22A, an alternative embodiment of the first exemplary structure is illustrated at a processing step that corresponds to the processing steps of FIGS. 14A and 14B. The alternative embodiment of the first exemplary structure can be derived from the first exemplary structure by reducing the thickness of the metal-containing precursor layer 130 (e.g. 1 nm to 1.5 nm), thereby reducing the thickness of the MOF material portions in the continuous MOF layer 132L. Specifically, the thickness of the metal-containing precursor layer 130 formed at the processing steps of FIG. 13 can be reduced such that the volume of the MOF material portions in the continuous MOF layer 132L is insufficient to fill the entire volume of each interlayer cavity 33. Thus, voids are present within the volumes of the interlayer cavities 33 after formation of the continuous MOF layer 132L. The height of each void within a volume of an interlayer cavity 33 can be in a range from 1% to 90% of the height of the respective interlayer cavity 33 (e.g., 0.5 nm to 2 nm).

Referring to FIG. 22B, a continuous dielectric material layer 174 can be deposited over the continuous MOF layer 132L by a non-conformal deposition process. The continuous dielectric material layer 174 can include a non-porous dielectric material such as undoped silicate glass, a doped silicate glass, or organosilicate glass, or may include a porous material such as porous organosilicate glass. In one embodiment, the continuous dielectric material layer 174 can include a non-porous dielectric material such as undoped silicate glass or a doped silicate glass. In one embodiment, the continuous dielectric material layer 174 can be deposited by a plasma-enhanced chemical vapor deposition process. The maximum thickness of the continuous dielectric material layer 174 can be less than one half of the width of each backside cavity 79' as provided at the processing steps of FIG. 22A. Thus, a vertically-extending cavity may be present within each backside trench 79. For example, the maximum thickness of the continuous dielectric material layer 174 can be in a range from 30 nm to 250 nm, although lesser and greater thicknesses can also be employed.

The non-conformal nature of the deposition process that forms the continuous dielectric material layer 174 induces deposition of a lesser amount of material in portions of the voids at the levels of the interlayer cavities 33 that are distal from the backside trenches 79 than in portions of the voids at the levels of the interlayer cavities 33 that are proximal to the backside trenches 79. The differential deposition rate within each void enclosed by a respective portion of the continuous MOF layer 132L causes accumulation of a deposited dielectric material at an opening of each void adjacent to a respective backside trench 79, and causes formation of an encapsulated cavity (i.e., airgap) 139 that is free of any solid material therein (and is free of any liquid material therein). Each encapsulated cavity 139 can be entirely encapsulated by the continuous MOF layer 132L and the continuous dielectric material layer 174. Each portion of the continuous MOF layer 132L located between the electrically conductive layers 46 comprise a MOF layer 132. Thus, each MOF material portion located between a vertically-neighboring pair of electrically conductive layers 46 can surround at least one encapsulated cavity 139 that is free of any solid material therein.

Figure 22C:
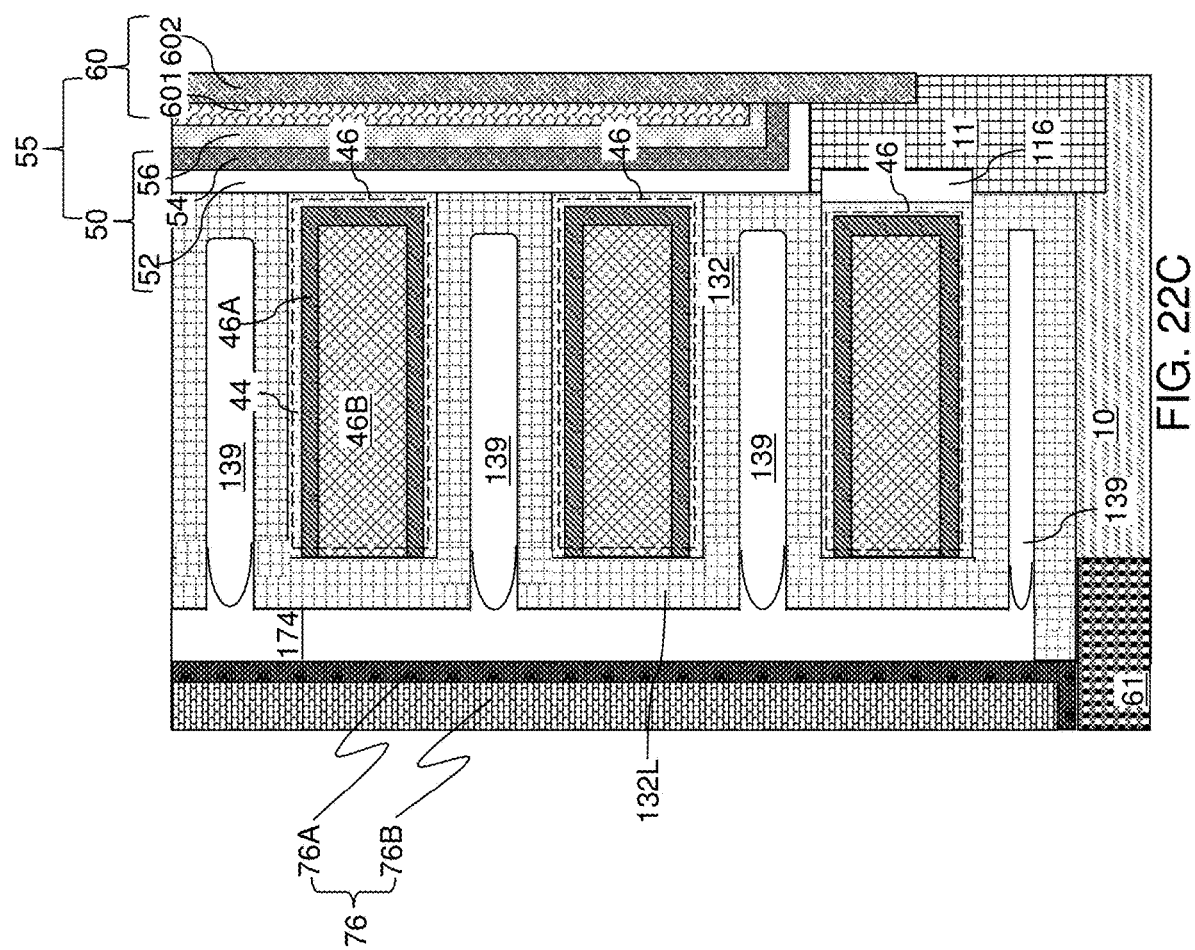

Referring to FIG. 22C, the processing steps of FIGS. 17, 18, 19, 20A and 20B, and 21A and 21B can be performed to form backside contact via structures 76 and additional contact via structures (86, 88, 8P).

Referring to FIG. 23A, a second exemplary structure according to a second embodiment of the present disclosure can be derived from the first exemplary structure illustrated in FIGS. 4A and 4B by forming a different set of elements for each memory opening fill structure 58 and for each support pillar structure. The memory opening 49 illustrated in FIG. 23A can be the same as the memory opening in FIG. 5A with optional adjustments in the lateral dimension of the memory opening 49. For example, the memory opening 49 illustrated in FIG. 23A can have a lateral dimension (such as a diameter) that is less than the lateral dimension of the memory opening of FIG. 5A by twice the sum of the thickness of the blocking dielectric layer 52 and the thickness of the charge storage layer 54 of the first embodiment.

Referring to FIG. 23B, the processing steps of FIG. 5B can be performed to form a pedestal channel portion 11 within each memory opening 49.

Referring to FIG. 23C, an isotropic etch process can be performed to laterally recess the sidewalls of the sacrificial material layers 42 selective to the spacer material layers 32. In an illustrative example, if the spacer material layers 32 include silicon oxide and if the sacrificial material layers 42 include silicon nitride, a wet etch process employing hot phosphoric acid may be employed for the isotropic etch process. The memory opening 49 includes a vertical stack of lateral recesses, each of which has a tubular volume. The lateral recess distance by which sidewalls of the sacrificial material layers 42 are recessed around each memory opening 49 can be in a range from 8 nm to 20 nm, although lesser and greater lateral recess distances can also be employed.

Referring to FIG. 23D, blocking dielectric layers 152 can be formed on the sidewalls of the sacrificial material layers 42 around each memory opening 49 and around each support opening. For example, if the sacrificial material layers 42 include silicon nitride, an oxidation process can be performed to convert a cylindrical surface portion of each sacrificial material layer 42 into a blocking dielectric layer 152 comprising silicon oxide and/or silicon oxynitride having a tubular configuration. Each blocking dielectric layer 152 can have the same height as the sacrificial material layer 42 that the blocking dielectric layer 152 contacts. A vertical stack of blocking dielectric layers 152, each having a respective tubular shape, can be formed around each memory opening 49. The thickness of each blocking dielectric layer 152 can be in a range from 3 nm to 15 nm, although lesser and greater thicknesses can also be employed. A semiconductor oxide portion that is formed collaterally on a top surface of the pedestal channel portion 11 can be removed, for example, by performing an anisotropic etch process.

Referring to FIG. 23E, a memory material can be deposited in remaining volumes of the lateral recesses. The memory material may include a charge storage material such as silicon nitride, or may include a floating gate material such as a metallic material or a heavily doped semiconductor material. The memory material can be deposited employing a conformal deposition process such as a low pressure chemical vapor deposition (LPCVD) process. An anisotropic etch process can be performed to remove portions of the memory material located within a cylindrical vertical plane including sidewalls of the spacer material layers 32 around the memory opening 49. Remaining portions of the memory material located within volumes of the lateral recesses comprise memory elements 154. Each of the memory elements 154 can have a tubular shape. The memory elements 154 can be charge storage material portions (such as silicon nitride material portions) or floating gate structures (such as metallic material portions or doped semiconductor material portions).

Referring to FIG. 23F, a tunneling dielectric layer 56 and a first semiconductor channel layer 601 can be formed by a respective conformal deposition process. The processing steps of FIG. 5C can be employed to deposit the tunneling dielectric layer 56 and the first semiconductor channel layer 601.

Referring to FIG. 23G, an anisotropic etch process can be performed to etch horizontal portions of the first semiconductor channel layer 601 and the tunneling dielectric layer 56. The pedestal channel portion 11 or the semiconductor material layer 10 (in case a pedestal channel portion is not present in the memory opening 49) can be vertically recessed by the anisotropic etch process. The set of all blocking dielectric layers 152, all memory elements 154, and the tunneling dielectric layer 56 within a memory opening 49 constitutes a memory film 50.

Referring to FIG. 23H, a second semiconductor channel layer 602 can be conformally deposited, for example, by performing the processing steps of FIG. 5E.

Referring to FIG. 23I, a dielectric core layer 62L can be deposited in the unfilled volume of the memory opening 49 and over a horizontal portion of the second semiconductor channel layer 602.

Referring to FIG. 23J, a dielectric core 62 can be formed within each memory opening 49 by vertically recessing the material of the dielectric core layer 62L selective to the material of the second semiconductor channel layer 602.

Figure 23K:
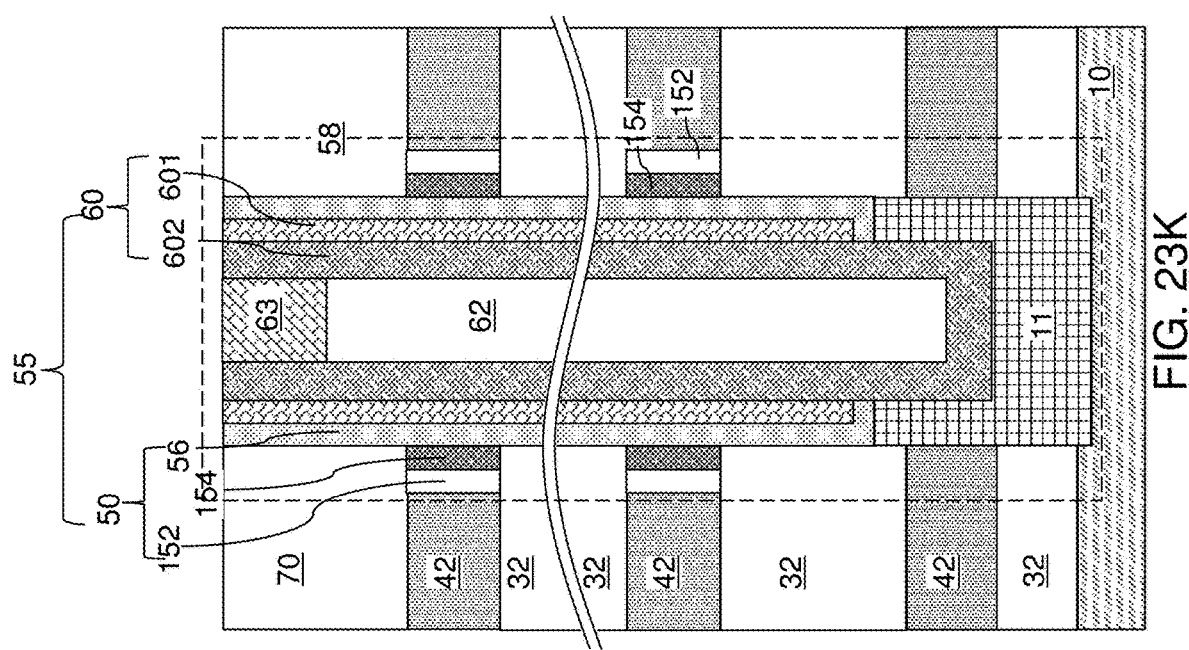

Referring to FIG. 23K, a doped semiconductor material having a doping of the second conductivity type can be deposited in the vertical recess overlying the dielectric core 62. Portions of the doped semiconductor material and the second semiconductor channel layer 602 that overlie the horizontal plane including the top surface of the cap spacer material layer 70 can be removed by a planarization process such as a recess etch process and/or a chemical mechanical planarization (CMP) process. Each remaining portion of the doped semiconductor material constitutes a drain region 63.

The combination of the first semiconductor channel layer 601 and the second semiconductor channel layer 602 within the memory opening 49 constitutes a vertical semiconductor channel 60. The combination of the vertical semiconductor channel 60 and the memory film 50 constitutes a memory stack structure 55. The combination of all material portions fill a memory opening 49 constitutes a memory opening fill structure 58.

Referring to FIG. 24A, the processing steps of FIGS. 7A and 7B, 8, 9A-9D, 10, 11A-11C, 12A and 12B, 13, and 14A and 14B can be performed to form a continuous MOF layer 132L.

Figure 24B:
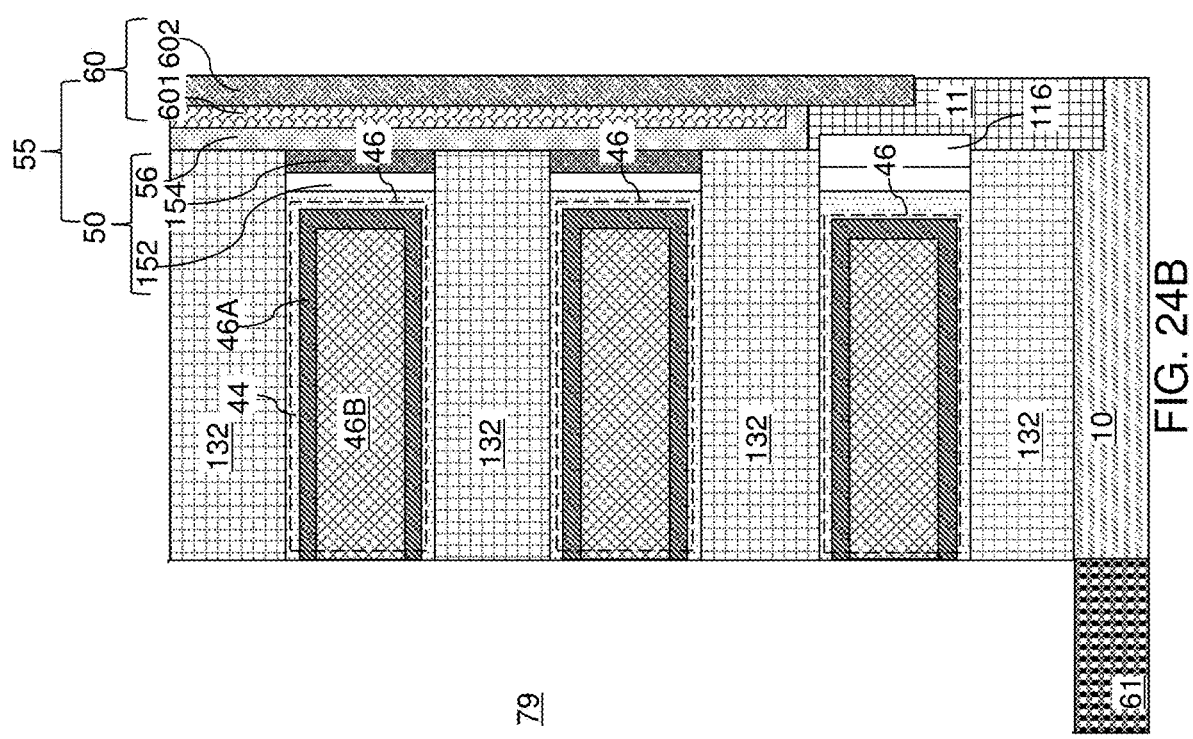

Referring to FIG. 24B, the processing steps of FIGS. 15A and 15B can be performed to remove portions of the continuous MOF layer 132L that are not covered by an overlying structure. The anisotropic etch process divides the continuous MOF layer 132L into a plurality of discrete MOF layers 132 located within a respective one of the interlayer cavities 33.

Referring to FIG. 24C, the processing steps of FIG. 16 can be performed to form a continuous dielectric material layer 174. A conformal dielectric material deposition or a non-conformal dielectric material deposition may be employed to form the continuous dielectric material layer 174.

Figure 24D:
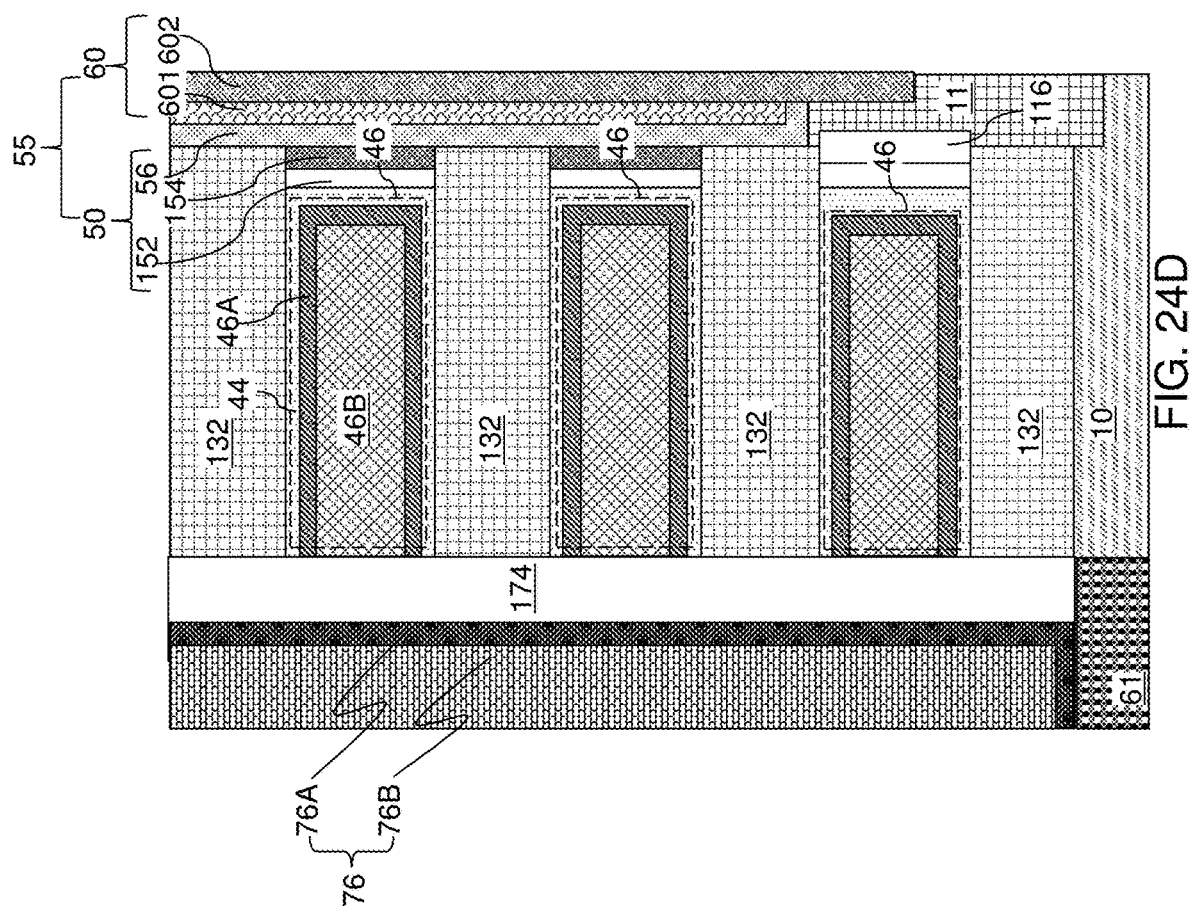

Referring to FIG. 24D, the processing steps of FIGS. 17, 18, 19, 20A and 20B, and 21A and 21B can be performed to form backside contact via structures 76 and additional contact via structures (86, 88, 8P).

Each of the MOF material portions (comprising the MOF layers 132) located between a vertically-neighboring pair of electrically conductive layers 46 can contact a respective set of two backside blocking dielectric layers 44 that are vertically spaced apart from each other. In one embodiment, each of the memory films 50 comprises a tunneling dielectric layer 56 contacting a respective one of the vertical semiconductor channels 60 and a plurality of discrete memory elements 154 located at levels of the electrically conductive layers 46. The tunneling dielectric layer 56 is in contact with a plurality of MOF material portions comprising the MOF layers 132. Each MOF material portion located between a vertically-neighboring pair of electrically conductive layers 46 can be free of any cavity (i.e., airgap) therein. In one embodiment, the plurality of charge storage regions can comprise a vertical stack of memory elements 154 (which may be discrete charge storage regions or floating gate structures) that do not contact one another and are in contact with a respective set of two MOF material portions of the MOF material portions.

Figure 25A:
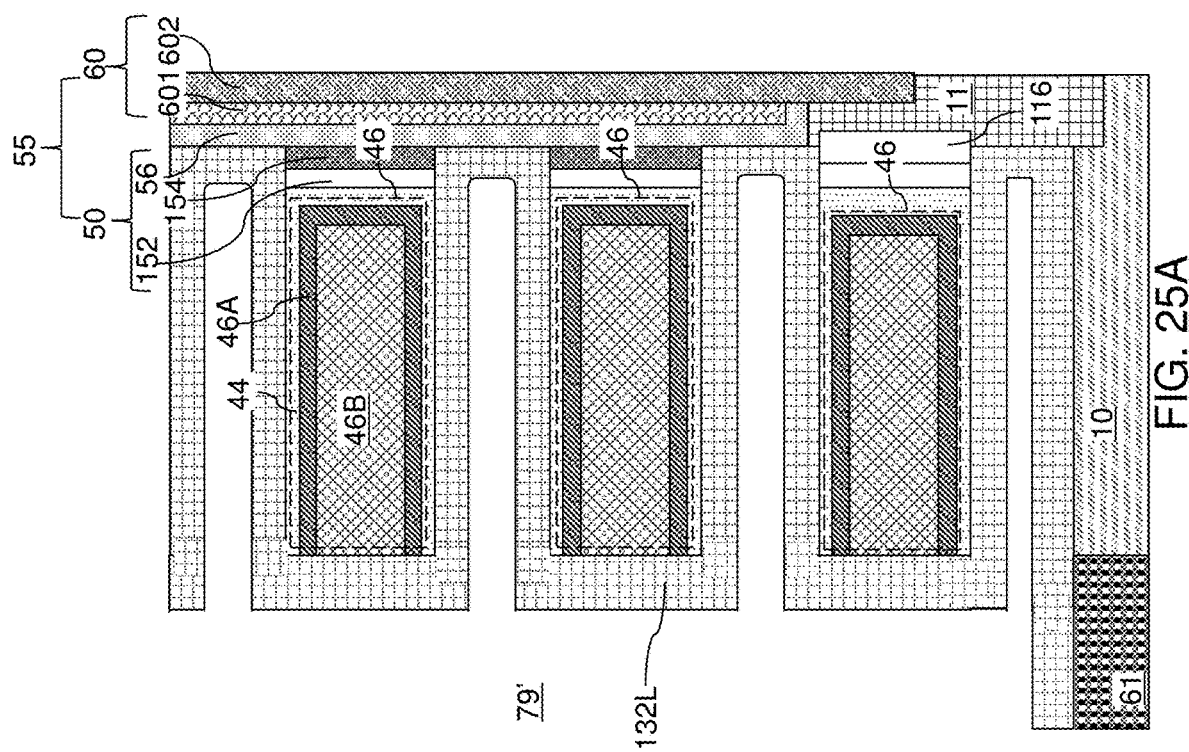

Referring to FIG. 25A, an alternative embodiment of the second exemplary structure is illustrated at a processing step that corresponds to the processing steps of FIG. 24A. The alternative embodiment of the second exemplary structure can be derived from the second exemplary structure by reducing the thickness of the metal-containing precursor layer 130, thereby reducing the thickness of the MOF material portions in the continuous MOF layer 132L. Specifically, the thickness of the metal-containing precursor layer 130 can be reduced such that the volume of the MOF material portions in the continuous MOF layer 132L is insufficient to fill the entire volume of each interlayer cavity 33. Thus, voids are present within the volumes of the interlayer cavities 33 after formation of the continuous MOF layer 132L. The height of each void within a volume of an interlayer cavity 33 can be in a range from 1% to 90% of the height of the respective interlayer cavity 33.

Figure 25B:
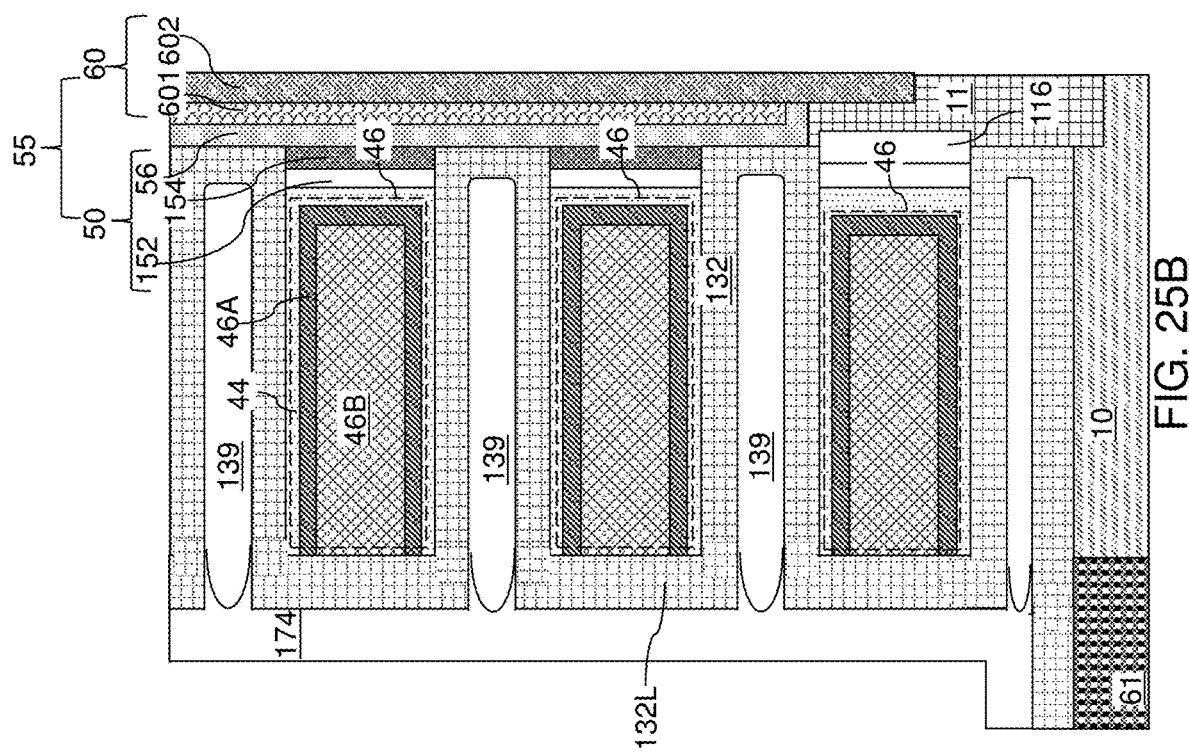

Referring to FIG. 25B, a continuous dielectric material layer 174 can be deposited over the continuous MOF layer 132L by a non-conformal deposition process. The continuous dielectric material layer 174 can include a non-porous dielectric material such as undoped silicate glass, a doped silicate glass, or organosilicate glass, or may include a porous material such as porous organosilicate glass. In one embodiment, the continuous dielectric material layer 174 can include a non-porous dielectric material such as undoped silicate glass or a doped silicate glass. In one embodiment, the continuous dielectric material layer 174 can be deposited by a plasma-enhanced chemical vapor deposition process. The maximum thickness of the continuous dielectric material layer 174 can be less than one half of the width of each backside cavity 79' as provided at the processing steps of FIG. 25A. Thus, a vertically-extending cavity may be present within each backside trench 79. For example, the maximum thickness of the continuous dielectric material layer 174 can be in a range from 30 nm to 250 nm, although lesser and greater thicknesses can also be employed.

The non-conformal nature of the deposition process that forms the continuous dielectric material layer 174 induces deposition of a lesser amount of material in portions of the voids at the levels of the interlayer cavities 33 that are distal from the backside trenches 79 than in portions of the voids at the levels of the interlayer cavities 33 that are proximal to the backside trenches 79. The differential deposition rate within each void enclosed by a respective portion of the continuous MOF layer 132L causes accumulation of a deposited dielectric material at an opening of each void adjacent to a respective backside trench 79, and causes formation of an encapsulated cavity 139 that is free of any solid material therein (and is free of any liquid material therein). Each encapsulated cavity 139 can be entirely encapsulated by the continuous MOF layer 132L and the continuous dielectric material layer 174. Thus, each MOF material portion located between a vertically-neighboring pair of electrically conductive layers 46 can surround at least one encapsulated cavity 139 that is free of any solid material therein.

Referring to FIG. 25C, the processing steps of FIGS. 17, 18, 19, 20A and 20B, and 21A and 21B can be performed to form backside contact via structures 76 and additional contact via structures (86, 88, 8P). Each MOF material portion (comprising a MOF layer 132) located between a vertically-neighboring pair of electrically conductive layers 46 surrounds at least one encapsulated cavity (i.e., airgap) 139 that is free of any solid material therein. In one embodiment, the plurality of charge storage regions can comprise a vertical stack of discrete memory elements 154 (which may be discrete charge storage regions or floating gate structures) that do not contact one another and are in contact with a respective set of two MOF material portions of the MOF material portions.

Referring to FIG. 26A, a third exemplary structure according to a third embodiment of the present disclosure can be derived from the first exemplary structure illustrated in FIGS. 4A and 4B. The memory opening 49 illustrated in FIG. 26A can be the same as the memory opening in FIG. 5A.

Referring to FIG. 26B, the processing steps of FIG. 5B can be performed to form a pedestal channel portion 11 within each memory opening 49.

Referring to FIG. 26C, a dielectric metal oxide blocking dielectric layer 51 can be formed on the physically exposed surfaces of the memory opening 49 and over the cap spacer material layer 70. The dielectric metal oxide blocking dielectric layer 51 includes a dielectric metal oxide material such as aluminum oxide. The dielectric metal oxide blocking dielectric layer 51 can be formed by a conformal deposition process such as chemical vapor deposition or atomic layer deposition. The thickness of the dielectric metal oxide blocking dielectric layer 51 can be in a range from 2 nm to 20 nm, such as from 4 nm to 10 nm, although lesser and greater thicknesses can also be employed.

The processing steps of FIG. 5C can be performed to form a blocking dielectric layer 52, a charge storage layer 54, a tunneling dielectric layer 56, and a first semiconductor channel layer 601 over the dielectric metal oxide blocking dielectric layer 51. In one embodiment, the blocking dielectric layer 52 can include, an/or can consist of, silicon oxide.

Referring to FIG. 26D, an anisotropic etch process can be performed to etch horizontal portions of the first semiconductor channel layer 601, the tunneling dielectric layer 56, the charge storage layer 54, the blocking dielectric layer 52, and the dielectric metal oxide blocking dielectric layer 51. The pedestal channel portion 11 or the semiconductor material layer 10 (in case a pedestal channel portion is not present in the memory opening 49) can be vertically recessed by the anisotropic etch process. The set of the dielectric metal oxide blocking dielectric layer 51, the blocking dielectric layer 52, the charge storage layer 54, and the tunneling dielectric layer 56 within a memory opening 49 constitutes a memory film 50.

Referring to FIG. 26E, a second semiconductor channel layer 602 can be conformally deposited, for example, by performing the processing steps of FIG. 5E.

Referring to FIG. 26F, a dielectric core layer 62L can be deposited in the unfilled volume of the memory opening 49 and over a horizontal portion of the second semiconductor channel layer 602.

Figure 26H:
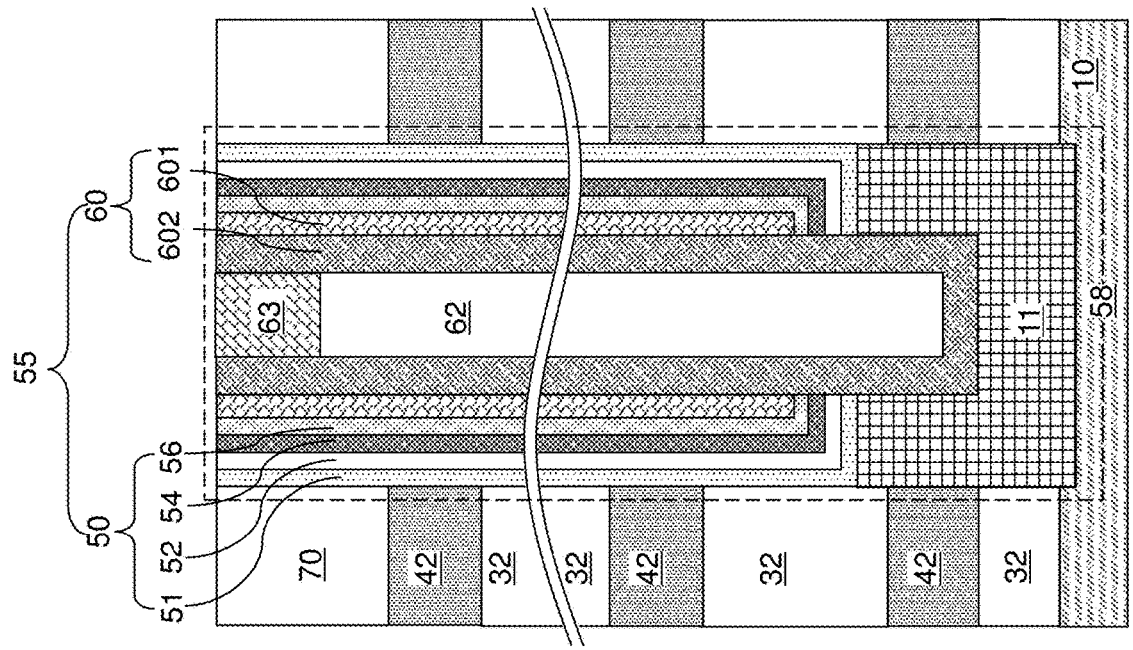
Figure 26G:
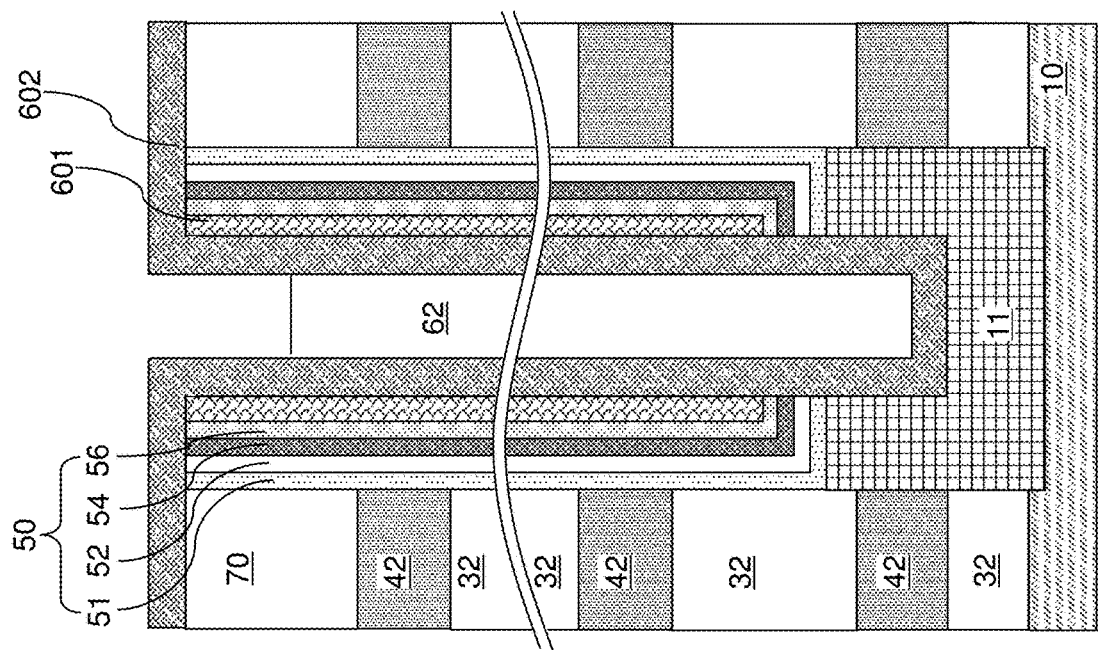

Referring to FIG. 26G, a dielectric core 62 can be formed within each memory opening 49 by vertically recessing the material of the dielectric core layer 62L selective to the material of the second semiconductor channel layer 602.

Referring to FIG. 26H, a doped semiconductor material having a doping of the second conductivity type can be deposited in the vertical recess overlying the dielectric core 62. Portions of the doped semiconductor material and the second semiconductor channel layer 602 that overlie the horizontal plane including the top surface of the cap spacer material layer 70 can be removed by a planarization process such as a recess etch process and/or a chemical mechanical planarization (CMP) process. Each remaining portion of the doped semiconductor material constitutes a drain region 63.

The combination of the first semiconductor channel layer 601 and the second semiconductor channel layer 602 within the memory opening 49 constitutes a vertical semiconductor channel 60. The combination of the vertical semiconductor channel 60 and the memory film 50 constitutes a memory stack structure. The combination of all material portions filling a memory opening 49 constitutes a memory opening fill structure 58.

Figure 27A:
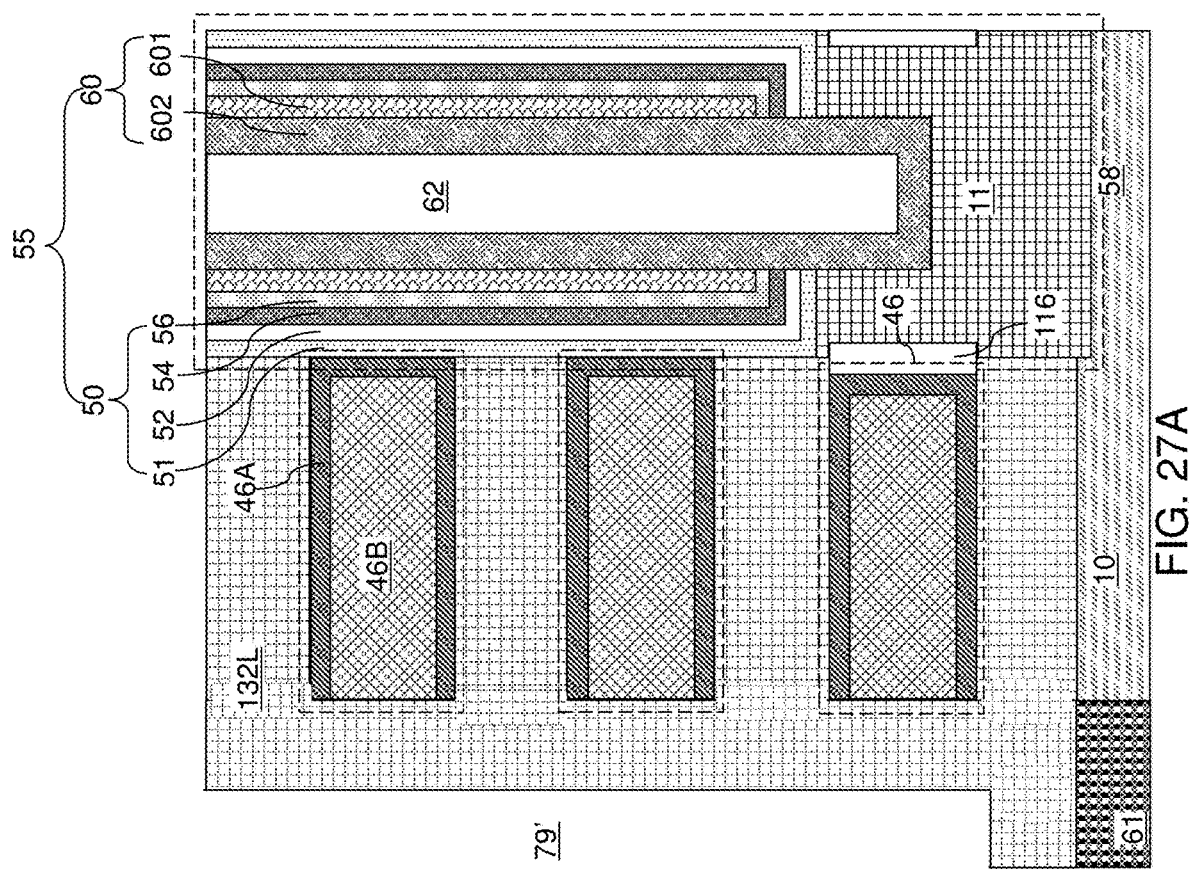

Referring to FIG. 27A, the processing steps of FIGS. 7A and 7B, 8, and 9A-9D can be performed without forming a backside blocking dielectric layer 44 which is omitted. The entirety of each of the backside recesses 43 can be filled with a respective one of the electrically conductive layers 46. Thus, the electrically conductive layers 46 are formed directly on the physically exposed surfaces of the spacer material layers 32 and outer sidewalls of the dielectric metal oxide blocking dielectric layer 51. Subsequently, the processing steps of FIGS. 10, 11A-11C, 12A and 12B, and 13 can be performed. Because the backside blocking dielectric layers 44 are absent, the metal-containing precursor layer 130 can be formed directly on the horizontal surfaces and sidewalls of the electrically conductive layers 46 and on outer sidewalls of the dielectric metal oxide blocking dielectric layers 51 of the memory films 50. In one embodiment, the metal-containing precursor layer 130 can be formed by conformal deposition of a metal oxide, or by deposition and subsequently oxidation of an elemental metal, a metal nitride, or a metal carbide. Alternatively, in case the metallic barrier layer 46A includes a metal that can be converted into a metal oxide and subsequently into a MOF material or if the metallic barrier layer 46A is omitted and the metal fill material layer 46B includes a metal that can be converted into a metal oxide and subsequently into a MOF material, then the metal-containing precursor layer 130 may be formed by oxidation of a physically exposed surface portions of the electrically conductive layers 46. The processing steps of FIGS. 14A and 14B can be performed to form a continuous MOF layer 132L. For example, if the electrically conductive layers 46 consist essentially of molybdenum without a metallic barrier layer, then the molybdenum electrically conductive layers may be oxidized to form molybdenum oxide and then reacted with a linker compound vapor to form a continuous molybdenum based MOF layer 132L, such as a TUDMOF-1 based layer 132L. Other metal layers and MOFs may also be used.

Referring to FIG. 27B, the processing steps of FIGS. 15A and 15B can be performed to remove portions of the continuous MOF layer 132L that are not covered by an overlying structure. The anisotropic etch process divides the continuous MOF layer 132L into a plurality of discrete MOF layers 132 located within a respective one of the interlayer cavities 33.

Figure 27C:
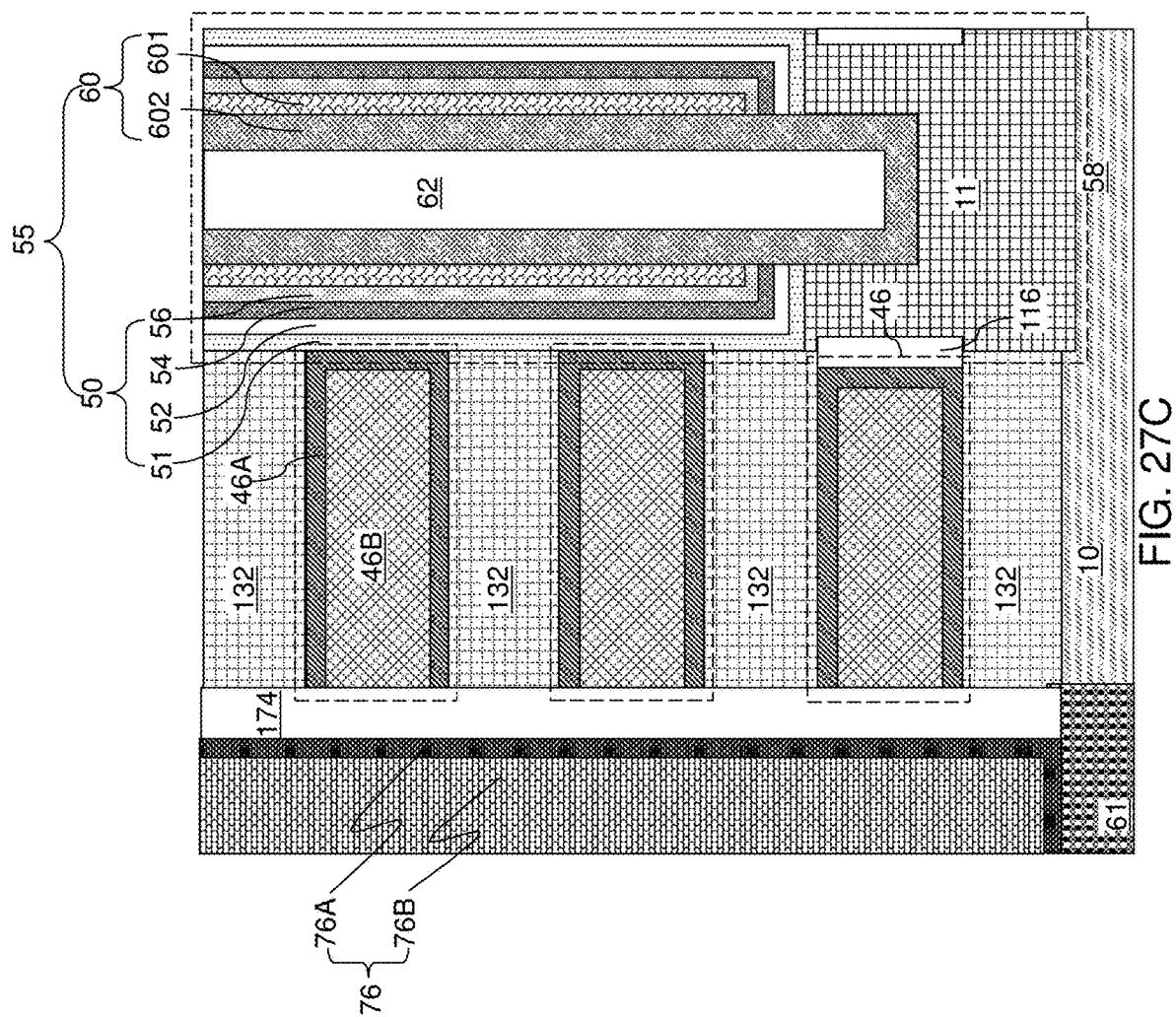

Referring to FIG. 27C, the processing steps of FIG. 16 can be performed to form a continuous dielectric material layer 174. A conformal dielectric material deposition or a non-conformal dielectric material deposition may be employed to form the continuous dielectric material layer 174. Subsequently, the processing steps of FIGS. 17, 18, 19, 20A and 20B, and 21A and 21B can be performed to form backside contact via structures 76 and additional contact via structures (86, 88, 8P).

Each of the MOF material portions (comprising the MOF layers 132) located between a vertically-neighboring pair of electrically conductive layers 46 can contact a plurality of dielectric metal oxide blocking dielectric layers 51 located in a respective memory opening 49. In one embodiment, each of the memory films 50 comprises a tunneling dielectric layer 56 contacting a respective one of the vertical semiconductor channels 60, a charge storage layer 54 laterally surrounding the tunneling dielectric layer 56, a blocking dielectric layer 52 laterally surrounding the charge storage layer 54, and a dielectric metal oxide blocking dielectric layer 51 laterally surrounding the blocking dielectric layer 52. In one embodiment, the blocking dielectric layer 52 may include silicon oxide and/or silicon oxynitride. Each MOF material portion located between a vertically-neighboring pair of electrically conductive layers 46 can be free of any cavity therein.

Each of the MOF material portions (comprising MOF layers 132) that is located between a vertically-neighboring pair of electrically conductive layers 46 contacts each of the vertically-neighboring pair of electrically conductive layers 46 at a respective horizontal interface. Each of the memory films 50 comprises a tunneling dielectric layer 56 contacting a respective one of the vertical semiconductor channels 60 and a plurality of charge storage regions (comprising portions of a charge storage layer 54) located at levels of the electrically conductive layers 46. In one embodiment, the tunneling dielectric layer 56 is laterally spaced from the MOF material portions by a combination of a respective charge storage layer 54, a respective blocking dielectric layer (which may be a silicon oxide and/or silicon oxynitride blocking dielectric layer), and a respective dielectric metal oxide blocking dielectric layer 51. In one embodiment, each MOF material portion located between a vertically-neighboring pair of electrically conductive layers 46 can directly contact each of the electrically conductive layers, and can be free of any cavity therein.

Figure 28A:
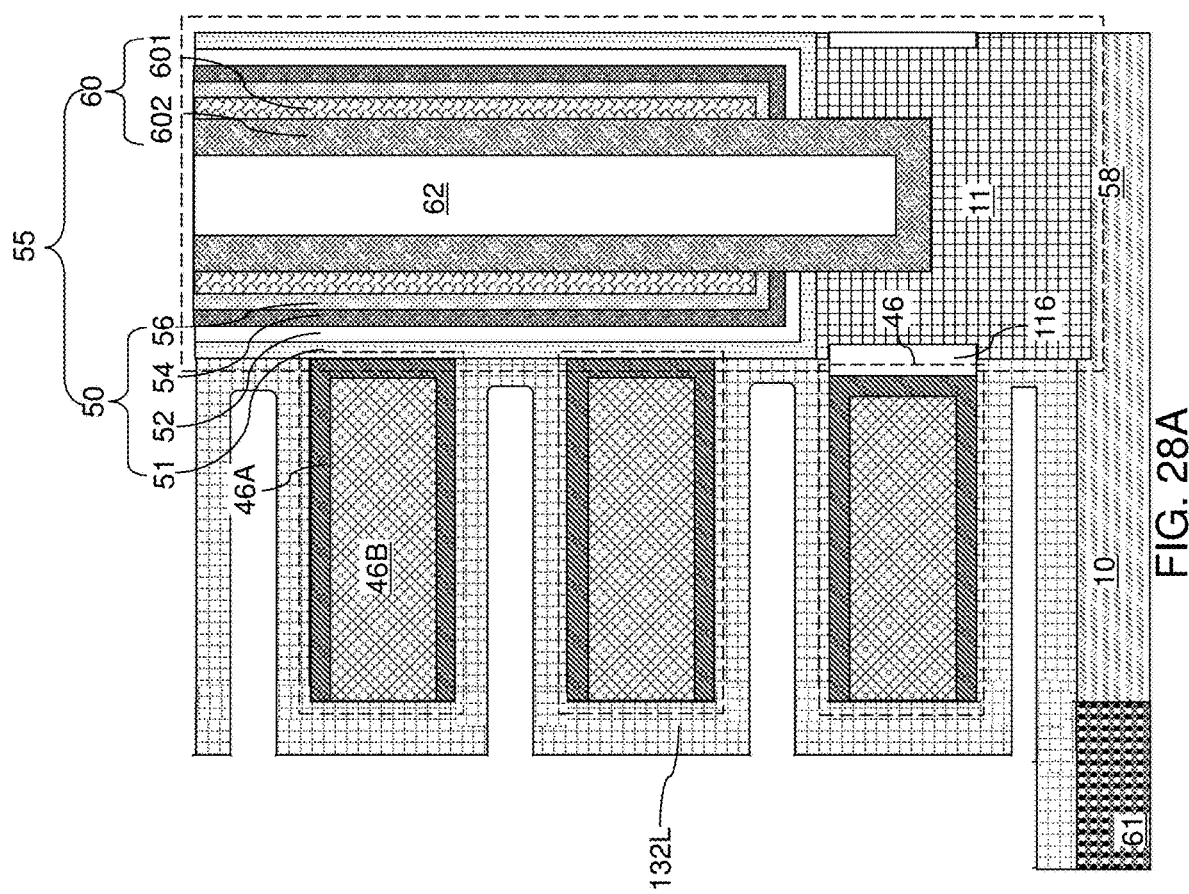
FIGS. 28A-28C are sequential vertical cross-sectional view of an alternative embodiment of the third exemplary structure during formation of insulating layers and backside trench fill structures according to the third embodiment of the present disclosure.
Figure 28B:
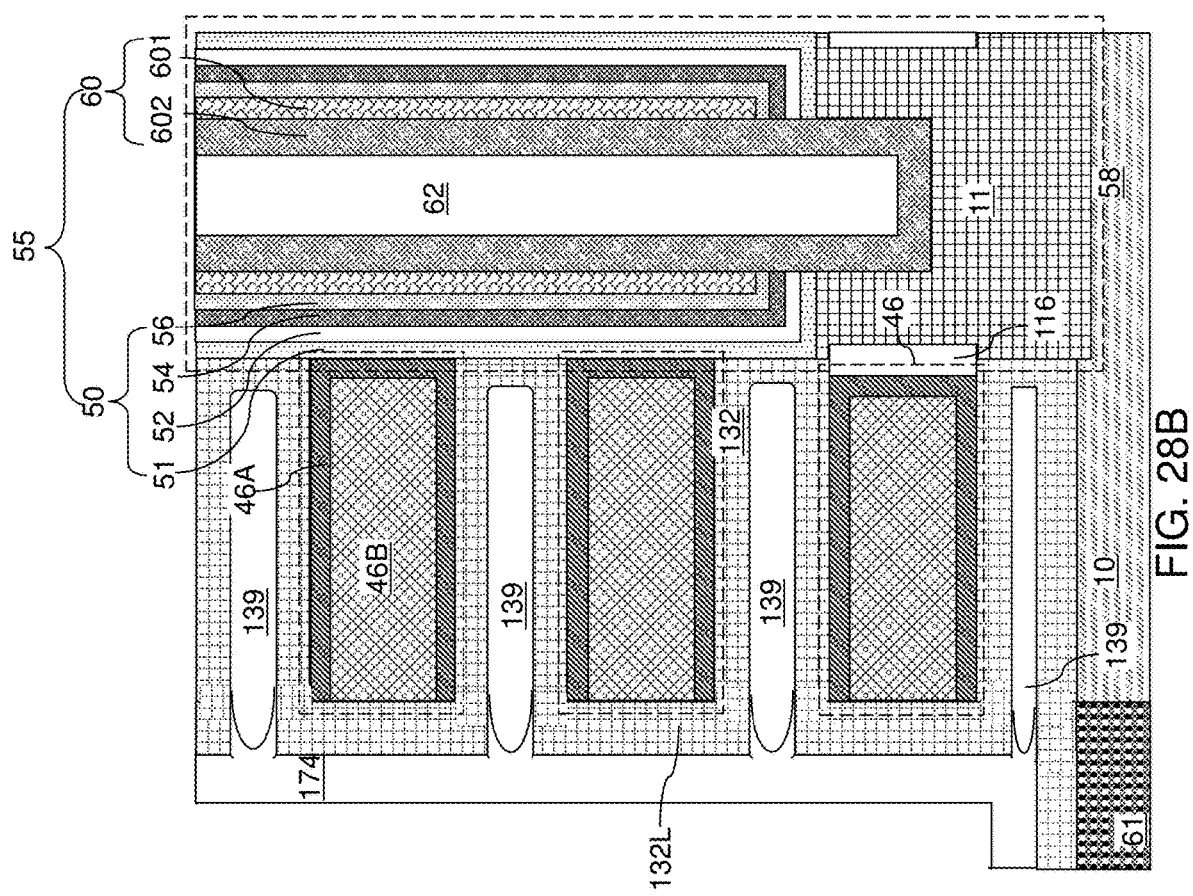
Figure 28C:
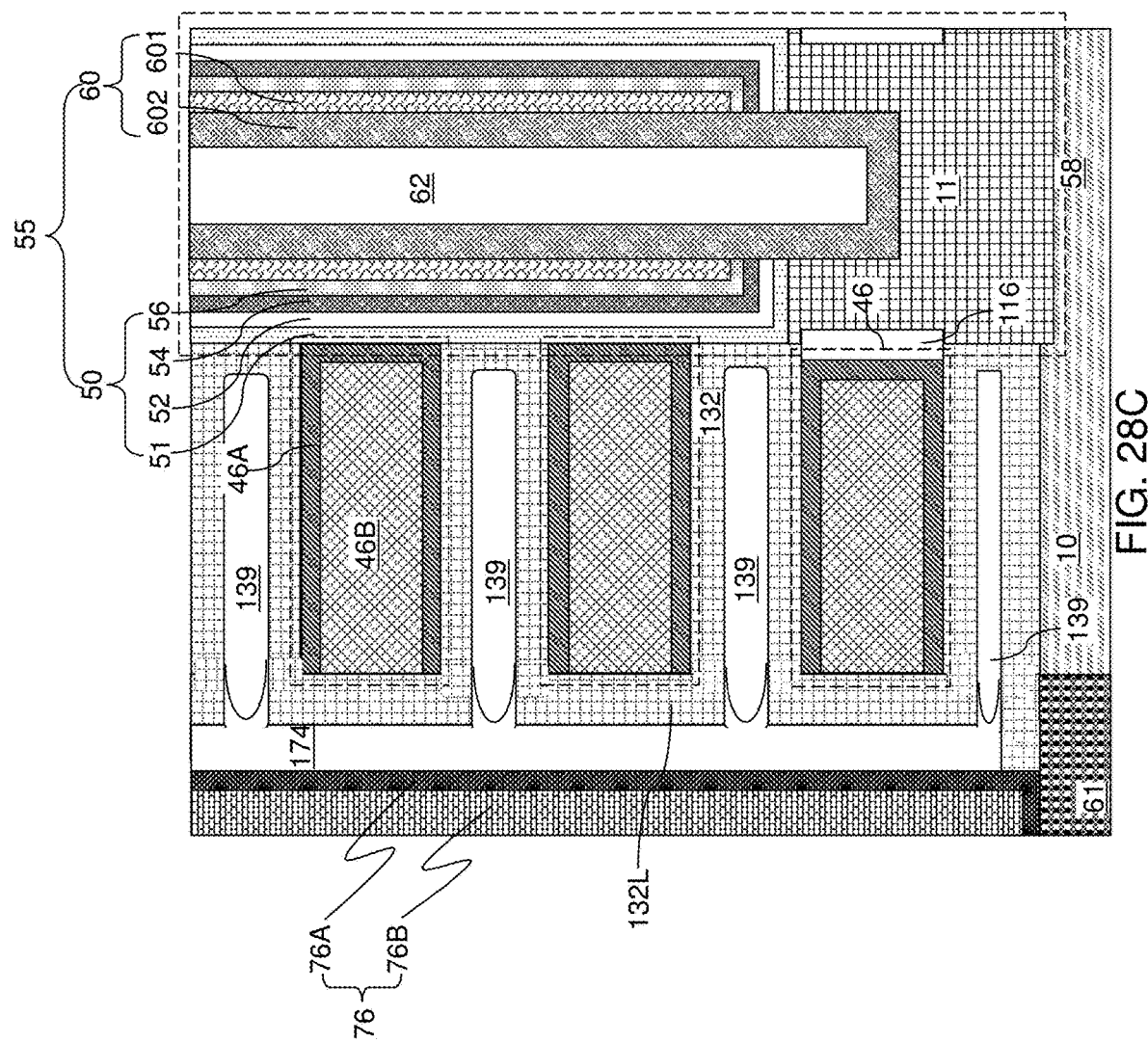

Referring to FIGS. 28A-28C, the steps described above with respect to FIGS. 25A-25C, respectively, are performed to form an alternative embodiment of the third exemplary structure to form MOF material portions (comprising a MOF layer 132) located between a vertically-neighboring pair of electrically conductive layers 46 which surround at least one encapsulated cavity (i.e., airgap) 139 that is free of any solid material therein.

Referring to FIG. 29A, a fourth exemplary structure according to a fourth embodiment of the present disclosure can be derived from the first exemplary structure illustrated in FIGS. 4A and 4B by forming a different set of elements for each memory opening fill structure 58 and for each support pillar structure. The memory opening 49 illustrated in FIG. 23A can be the same as the memory opening in FIG. 5A with optional adjustments in the lateral dimension of the memory opening 49. For example, the memory opening 49 illustrated in FIG. 23A can have a lateral dimension (such as a diameter) that is less than the lateral dimension of the memory opening of FIG. 5A by about twice the thickness of the memory film 50 of the first embodiment.

Referring to FIG. 29B, the processing steps of FIG. 5B can be performed to form a pedestal channel portion 11 within each memory opening 49.

Referring to FIG. 29C, an isotropic etch process can be performed to laterally recess the sidewalls of the sacrificial material layers 42 selective to the spacer material layers 32. In an illustrative example, if the spacer material layers 32 include silicon oxide and if the sacrificial material layers 42 include silicon nitride, a wet etch process employing hot phosphoric acid. The memory opening 49 includes a vertical stack of lateral recesses, each of which has a tubular volume. The lateral recess distance by which sidewalls of the sacrificial material layers 42 are recessed around each memory opening 49 can be in a range from 12 nm to 50 nm, although lesser and greater lateral recess distances can also be employed.

Referring to FIG. 29D, a continuous dielectric metal oxide blocking dielectric layer 151L and a continuous blocking dielectric layer 152L can be sequentially deposited in the memory opening 49 by conformal deposition processes. The continuous dielectric metal oxide blocking dielectric layer 151L includes a dielectric metal oxide material such as aluminum oxide, and the continuous blocking dielectric layer 152L includes silicon oxide and/or silicon oxynitride. The continuous dielectric metal oxide blocking dielectric layer 151L can have a thickness in a range from 2 nm to 20 nm, such as from 4 nm to 10 nm, and the continuous blocking dielectric layer 152L can have a thickness in a range from 2 nm to 20 nm, such as from 4 nm to 10 nm. A memory cavity 49' is present within each memory opening 49.

Referring to FIG. 29E, a memory material can be deposited in remaining volumes of the lateral recesses. The memory material may include a charge storage material such as silicon nitride, or may include a floating gate material such as a metallic material or a heavily doped semiconductor material. The memory material can be deposited employing a conformal deposition process such as a low pressure chemical vapor deposition (LPCVD) process. An anisotropic etch process can be performed to remove portions of the memory material located within a cylindrical vertical plane including sidewalls of the continuous blocking dielectric layer 152L inside the memory opening 49. Remaining portions of the memory material located within volumes of the lateral recesses comprise memory elements 154. Each of the memory elements 154 can have a tubular shape. The memory elements 154 can be charge storage material portions (such as silicon nitride material portions) or floating gate structures (such as metallic material portions or doped semiconductor material portions).

Referring to FIG. 29F, the anisotropic etch process of FIG. 29E may be continued or another anisotropic etch process can be performed to etch the materials of the continuous blocking dielectric layer 152L and the continuous dielectric metal oxide blocking dielectric layer 151L. The anisotropic etch process removes horizontal portions of the continuous blocking dielectric layer 152L and the continuous dielectric metal oxide blocking dielectric layer 151L located above the horizontal plane including the top surface of the cap spacer material layer 70, and portions of the continuous blocking dielectric layer 152L and the continuous dielectric metal oxide blocking dielectric layer 151L located within a volume containing a vertical plane (which may be a cylindrical vertical plane) including the sidewalls of the spacer material layers 32 in the memory opening 49. Portions of the memory elements 154, the continuous blocking dielectric layer 152L, and the continuous dielectric metal oxide blocking dielectric layer 151L that are located outside the volumes of the lateral recesses are removed.

Each remaining portion of the continuous blocking dielectric layer 152L in a lateral recess comprises a blocking dielectric layer 152, which can include silicon oxide and/or silicon oxynitride. Each remaining portion of the continuous dielectric metal oxide blocking dielectric layer 151L in a lateral recess comprises a dielectric metal oxide blocking dielectric layer 151. Each of the blocking dielectric layers 152 and each of the dielectric metal oxide blocking dielectric layers 151 can include a respective tubular portion, a respective upper annular portion that is attached to an upper periphery of the respective tubular portion, and a respective lower annular portion that is attached to a lower periphery of the respective tubular portion. Each dielectric metal oxide blocking dielectric layer 151 can contact, and can have the same height as, a sacrificial material layer 42. Each blocking dielectric layer 152 can have a lesser height than the sacrificial material layer 42 that is located at a same level. Each memory element 154 can have an annular shape. Each lateral recess can be filled with a dielectric metal oxide blocking dielectric layer 151, a blocking dielectric layer 152, and a memory element 154.

Figure 29H:
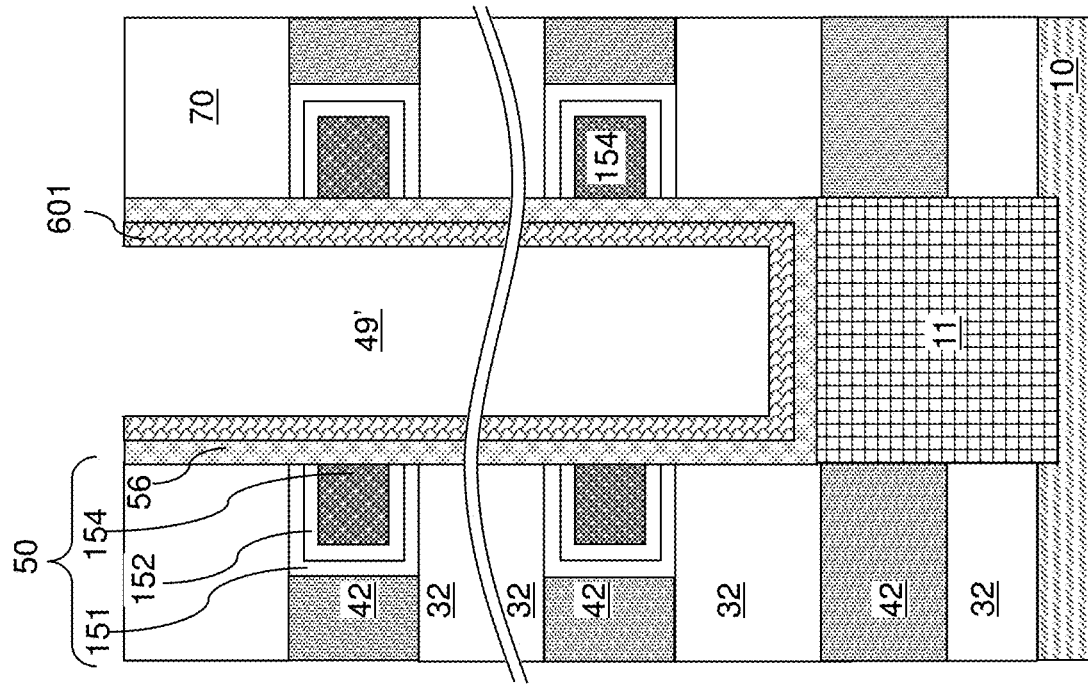
Figure 29G:
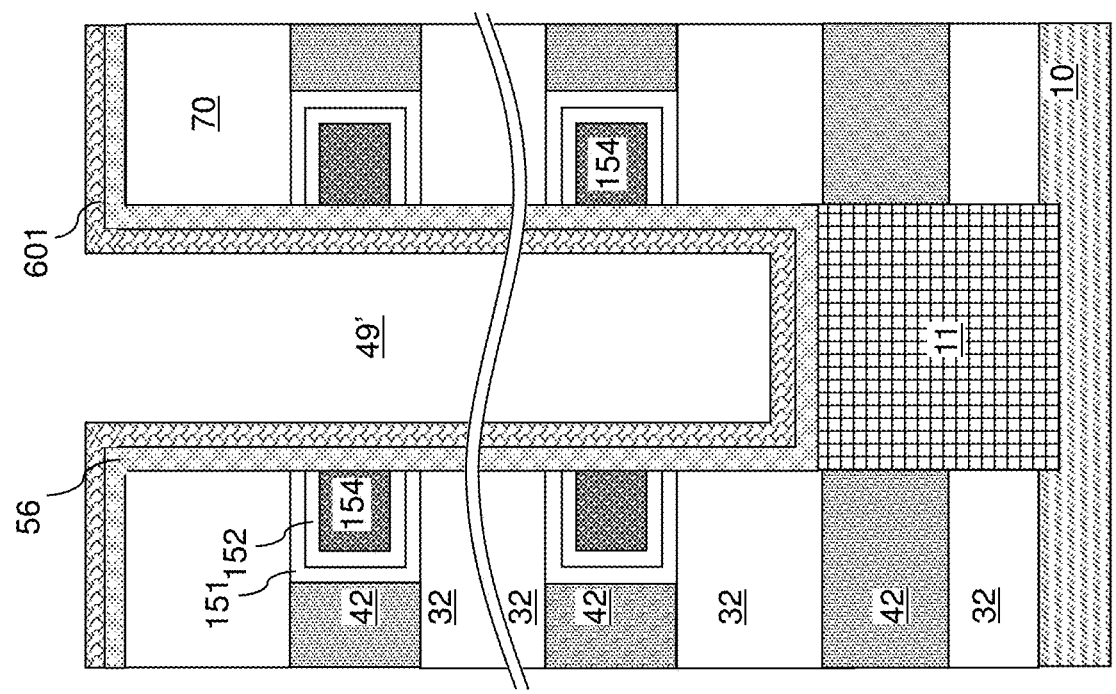

Referring to FIG. 29G, a tunneling dielectric layer 56 and a first semiconductor channel layer 601 can be formed by a respective conformal deposition process. The processing steps of FIG. 5C can be employed to deposit the tunneling dielectric layer 56 and the first semiconductor channel layer 601.

Referring to FIG. 29H, an anisotropic etch process can be performed to etch horizontal portions of the first semiconductor channel layer 601 and the tunneling dielectric layer 56. The pedestal channel portion 11 or the semiconductor material layer 10 (in case a pedestal channel portion is not present in the memory opening 49) can be vertically recessed by the anisotropic etch process. The set of all dielectric metal oxide blocking dielectric layers 151, all blocking dielectric layers 152, all memory elements 154, and the tunneling dielectric layer 56 within a memory opening 49 constitutes a memory film 50.

Figure 29J:
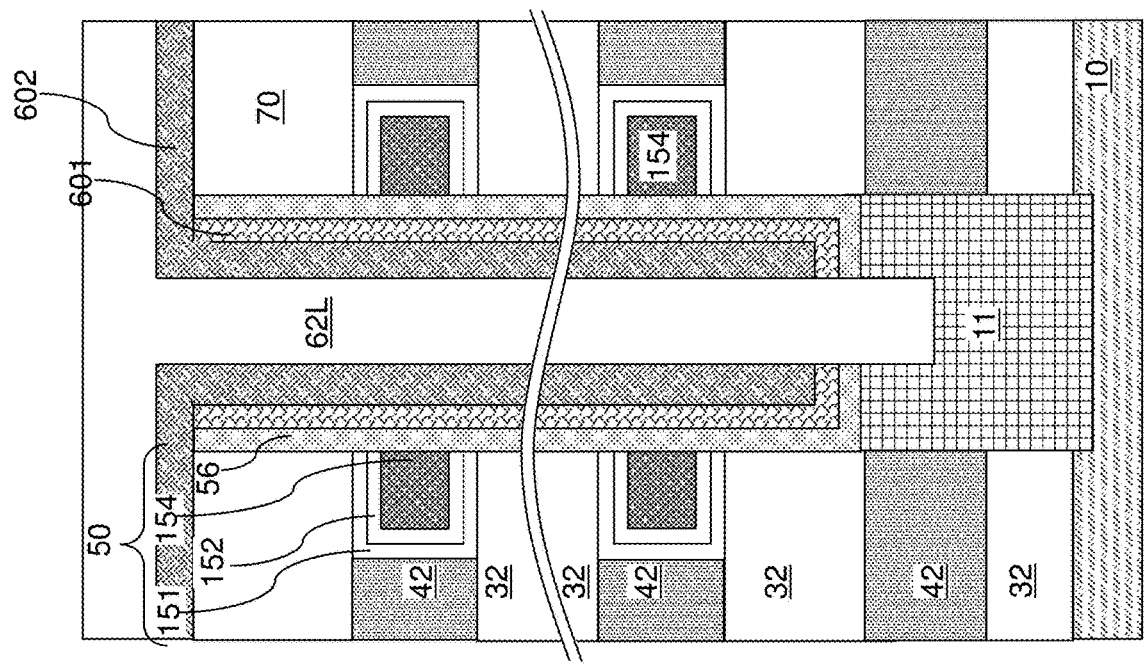
Figure 29I:
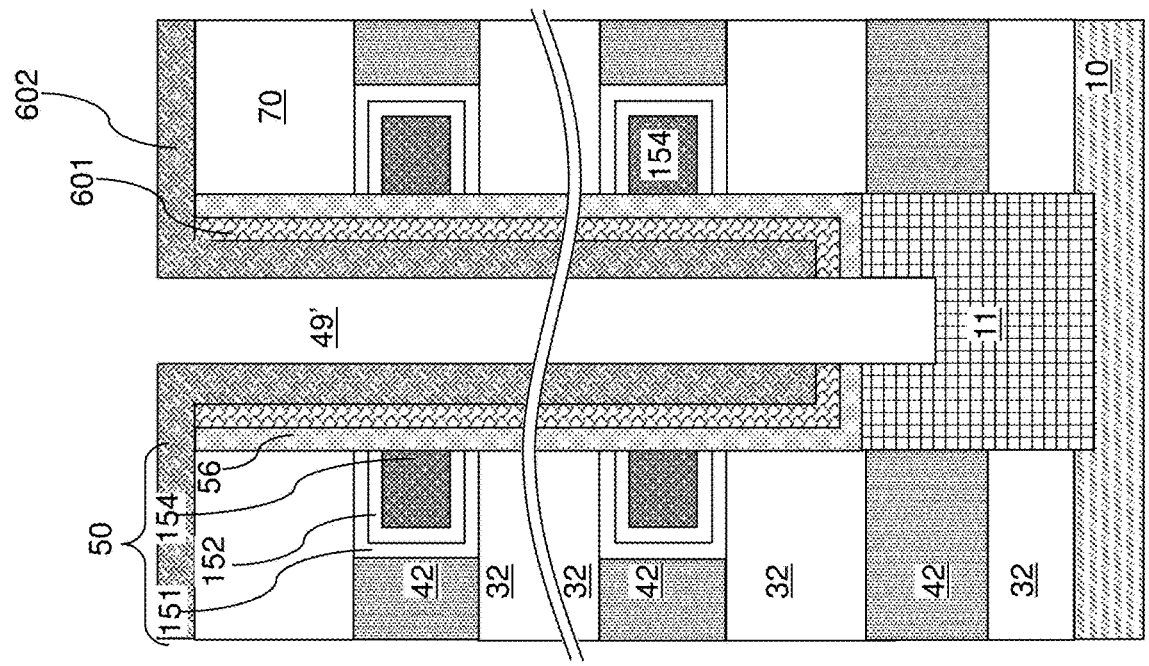

Referring to FIG. 29I, a second semiconductor channel layer 602 can be conformally deposited, for example, by performing the processing steps of FIG. 5E.

Referring to FIG. 29J, a dielectric core layer 62L can be deposited in the unfilled volume of the memory opening 49 and over a horizontal portion of the second semiconductor channel layer 602.

Figure 29L:
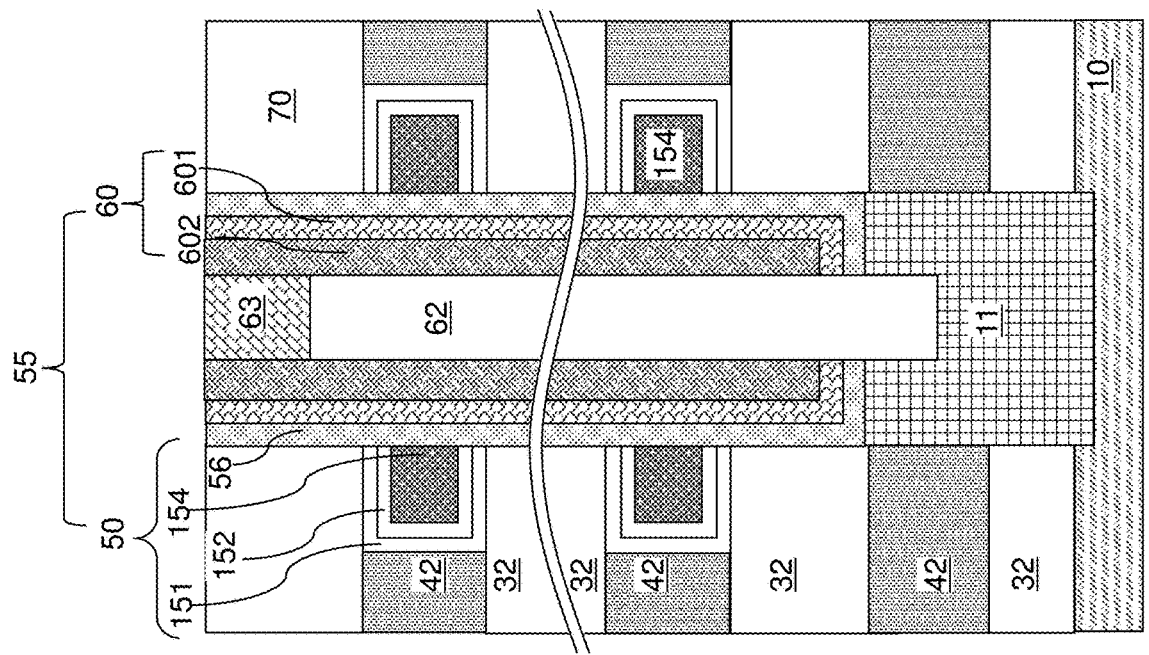
Figure 29K:
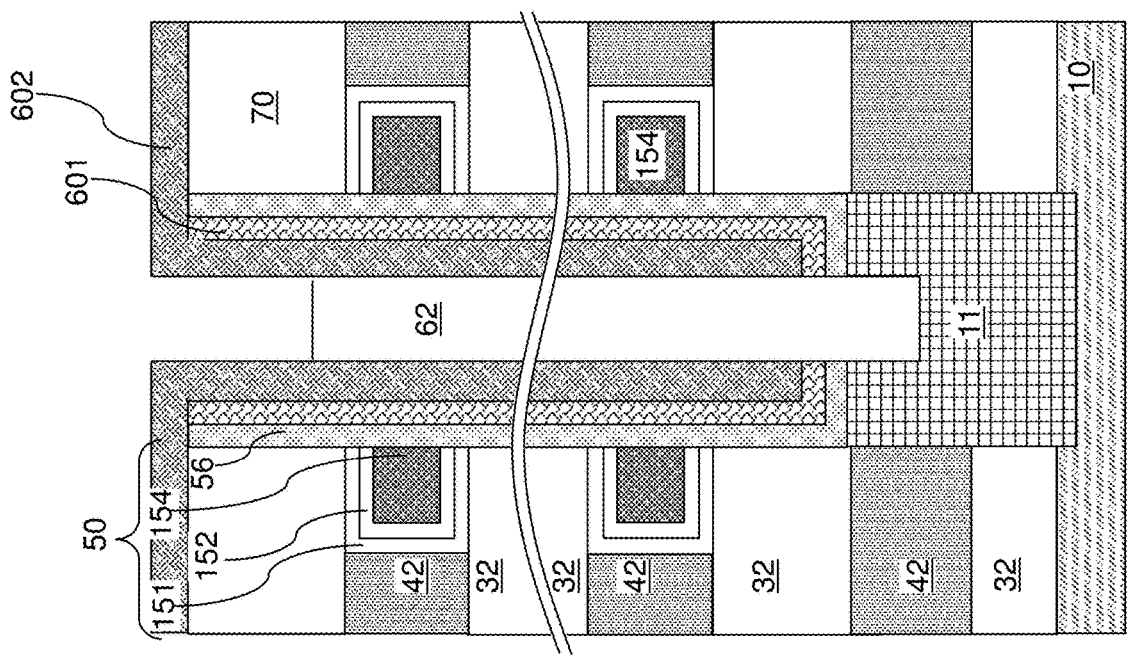

Referring to FIG. 29K, a dielectric core 62 can be formed within each memory opening 49 by vertically recessing the material of the dielectric core layer 62L selective to the material of the second semiconductor channel layer 602.

Referring to FIG. 29L, a doped semiconductor material having a doping of the second conductivity type can be deposited in the vertical recess overlying the dielectric core 62. Portions of the doped semiconductor material and the second semiconductor channel layer 602 that overlie the horizontal plane including the top surface of the cap spacer material layer 70 can be removed by a planarization process such as a recess etch process and/or a chemical mechanical planarization (CMP) process. Each remaining portion of the doped semiconductor material constitutes a drain region 63.

The combination of the first semiconductor channel layer 601 and the second semiconductor channel layer 602 within the memory opening 49 constitutes a vertical semiconductor channel 60. The combination of the vertical semiconductor channel 60 and the memory film 50 constitutes a memory stack structure. The combination of all material portions fill a memory opening 49 constitutes a memory opening fill structure 58.

Each of the memory films 50 comprises a tunneling dielectric layer 56 contacting a vertical semiconductor channel 60 and a plurality of discrete memory elements 154, which may be charge storage regions or floating gate structures. The memory elements 154 are located at levels of the electrically conductive layers 46. A plurality of memory elements 154 is provided in each memory opening fill structure 58. The plurality of memory elements 154 can comprise a vertical stack of discrete memory elements 154 that do not contact one another and are spaced from the MOF material portions at least by a respective blocking dielectric layer.

Referring to FIGS. 30A-30D, the processing steps described above with respect to FIGS. 24A-24D, respectively, are performed without forming a backside blocking dielectric layer 44. Each of the MOF material portions (comprising the MOF layers 132) located between a vertically-neighboring pair of electrically conductive layers 46 can contact a plurality of dielectric metal oxide blocking dielectric layers 51 located in a respective memory opening 49. In one embodiment, each of the memory films 50 comprises a tunneling dielectric layer 56 contacting a respective one of the vertical semiconductor channels 60, a vertical stack of memory elements 154 laterally surrounding the tunneling dielectric layer 56, a vertical stack of blocking dielectric layers 152 laterally surrounding a respective one of the memory elements 154, and a vertical stack of dielectric metal oxide blocking dielectric layers 151 laterally surrounding a respective blocking dielectric layer 152. In one embodiment, the blocking dielectric layers 152 may include silicon oxide and/or silicon oxynitride. Each MOF material portion located between a vertically-neighboring pair of electrically conductive layers 46 can be free of any cavity therein.

Each of the MOF material portions (comprising MOF layers 132) that is located between a vertically-neighboring pair of electrically conductive layers 46 contacts each of the vertically-neighboring pair of electrically conductive layers 46 at a respective horizontal interface. Each of the memory films 50 comprises a tunneling dielectric layer 56 contacting a respective one of the vertical semiconductor channels 60 and a plurality of charge storage regions (comprising portions of a charge storage layer 54) located at levels of the electrically conductive layers 46. In one embodiment, the tunneling dielectric layer 56 contacts the MOF material portions (comprising MOF layers 132). In one embodiment, each MOF material portion located between a vertically-neighboring pair of electrically conductive layers 46 can directly contact each of the electrically conductive layers, and can be free of any cavity therein.

Figure 31A:
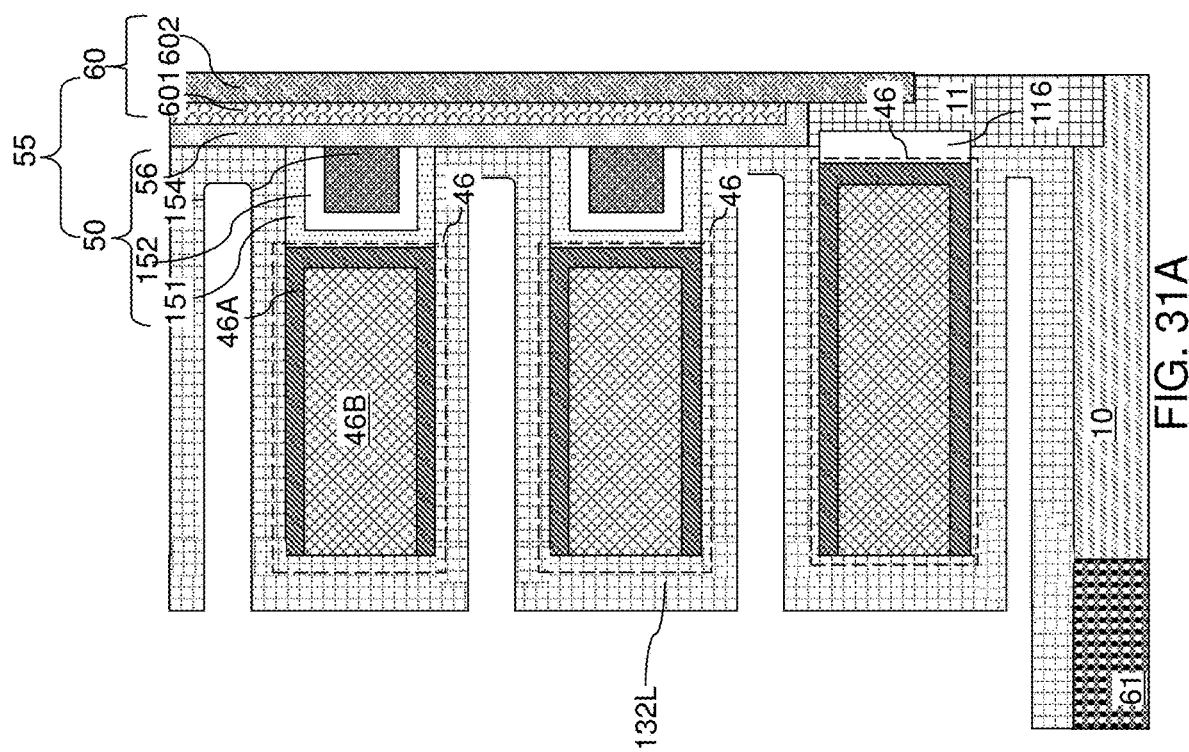
FIGS. 31A-31C are sequential vertical cross-sectional view of an alternative embodiment of the fourth exemplary structure during formation of insulating layers and backside trench fill structures according to the fourth embodiment of the present disclosure.
Figure 31B:
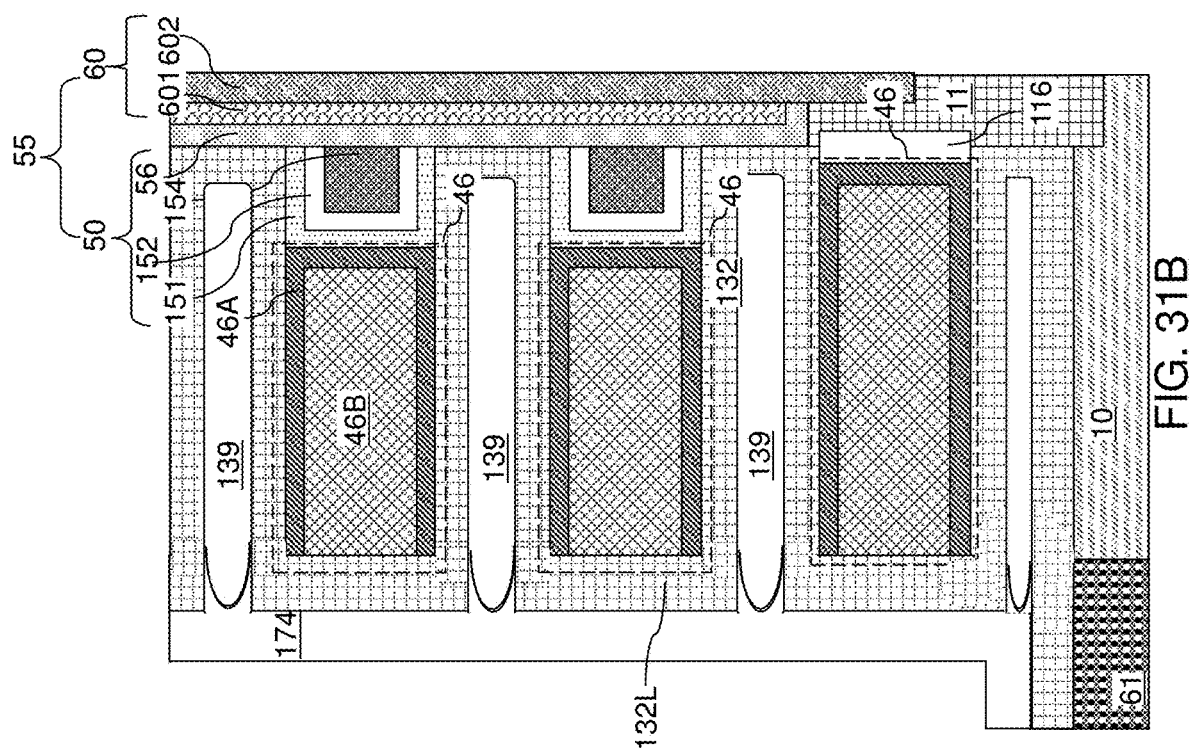
Figure 31C:
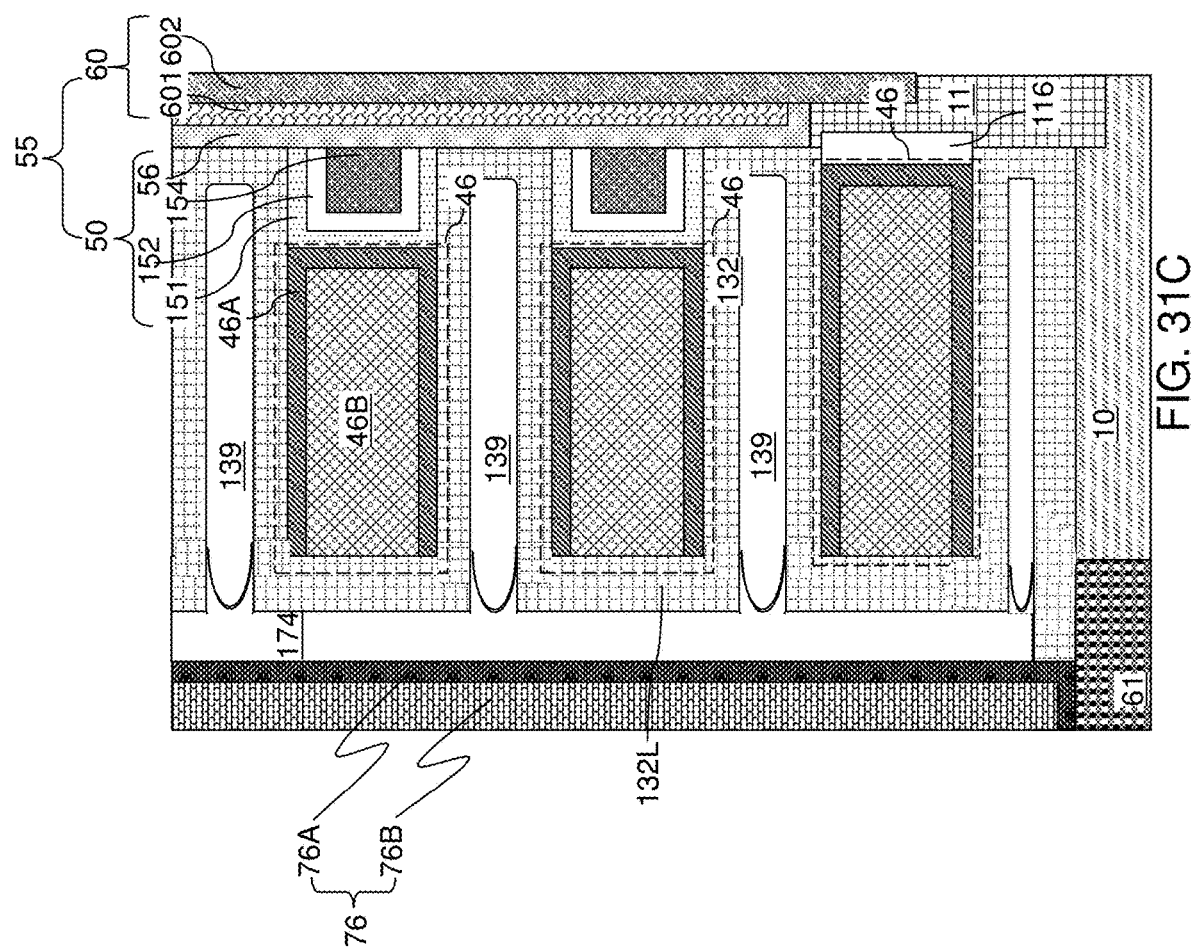

Referring to FIGS. 31A-31C, the steps described above with respect to FIGS. 25A-25C, respectively, may be performed to form an alternative embodiment of the fourth exemplary structure which contains the encapsulated cavity (i.e., airgap) 139. Each MOF material portion (comprising a MOF layer 132) located between a vertically-neighboring pair of electrically conductive layers 46 surrounds at least one encapsulated cavity 139 that is free of any solid material therein. In one embodiment, the plurality of charge storage regions can comprise a vertical stack of memory elements 154 (which may be discrete charge storage regions or floating gate structures) that do not contact one another and are in contact with a respective set of two MOF material portions of the MOF material portions.

Referring to all drawings and according to various embodiments of the present disclosure, a three-dimensional memory device is provided, which comprises: an alternating stack of insulating layers 132 and electrically conductive layers 46 located over a top surface of a substrate (9, 10); and memory stack structures 55 extending through the alternating stack (132, 46), wherein: each of the memory stack structures 55 comprises a respective memory film 50 and a respective vertical semiconductor channel 60; and each of the insulating layers 132 comprises a metal-organic framework (MOF) material portion.

In one embodiment, each of the electrically conductive layers 46 comprises: cylindrical openings having sidewalls that contact cylindrical outer sidewalls of a respective backside blocking dielectric layer 44; a top surface adjoined to upper peripheries of the cylindrical openings and contacting a bottom surface of an upper horizontally-extending portion of the respective backside blocking dielectric layer 44; and a bottom surface adjoined to lower peripheries of the cylindrical openings and contacting a top surface of a lower horizontally-extending portion of the respective backside blocking dielectric layer 44.

In one embodiment, each of the MOF material portions (such as each MOF layer 132) located between a vertically-neighboring pair of electrically conductive layers 46 among the electrically conductive layers 46 contacts a respective set of two backside blocking dielectric layers 44 that are vertically spaced apart from each other as illustrated in the first and second exemplary structures.

In one embodiment, each of the MOF material portions (such as each MOF layer 132) that is located between a vertically-neighboring pair of electrically conductive layers contacts each of the vertically-neighboring pair of electrically conductive layers 46 at a respective horizontal interface as illustrated in the third and fourth exemplary structures.

In one embodiment, each of the memory films 50 comprises a tunneling dielectric layer 56 contacting a respective one of the vertical semiconductor channels 60 and a plurality of memory elements (which may comprise portions of a charge storage layer 54 or discrete memory elements 154) located at levels of the electrically conductive layers 46.

In one embodiment, the plurality of memory elements comprise portions of a charge storage layer 54 that are located at levels of the electrically conductive layers 46 as illustrated in the first and third exemplary structures. In one embodiment, the charge storage layer is laterally spaced from the MOF material portions by a blocking dielectric layer 52 that continuously extends through multiple layers within the alternating stack (132, 46).

In one embodiment, the plurality of memory elements comprise a vertical stack of discrete memory elements 154 that do not contact one another and are in contact with a respective set of two MOF material portions of the MOF material portions as illustrated in the second exemplary structure.

In one embodiment, the plurality of memory elements comprise a vertical stack of discrete memory elements 154 that do not contact one another and are spaced from the MOF material portions at least by a respective blocking dielectric layer 152 as illustrated in the fourth exemplary structure.

In one embodiment, the tunneling dielectric layer 56 is laterally spaced from the MOF material portions by a combination of a respective charge storage layer 54 and a respective blocking dielectric layer 52 as illustrated in the first exemplary structure and the third exemplary structure.

In one embodiment, the tunneling dielectric layer 56 is in contact with a plurality of MOF material portions of the MOF material portions as illustrated in the second exemplary structure and the fourth exemplary structure.

In one embodiment, each MOF material portion located between a vertically-neighboring pair of electrically conductive layers 46 is free of any cavity therein.

In one embodiment, each MOF material portion located between a vertically-neighboring pair of electrically conductive layers 46 surrounds at least one encapsulated cavity (i.e., airgap) 139 that is free of any solid material therein.

In one embodiment, the MOF material portions comprise a metal-organic framework material including metal ions or clusters connected by at least bidentate organic ligands.

The various embodiments of the present disclosure can be employed to provide insulating layers including a respective MOF material portion between vertically neighboring pairs of electrically conductive layers 46 that can be employed as word lines in a three-dimensional memory device. The MOF material portions can include a low dielectric constant (low-k) dielectric material having a dielectric constant in a range from 1.7 to 2.6 without any cavity therein, or a dielectric constant in a range from 1.3 to 2.3 if encapsulated cavities (i.e., airgaps) 139 are formed within the MOF material portions. The low dielectric constant provided by the MOF material portions can reduce capacitive coupling between vertically neighboring pairs of electrically conductive layers 46, can reduce the RC delay in signal propagation in the electrically conductive layers 46, and can increase performance of a three-dimensional memory device.

In some embodiments, the memory elements 154 can be formed as discrete structures that are vertically spaced among one another. The memory elements 154 may include charge storage material portions (such as silicon nitride material portions) or floating gate structures (such as metallic material portions or doped semiconductor material portions). The memory elements 154 can be present only at the levels of the electrically conductive layers (i.e., word lines/control gate electrodes) 46, and can be absent at the levels of the MOF material portions that are provided between vertically neighboring pairs of the electrically conductive layers 46. Programming disturb and noise in the three-dimensional memory device can be minimized by providing the memory elements 154 only at the levels of the electrically conductive layers 46.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
a vertically alternating stack of insulating layers and electrically conductive layers located over a top surface of a substrate; and
memory stack structures extending through the vertically alternating stack,
wherein:
each of the memory stack structures comprises a respective memory film and a respective vertical semiconductor channel; and
each of the insulating layers comprises a metal-organic framework (MOF) material portion that includes a respective encapsulated cavity that continuously extends and laterally surrounds each of the memory stack structures, wherein the respective encapsulated cavity has a lateral dimension that is greater than pore sizes of the MOF material portions.

2. The three-dimensional memory device of claim 1, wherein the MOF material portion comprises:
a plurality of cylindrical portions laterally surrounding a respective one of the memory stack structures:
an upper horizontally-extending portion adjoined to a top end of each of the plurality of cylindrical portions; and
a lower horizontally-extending portion adjoined to a bottom end of each of the plurality of cylindrical portions.

3. The three-dimensional memory device of claim 2, wherein the respective encapsulated cavity vertically extends between a bottom surface of the upper horizontally-extending portion and a top surface of the lower horizontally-extending portion.

4. The three-dimensional memory device of claim 1, wherein each horizontal interface between a vertically-neighboring pair of an insulating layer of the insulating layers and an electrically conductive layer of the electrically conductive layers is planar.

* * * * *